United States Patent [19]

Hamamoto

[11] Patent Number: 5,764,562
[45] Date of Patent: Jun. 9, 1998

[54] SEMICONDUCTOR MEMORY DEVICE

[75] Inventor: Takeshi Hamamoto, Hyogo, Japan

[73] Assignee: Mitsubishi Denki Kabushiki Kaisha, Tokyo, Japan

[21] Appl. No.: 601,561

[22] Filed: Feb. 14, 1996

[30] Foreign Application Priority Data

Apr. 7, 1995 [JP] Japan .................. 7-082945

[51] Int. Cl.[6] ............................................. G11C 7/00
[52] U.S. Cl. .......................... 365/149; 365/63; 365/222
[58] Field of Search ................... 365/149, 63, 189.01, 365/222

[56] References Cited

U.S. PATENT DOCUMENTS

| | | | |
|---|---|---|---|
| 5,495,440 | 2/1996 | Asakura | 365/149 |
| 5,671,174 | 9/1997 | Koike et al. | 365/149 |
| 5,684,749 | 11/1997 | Seyyedy et al. | 365/149 |

FOREIGN PATENT DOCUMENTS

| | | |
|---|---|---|
| 60-239993 | 11/1985 | Japan . |
| 4-129088 | 4/1992 | Japan . |

OTHER PUBLICATIONS

Roy E. Scheuerlein et al., "Shared Word Line DRAM Cell", IEEE Journal of Solid–State Circuits, vol. SC–19, No. 5, Oct. 1994, pp. 640–645.

K. Terada et al., "A New VLSI Memory Cell Using Capacitance Coupling", IEDM 82, pp. 624–627.

W.G. Oldham et al., "A One–Transistor Memory Cell With Nondestructive Readout", IEEE ISSCC, Feb. 1973, pp. 34–35.

Primary Examiner—Son T. Dinh
Attorney, Agent, or Firm—McDermott, Will & Emery

[57] ABSTRACT

A memory cell is connected between a bit line and an electrode node. The memory cell includes a transistor connected to the bit line and a capacitor connected to the electrode node. In the operation, the potential of a word line is raised after the potential of the electrode node is lowered to the L-level. Thereby, electric charges are read onto the bit line from only the memory cell connected to the electrode node of which potential is selectively lowered. Therefore, only the selected bit line among the plurality of bit lines can be operated. Consequently, the power consumption can be reduced.

27 Claims, 47 Drawing Sheets

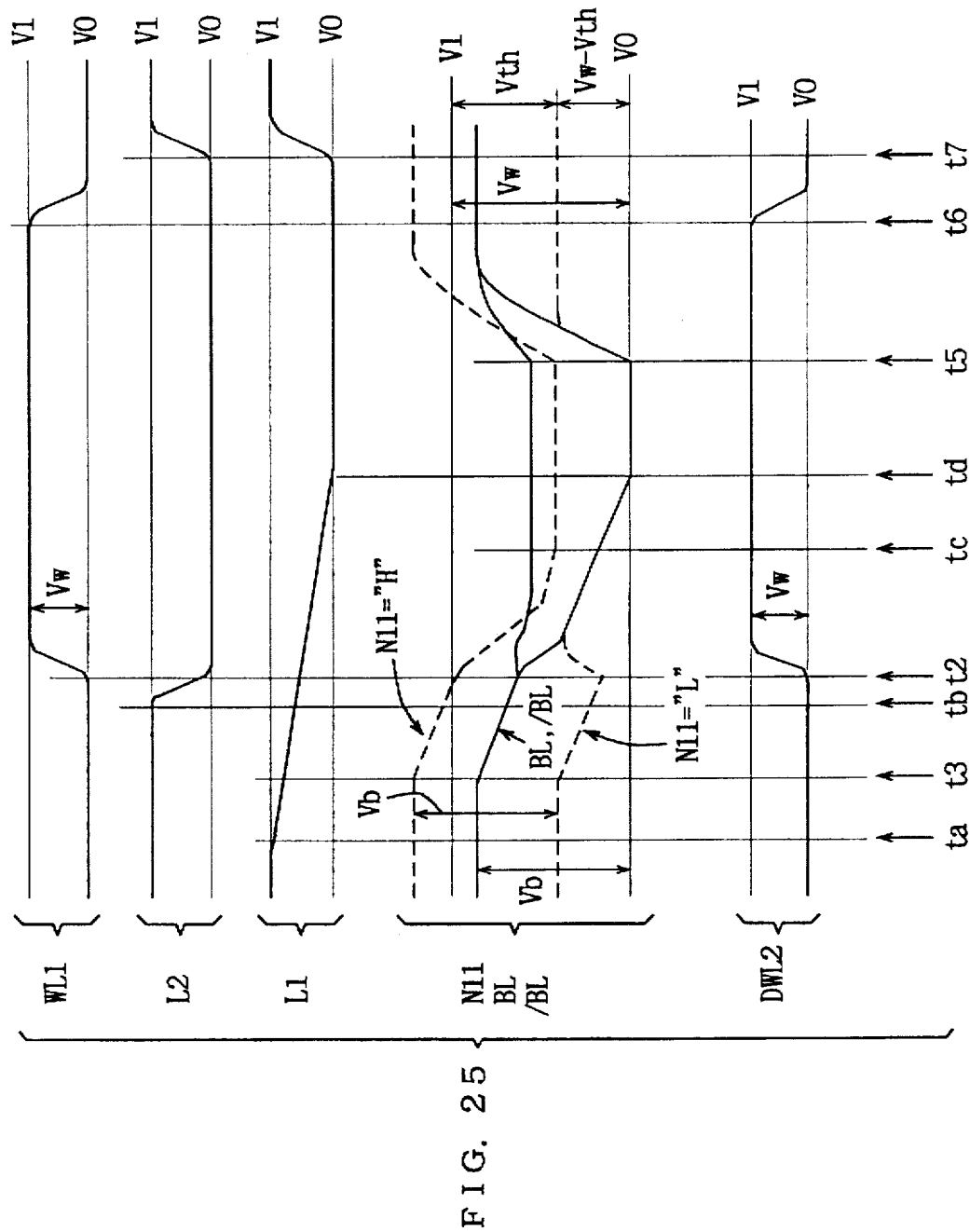
F I G. 25

SEMICONDUCTOR MEMORY DEVICE

BACKGROUND OF THE INVENTION

1. Field of the Invention

The present invention relates to a semiconductor memory device, and in particular to a memory cell array and its peripheral circuits in a DRAM.

2. Description of the Background Art

A DRAM (Dynamic Random Access Memory) has been known as a kind of semiconductor memory device.

FIG. 55 is a circuit diagram showing a structure of a major portion of a conventional DRAM. More specifically, FIG. 55 shows a structure of a typical DRAM having folded bit lines.

Referring to FIG. 55, the DRAM includes a plurality of memory cells 10, a plurality of word lines WL, a plurality of bit line pairs BL and /BL, a cell plate CP, a plurality of sense amplifiers SA0 and a word driver group WD0.

The plurality of word lines WL are parallel to each other. The plurality of bit line pairs BL and /BL are parallel to each other and are arranged in a direction crossing word lines WL. Each bit line pair includes bit line BL and inverted bit line /BL. Each memory cell 10 is arranged at a crossing of word line WL and bit line BL or a crossing of word line WL and inverted bit line /BL. Each memory cell 10 is connected to corresponding word line WL, and bit line BL or inverted bit line /BL which form the corresponding crossing.

Each memory cell 10 includes an N-channel MOS transistor 10T and a capacitor 10C. In each memory cell 10, transistor 10T and capacitor 10C are connected in series between corresponding bit line BL or inverted bit line /BL, and cell plate CP. Transistor 10T is connected at its gate electrode to corresponding word line WL.

In each memory cell 10 thus constructed, data of one bit at the H-level or L-level, which is in the form of electric charges accumulated in capacitor 10C, is held at a storage node N10 between transistor 10T and capacitor 10C. Cell plate CP forms a node common to all memory cells 10, and its potential is fixed at a predetermined level.

Word driver group WD0 has a plurality of word drivers and is provided for selectively activating word lines WL. The charges held at storage nodes N10 are read from memory cells 10 connected to activated word line WL onto corresponding bit lines BL or inverted bit lines /BL. Each sense amplifier SA0 is connected to one bit line pair BL and /BL. Each sense amplifier SA0 senses and amplifies a potential difference generated between corresponding paired bit lines BL and /BL.

Data read operation in the DRAM shown in FIG. 55 will be described below. FIG. 56 is a timing chart showing operation waveforms of respective portions in the read operation of the DRAM in FIG. 55.

At an initial stage, the read operation is performed as follows. Storage node N10 has held data at the H-level corresponding to the level of power supply potential Vcc, and bit line pair BL and /BL has been equalized to a potential of Vcc/2.

At time to in FIG. 56, the potential of word line WL is raised from the ground potential GND to a predetermined raised potential Vpp. Raised potential Vpp is equal to or higher than (Vcc+Vth) where Vth is a threshold voltage of transistor 10T. When the potential of word line WL is raised as described above, the charges held at each storage node N10 are transmitted, e.g., onto bit line BL. Thereby, a minute potential difference ΔV occurs at bit line pair BL and /BL.

Thereafter, sense amplifier SA0 amplifies potential difference ΔV at time t1.

In this manner, charges held at all memory cells 10 connected to one word line WL are temporarily read onto corresponding bit lines BL or inverted bit lines /BL. Thereafter, sense amplifier SA0 amplifies potential difference ΔV occurring at bit line pair BL and /BL. Data thus read out is restored at storage node N10.

However, the above conventional DRAM suffers from many problems to be solved. These problems will be described below.

A first problem will now be described below. As can be seen from the operation already described, the conventional DRAM operates in such a manner that, by raising the potential of one word line WL, charges held at all memory cells 10 connected to this word line WL are read onto corresponding bit line pairs BL and /BL. Thus, the charges are read onto all bit line pairs BL and /BL.

In the DRAM, therefore, it is necessary to amplify the potential differences of all bit line pairs BL and /BL, onto which the charges are read, by all of corresponding sense amplifiers SA0.

In the case where one memory cell is to be accessed, it is necessary to activate all bit line pairs BL and /BL in the memory cell array containing memory cell 10 to be accessed as well as all sense amplifiers SA0 connected to them.

In the conventional DRAM, therefore, it is necessary to charge all bit lines BL or all inverted bit lines /BL in the memory cell array containing memory cell 10 to be accessed from Vcc/2 level to Vcc level, or it is necessary to discharge all bit lines BL or all inverted bit lines /BL from Vcc/2 level to the ground level GND. Accordingly, the conventional DRAM wastes a majority of power consumed in the read operation.

A specific example will be described below. It is assumed that the DRAM is the most familiar 64-Mbit DRAM, in which each word line WL is connected to 2048 bit lines BL and 2048 inverted bit lines /BL.

In this case, if only one memory cell 10 among many memory cells 10 connected to one word line WL is to be accessed, charges for charging/discharging a great number of, i.e., 2047 bit lines BL and 2047 inverted bit lines /BL will be wasted. Thus, the conventional DRAM disadvantageously wastes the power.

A second problem will be described below. In the conventional DRAM, as already described, it is necessary to amplify potential differences ΔV occurring at all bit line pairs BL and /BL in response to potential rise of one word line WL. Therefore, it is necessary to provide many sense amplifiers SA0 corresponding to respective bit line pairs BL and /BL.

In general, the layout pitch of bit lines are reduced in accordance with miniaturization of memory cells, and thus generation of DRAMs. However, it is now difficult to form an appropriate layout of the sense amplifiers complying with such a reduced pitch.

In the structure of the conventional memory cell array shown in FIG. 55, therefore, it is difficult to arrange appropriately the sense amplifiers in a DRAM having an increased capacity.

In view of the above problem, such a structure can be considered that can ease the restrictions on the layout pitch of sense amplifiers. FIG. 57 is a block diagram showing a structure of a conventional DRAM which can ease the restrictions on the sense amplifier pitch. Referring to FIG.

57, two sense amplifiers SA0 are aligned in the extending direction of bit line pair BL and /BL. This allows arrangement of the sense amplifiers in accordance with the pitch of bit lines.

However, the following disadvantage arises in this arrangement of sense amplifiers. Since sense amplifiers SA0 are arranged in the extending direction of the bit line pair BL and /BL, a width L of a layout region of the sense amplifiers increases, which relatively reduces an area occupied by the memory cells in the memory chip.

This structure is inconsistent with increase of the capacity of DRAM. Therefore, it is necessary to provide a structure which eases the restrictions on the layout pitch of sense amplifiers and complies with increase of the capacity of DRAM.

A third problem will be described below. As the capacity of DRAM increases, the size of each memory cell 10 is reduced and the pitch of word lines WL is also reduced. Therefore, it is now difficult to arrange the word drivers in accordance with the pitch of word lines WL which is reduced as a result of increase of the DRAM capacity.

Further, the length of word line WL increases as the width of word line decreases and the area of the memory cell array increases in accordance with increase of the capacity. Thus, the resistance of word line WL increases in accordance with increase of the capacity of DRAM, resulting in a problem that delay occurs in access to the memory cells.

In the structure of the memory cell array in the conventional DRAM already described, it is difficult to form an appropriate layout of the word drivers and word lines in accordance with increase of the capacity. Accordingly, a structure which can comply with the increase of the capacity of DRAM is required.

A fourth problem will be described below. In accordance with miniaturization of memory cells and reduction of power consumption of DRAM, a power supply potential of DRAM lowers. In the conventional structure of the memory cell array, a potential difference ΔV caused by read out of charges from memory cell 10 onto bit line pair BL and /BL can be expressed as:

$$\Delta V = (\tfrac{1}{2}) \times Cs/(Cb+Cs) \times Vcc$$

where Cs represents the cell capacity, Cb represents the bit line capacity, and Vcc represents the power supply potential. Thus, the potential difference ΔV decreases in proportion to lowering of power supply potential Vcc.

Therefore, a low power supply potential may impair stable memory operation. Accordingly, it is necessary to generate a potential difference ΔV allowing stable memory operation even with the low power supply potential.

A fifth problem will be described below. The power supply potential of DRAM has been lowered as already described. Therefore, the quantity of electric charges held at memory cell 10 has decreased. The reduction of the quantity of charges reduces the potential difference ΔV and also directly affects refresh and occurrence of soft error.

Description will first be given on the influence on the refresh by the reduction of the power supply potential. In memory cell 10 of DRAM, and particularly in memory cell 10 holding data at the H-level, the charges held at storage node N10 decrease in quantity due to subthreshold leak of transistor 10T and junction leak at a junction surface under a diffusion region forming a drain electrode of transistor 10T.

When the data at the H-level is held, the potential at storage node N10 is initially at the level of Vcc, but the level will gradually lower due to the leak described above. When the potential at storage node N10 lowers to or below (½)Vcc, the potential difference ΔV occurring at corresponding bit line pair BL and /BL goes to a negative value, so that data at the L-level will be read.

Therefore, the DRAM requires rewriting of data at the H-level into memory cell 10 prior to reading of such erroneous data. Thus, refreshing is required in the above case.

As described before, when the power supply potential decreases, the potential corresponding to data at the H-level written into memory cell 10 lowers, resulting in reduction of charges of ((½)·Vcc·Cs) held at memory cell 10 in accordance with the H-level.

This reduces a time period for which the potential at storage node N10 corresponding to the H-level lowers to or below (½)Vcc in cm10. Therefore, as the power supply potential is lowered, the refreshing must be performed more frequently.

However, such frequent refreshing naturally increases a time required for the refreshing in a total operation time, and thus relatively reduces times for writing and reading. This results in such a problem that a current for holding data increases.

A problem of soft error related to the fifth problem will be described below. The soft error represents a phenomenon that α-rays radiated internally or externally from a device of DRAM destroys data held at memory cell 10.

When memory cell 10 hold charges at the H-level, the held charges can be represented by (½)Vcc·Cs, and a resistance against the soft error lowers in accordance with reduction of the quantity of charges held at the cell.

In the case where a low power supply potential is employed, it is necessary to take some measures for preventing reduction of the quantity of charges held at the memory cell.

A sixth problem will be described below. The DRAM generally uses raised potential Vpp, which is an internal potential at a higher level that power supply potential Vcc, for using the same, e.g., as the raised potential of word line WL.

Use of raised potential Vpp is effective in efficient reading of charges from memory cell 10, but is inconsistent with reduction of the power consumption of DRAM, because a potential higher than power supply potential Vcc must be generated and thus the energy efficiency is low.

Further, in the above case, the power supply potentials at several levels are required, which complicates circuits such as word drivers using raised potential Vpp. Therefore, use of the raised potential Vpp is inconsistent with increase of the capacity of DRAM for the above reasons as well as reasons related to the word line pitch already discussed in connection with the third problem.

Therefore, it is desirable that devices aiming at reduction of the power consumption and devices in the next generation aiming at increase of the capacity employ architecture which can exclude raised potential Vpp as far as possible.

A seventh problem will be described below. In accordance with increase of the capacity of DRAM, word lines WL and bit line pairs BL and /BL increase in number and decrease in size. Therefore, short circuit is liable to occur frequently between defective word lines, defective bit lines and the cell plate.

Defective word lines and defective bit lines can be repaired with spare word lines and spare bit lines. However, even such a repair cannot suppress increase of a leak current caused by the above short circuit. Therefore, in the device in the next generation aiming at increase of the capacity, it is necessary to employ an architecture which can suppress increase of the leak current caused by short circuit in the memory cell array.

SUMMARY OF THE INVENTION

An object of the invention is to provide a DRAM suitable to increase of a capacity.

Another object of the invention is to reduce a power consumption of a DRAM.

Still another object of the invention is to ease restrictions on a layout pitch of sense amplifiers.

Yet another object of the invention is to ease restrictions on a layout pitch of word lines.

Further another object of the invention is to reduce an electrical resistance of word lines.

A further object of the invention is to increase a potential difference read from a memory cell onto a bit line pair.

A further object of the invention is to increase a quantity of electric charges held at a memory cell.

A further object of the invention is to allow activation of a word line without using a raised potential.

A further object of the invention is to suppress a leak current caused by short circuit in a memory cell array.

A semiconductor memory device according to an aspect of the invention includes a plurality of bit lines, a plurality of electrode nodes, a word line, memory cells and an electrode node potential control circuit.

The plurality of bit lines are parallel to each other. The plurality of electrode nodes are provided correspondingly to the plurality of bit lines, respectively, and are arranged alternately with respect to the bit lines. The word line is arranged to cross the plurality of bit lines and the plurality of electrode nodes, and is set to a predetermined potential in the operation of reading data.

The plurality of memory cells are arranged at crossings defined by the word line with respect to the bit lines and the electrode nodes paired with the bit lines, respectively, and each are connected to the bit line, the electrode node and the word line at the corresponding crossing. The memory cell connected to the pair of the bit line and the electrode node has a capacitor having first and second electrodes and connected at its first electrode to the electrode node, and an MOS transistor having a gate electrode receiving a potential of the word line and connected between the second electrode and the bit line.

The electrode node potential control circuit is operable, in an operation of reading data, to set the potential of the electrode node connected to the memory cell selected for reading data to a first level making the MOS transistor in the selected memory cell obtain a potential of the second electrode allowing turn-on in response to the predetermined potential, and set the potential of the electrode node connected to the memory cell not selected for the data reading to a second level making the MOS transistor in the unselected memory cell obtain the potential of the second electrode not allowing turn-on in response to the predetermined potential.

According to the above aspect, each of the plurality of memory cells is connected at its capacitor to the electrode node. In the read operation, therefore, the selected memory cell is set to a state allowing turn-on of the MOS transistor in response to activation of the word line to the predetermined potential owing to the coupling of the capacitor which is caused by setting of the corresponding electrode node to the first level.

Meanwhile, the unselected memory cell is set to a state not allowing turn-on of the MOS transistor in response to the predetermined potential of the word line owing to the fact that the corresponding electrode node is set to the second level.

Therefore, when the word line is activated to the predetermined potential, the MOS transistor is turned on only in the selected one among the plurality of memory cells connected to the activated word line. Therefore, data (electric charges) held at the memory cell among the plurality of memory cells connected to the word line is read therefrom onto the corresponding bit line pair.

In this manner, the bit lines are selectively operated by controlling the potentials of the electrode nodes, so that the power consumption can be reduced. Further, reading of data is performed by controlling the potentials of electrode nodes, so that the raised voltage of the word line can be small.

The semiconductor memory device according to the above aspect may additionally include each of the structures described below.

The electrode node potential control circuit sets the potential of the electrode node connected to the selected memory cell to the first level prior to setting of the word line to the predetermined potential.

According to the above structure, the bit lines are selectively operated by the control of the potentials of the electrode nodes prior to activation of the word line, so that the power consumption can be reduced. Further, reading of data is performed by controlling the potentials of the electrode nodes, so that the raised voltage of the word line can be small.

The electrode node potential control circuit sets the potential of the electrode node connected to the selected memory cell to the first level after setting of the word line to the predetermined potential.

According to the above structure, the bit lines are selectively operated by the control of the potentials of the electrode nodes after activation of the word line, so that the power consumption can be reduced. Further, reading of data is performed by controlling the potentials of the electrode nodes, so that the raised voltage of the word line can be small.

A semiconductor memory device according to another aspect of the invention includes a plurality of bit line pairs, a word line, a plurality of memory cells and a plurality of sense amplifier circuits.

The plurality of bit line pairs each have a bit line and an inverted bit line, and are parallel to each other. The word line is arranged to cross the plurality of bit line pairs, and is set to a predetermined potential in the operation of reading data.

The plurality of memory cells are arranged at crossings of the plurality of bit line pairs and the word line, respectively, and each are connected to the bit line pair and the word line forming the corresponding crossing. The memory cell connected to each of the bit line pairs has a capacitor having first and second electrodes and connected at its first electrode to the inverted bit line, and an MOS transistor having a gate electrode receiving the potential of the word line and connected between the second electrode and the bit line.

The plurality of sense amplifier circuits are provided correspondingly to the plurality of bit line pairs, respectively, and each are operable to sense and amplify the potential difference of the corresponding bit line pair.

Each of the plurality of sense amplifier circuits is operable, in the operation of reading data, to set the potentials of the corresponding bit line pair to a first level making the MOS transistor in the corresponding memory cell obtain a potential of the second electrode allowing turn-on in response to the predetermined potential when the corresponding memory cell is selected for the reading, and to set the potentials of the corresponding bit line pair to a second level making the MOS transistor in the corresponding memory cell obtain a potential of the second electrode not allowing turn-on in response to the predetermined potential when the corresponding memory cell is not selected for the reading.

According to the above aspect, each of the plurality of memory cells is connected between the corresponding bit line and the inverted bit line. Therefore, in the operation of reading data, the selected memory cell is set to a state allowing turn-on of the MOS transistor in response to activation of the word line to the predetermined potential owing to the coupling of the capacitor which is caused by setting of the corresponding bit line pair to the first level.

Meanwhile, the unselected memory cell is set to a state not allowing turn-on of the MOS transistor in response to the predetermined potential of the word line owing to setting of the corresponding bit line pair to the second level.

Therefore, when the word line is activated to the predetermined potential, the MOS transistor is turned on only in the selected one among the plurality of memory cells connected to the activated word line. Therefore, electric charges (data) held at the memory cell among the plurality of memory cells connected to the word line are read therefrom onto the corresponding bit line pair.

Further, each memory cell is connected between the bit line and the inverted bit line, so that electric charges held at the memory cell are read onto both the bit line and the inverted bit line. Therefore, a large potential difference occurs at the bit line pair, so that the sense amplifier circuit amplifying such a large potential difference can stably perform amplification.

In this manner, the bit lines are selectively operated by controlling the potentials of the electrode nodes, so that the power consumption can be reduced. Further, reading of data is performed by controlling the potentials of electrode nodes, so that the raised voltage of the word line can be small.

The semiconductor memory device according to the above aspect may additionally include each of the structures described below.

The sense amplifier circuit corresponding to the memory cell selected for reading sets the potentials of the corresponding bit line pair to the first level before the word line is set to the predetermined potential.

According to the above structure, the bit line pairs are selectively operated by the control of the potentials of the bit line pairs prior to activation of the word line, so that the power consumption can be reduced. Further, reading of data is performed by controlling the potentials of the bit line pair, so that the raised voltage of the word line can be small.

According to the above structure, the bit line pairs are selectively operated by the control of the potentials of the bit line pairs after activation of the word line, so that the power consumption can be reduced. Further, reading of data is performed by controlling the potentials of the bit line pair, so that the raised voltage of the word line can be small.

The semiconductor memory device may further include a plurality of sense amplifier select lines, and each of the plurality of sense amplifier circuits may include an equalizing circuit, a precharging circuit, a first sensing circuit and a second sensing circuit.

The plurality of sense amplifier select lines are provided correspondingly to the plurality of sense amplifier circuits, respectively, and are selectively activated for selectively operating the plurality of sense amplifier circuits in the read operation.

The equalizing circuit is provided for equalizing the potentials of the corresponding bit line pair. The precharging circuit receives the potential of the corresponding sense amplifier select line, and precharges the potentials of the corresponding bit line pair to the second level when the corresponding sense amplifier select line is activated.

The first sensing circuit has an NMOS transistor, receives the potential of the corresponding sense amplifier select line, and amplifies lower one between the potentials of the corresponding paired bit lines when the corresponding sense amplifier select line is activated. The second sensing circuit has a PMOS transistor, and operates in parallel with the amplifying operation of the first sensing circuit to amplify higher one between the potentials of the corresponding paired bit lines.

According to the above structure, each sense amplifier circuit can precharge the bit line pair in response to selective activation of the sense amplifier select line, and further the first and second sensing circuits can amplify the potentials of the bit line pair. In this manner, the potential difference of the bit line pair can be amplified in response to activation of the sense amplifier select line.

The semiconductor memory device may further include a first potential supply line, a second potential supply line, a sense amplifier activating line, a plurality of sense amplifier select lines, a plurality of first switch circuits and a plurality of second switch circuits.

The first potential supply line is provided for supplying a first sense potential defining a first voltage amplitude of each of the bit line and the inverted bit line. The second potential supply line is provided for supplying a second sense potential defining a second voltage amplitude of each of the bit line and the inverted bit line.

The sense amplifier activating line is activated for operating the plurality of sense amplifier circuits in the refresh operation. The plurality of sense amplifier select lines are provided correspondingly to the plurality of sense amplifier circuits, and are selectively activated for selectively operating the plurality of sense amplifier circuits in the read and write operations.

The first switch circuits are arranged between the first potential supply line and the plurality of sense amplifier circuits, respectively, and each are provided for receiving the potential of the sense amplifier activating line, and supplying the first sense potential to the plurality of sense amplifier circuits when the sense amplifier activating line is activated.

The plurality of second switch circuits are arranged between the second potential supply line and the plurality of sense amplifier circuits, respectively, and each are provided for receiving the potential of the sense amplifier select line related to the corresponding sense amplifier circuit, and supplying the second sense potential to the corresponding sense amplifier circuit when the corresponding sense amplifier select line is activated.

According to the above structure, all the sense amplifier circuits can be operated based on the first sense potential supplied through the first switch circuit in response to the activation of the sense amplifier activating line in the refresh operation. Further, in response to the selective activation of the sense amplifier select lines in the write and read operations, the sense amplifier circuits can be selectively operated based on the second sense potential selectively supplied through the second switch circuit. In this manner, the voltage amplitudes obtained in the bit line and the inverted bit line during refreshing can be different from those during the writing and reading.

The semiconductor memory device may further include a potential supply line, a sense amplifier activating line, a plurality of sense amplifier select lines, a plurality of first switch circuits and a plurality of second switch circuits.

The potential supply line is provided for supplying a sense potential defining a voltage amplitude of each of the bit line and the inverted bit line. The sense amplifier activating line is activated for operating the plurality of sense amplifier circuits in the refresh operation. The plurality of sense amplifier select lines are provided correspondingly to the plurality of sense amplifier circuits, respectively, and are selectively activated for selectively operating the plurality of sense amplifier circuits in the read and write operations.

The first switch circuits are arranged between the potential supply line and the plurality of sense amplifier circuits, respectively, and each are provided for receiving the potential of the sense amplifier activating line, and supplying the sense potential of the potential supply line to the plurality of sense amplifier circuits when the sense amplifier activating line is activated.

The plurality of second switch circuits are arranged between the potential supply line and the plurality of sense amplifier circuits, respectively, and each are provided for receiving the potential of the sense amplifier select line related to the corresponding sense amplifier circuit, and supplying the sense potential of the potential supply line to the corresponding sense amplifier circuit when the corresponding sense amplifier select line is activated.

According to the above structure, all the sense amplifier circuits can be operated based on the sense potential supplied through the first switch circuit in response to the activation of the sense amplifier activating line in the refresh operation. Further, in response to the selective activation of the sense amplifier select lines in the write and read operations, the sense amplifier circuits can be selectively operated based on the sense potential selectively supplied through the second switch circuit. As a result, the sense potential in the refresh operation can be equal to that in the read and write operations, so that lines or interconnections for supplying the sense potential can be reduced.

The semiconductor memory device may further include a first potential supply line, a plurality of second potential supply lines, a sense amplifier activating line, a sense amplifier select line, a plurality of first switch circuits and a plurality of second switch circuits.

The first potential supply line is provided for supplying a first sense potential defining a first voltage amplitude of each of the bit line and the inverted bit line. The plurality of second potential supply lines are provided correspondingly to the plurality of sense amplifier circuits, respectively, and each are operable to supply a second sense potential defining a second voltage amplitude of each of the bit line and the inverted bit line amplified by the corresponding sense amplifier circuit, when the corresponding sense amplifier circuit is selected in the read and write operations.

The sense amplifier activating line is activated for operating the plurality of sense amplifier circuits in the refresh operation. The sense amplifier select line is activated for operating the sense amplifier circuit in the read and write operations.

The plurality of first switch circuits are arranged between the first potential supply line and the plurality of sense amplifier circuits, respectively, and each are provided for receiving the potential of the sense amplifier activating line, and supplying the first sense potential to the plurality of sense amplifier circuits when the sense amplifier activating line is activated.

The plurality of second switch circuits are arranged between the second potential supply line and the plurality of sense amplifier circuits, respectively, and each are provided for receiving the potential of the sense amplifier select line, and supplying the second sense potential to the corresponding sense amplifier circuit when the corresponding sense amplifier select line is activated and the corresponding second potential supply line supplies the second sense potential.

According to the above structure, all the sense amplifier circuits can be operated based on the first sense potential supplied through the first switch circuit in response to the activation of the sense amplifier activating line in the refresh operation. Further, in response to the activation of the sense amplifier select line in the write and read operations, the sense amplifier circuits can be selectively operated based on the fact that the second sense potential is supplied only to the corresponding sense amplifier circuit through the second switch circuit among the plurality of second switch circuits corresponding to the second potential supply line supplying the second sense potential. As a result, a difference can be formed in the voltage amplitude of the bit line and the inverted bit line between the write operation and the read operation.

The plurality of sense amplifier circuits may include a first sense amplifier circuit and a second sense amplifier circuit. Further, the semiconductor memory device may additionally include a potential supply line, a first sense amplifier activating line, a second sense amplifier activating line, a first switch circuit, a second switch circuit and a sense amplifier activating line control circuit.

The potential supply line is arranged in a direction crossing the bit line pair, and is provided for supplying a sense potential defining a voltage amplitude of each of the bit line and the inverted bit line. The first sense amplifier activating line is arranged in a direction crossing the bit line pair, and is activated for operating the first sense amplifier circuit. The second sense amplifier activating line is arranged in a direction crossing the bit line pair, and is activate for operating the second sense amplifier circuit.

The first switch circuit is arranged between the potential supply line and the first sense amplifier circuit, and is provided for receiving the potential of the first sense amplifier activating line, and supplying the sense potential of the potential supply line to the first sense amplifier circuit when the first sense amplifier activating line is activated.

The second switch circuit is arranged between the potential supply line and the second sense amplifier circuit, and is provided for receiving the potential of the second sense amplifier activating line, and supplying the sense potential of the potential supply line to the second sense amplifier circuit when the second sense amplifier activating line is activated.

The sense amplifier activating line control circuit is provided for activating both of the first and second sense amplifier activating lines in the refresh operation and selectively activating the first and second sense amplifier activating lines in the write and read operations.

In the refresh operation of the above structure, the sense amplifier activating line is activated, and the potential supply line supplies the sense potential to the first and second sense amplifier circuits through the first and second switch circuits, so that all the sense amplifier circuits can be operated. Further, in the write and read operations, the potential supply line supplies the sense potential to the first or second sense amplifier circuit through the first or second switch circuit in response to selective activation of the sense amplifier activating lines, so that the sense amplifier circuit can be operated selectively. As a result, the sense potential in the refresh operation can be equal to that in the read and write operations, so that lines or interconnections for supplying the sense potential can be reduced.

The semiconductor memory device may include a plurality of gate circuits and a gate activating line.

The plurality of gate circuits are arranged between the plurality of bit line pairs and the plurality of sense amplifier circuits for connecting the corresponding bit line pairs to the sense amplifier circuits when activated, respectively.

The gate activating line is arranged in a direction crossing the bit line pairs for supplying to the plurality of gate circuits the potential for activating the plurality of gate circuits.

According to the above structure, the plurality of gate circuits are activated in response to the activation of the gate activating line. Thereby, the corresponding bit line pairs are connected to the plurality of sense amplifier circuits, respectively. Therefore, the selective operation of the bit line pair can be performed under the control of the potential of the sense amplifier activating line, when the gate circuit is activated.

The plurality of sense amplifier circuits may include a first sense amplifier circuit and a second sense amplifier circuit. Further, the semiconductor memory device may additionally include a first potential supply line, a second potential supply line, a sense amplifier activating line, a first switch circuit, a second switch circuit and a sense potential control circuit.

The first potential supply line is arranged in a direction crossing the bit line pair, and is provided for supplying a sense potential defining a voltage amplitude of each of the bit line and the inverted bit line corresponding to the first sense amplifier circuit.

The second potential supply line is arranged in a direction crossing the bit line pair, and is provided for supplying a sense potential defining a voltage amplitude of each of the bit line and the inverted bit line corresponding to the second sense amplifier circuit.

The sense amplifier activating line is arranged in a direction crossing the bit line pair, and is activated for operating the first or second sense amplifier circuit.

The first switch circuit is arranged between the first potential supply line and the first sense amplifier circuit, and is provided for receiving the potential of the sense amplifier activating line, and supplying the sense potential to the first sense amplifier circuit when the sense amplifier activating line is activated and the first potential supply line supplies the sense potential.

The second switch circuit is arranged between the second potential supply line and the second sense amplifier circuit, and is provided for receiving the potential of the sense amplifier activating line, and supplying the sense potential to the second sense amplifier circuit when the sense amplifier activating line is activated and the second potential supply line supplies the sense potential.

The sense potential control circuit is provided for supplying the sense potential to the first and second potential supply lines in the refresh operation, and selectively supplying the sense potential to the first or second potential supply line in the write and read operations.

In the refresh operation of the above structure, the sense potential is supplied from the first and second potential supply lines to the first sense amplifier circuits through the first and second switch circuits, respectively, so that both the first and second sense amplifier circuits can be operated. In the write and read operations, the sense potential is supplied from the first or second potential supply line to the first or second sense amplifier circuit through the first or second switch circuit, so that the first and second sense amplifier circuit can be selectively operated. In this manner, the sense amplifier circuits can be selectively operated in the write and read operations by controlling the sense potentials of the first and second potential supply lines arranged in the direction crossing the bit line pair.

The semiconductor memory device may further include a plurality of sense amplifier select lines, a plurality of data line pairs, a transfer control line and a plurality of gate circuits.

The plurality of sense amplifier select lines correspond to the plurality of sense amplifier circuits, respectively, are arranged in parallel to the plurality of bit line pairs, and are selectively activated for selectively operating the plurality of sense amplifier circuits.

The plurality of data line pairs correspond to the plurality of bit line pairs, respectively, and are arranged in parallel to the plurality of bit line pairs. The transfer control line is arranged in a direction crossing the plurality of bit line pairs, and is activated for transferring the potentials of the plurality of bit line pairs onto the data line pairs.

The plurality of gate circuits are connected between the plurality of bit line pairs and the plurality of data line pairs, respectively, and each are provided for receiving the potential of the transfer control line, and transferring the potentials of the corresponding bit line pair onto the corresponding data line pair when the transfer control line is activated.

The plurality of sense amplifier circuits are activated when the corresponding sense amplifier select lines are activated, respectively.

According to the above structure, the plurality of sense amplifier circuits can be selectively operated by selective activation of the plurality of bit line pairs and the plurality of sense amplifier select lines arranged in parallel to them. Further, in response to activation of the transfer control line, the potentials of the bit line pair corresponding to the selected sense amplifier circuit can be transferred onto the corresponding data line pair arranged in parallel to the bit line pair through the corresponding gate circuit.

The semiconductor memory device may further include a plurality of sense amplifier select lines, a data line pair, a transfer control line and a plurality of gate circuits.

The plurality of sense amplifier select lines correspond to the plurality of sense amplifier circuits, respectively, are arranged in parallel to the plurality of bit line pairs, and are selectively activated for selectively operating the plurality of sense amplifier circuits.

The data line pair is arranged in a direction crossing the plurality of bit line pairs, and selectively receives the potentials of the plurality of bit line pairs. The transfer control line is arranged in a direction crossing the plurality of bit line pairs, and is activated for transferring the potentials of the plurality of bit line pairs onto the data line pair.

The plurality of gate circuits correspond to the plurality of bit line pairs, respectively, are connected between the plurality of bit line pairs and the data line pair, respectively, and each are provided for receiving the potential of the transfer control line, and transferring the potentials of the corresponding bit line pair onto the data line pair when the transfer control line is activated.

The plurality of sense amplifier circuits are activated when the corresponding sense amplifier select lines are activated.

According to the above structure, the plurality of sense amplifier select lines arranged in parallel to the plurality of bit line pairs are selectively activated, whereby the plurality of sense amplifier circuits can be selectively operated. Further, in response to activation of the transfer control line, the potentials of the bit line pair corresponding to the selected sense amplifier circuit can be transferred onto the corresponding data line pair crossing the bit line pair through the corresponding gate circuit.

A semiconductor memory device according to still another aspect of the invention includes a plurality of bit line pairs, a plurality of word lines, a plurality of memory cells and a plurality of sense amplifier circuits.

The plurality of bit line pairs each have a bit line and an inverted bit line, and are parallel to each other. The plurality of word lines are arranged to cross the plurality of bit line pairs, and are selectively set to a predetermined potential in the operation of reading data.

The plurality of memory cells are arranged at crossings of the plurality of bit line pairs and the plurality of word lines, respectively, and each are connected to the bit line pair and the word line forming the corresponding crossing. The plurality of memory cells connected to each of the bit line pairs have a first and second memory cells.

The first memory cell has a first capacitor having first and second electrodes and connected at its first electrode to the inverted bit line, and a first MOS transistor having a first gate electrode receiving the potential of the first word line and connected between the second electrode and the bit line.

The second memory cell has a second capacitor having third and fourth electrodes and connected at its third electrode to the bit line, and a second MOS transistor having a second gate electrode receiving the potential of the second word line and connected between the fourth electrode and the inverted bit line.

The plurality of sense amplifier circuits are provided correspondingly to the plurality of bit line pairs, respectively, and each are operable to sense and amplify the potential difference of the corresponding bit line pair.

The plurality of sense amplifier circuits are operable, in the operation of reading data, to set the potentials of the corresponding bit line pairs to a first level making the first and second MOS transistors in the corresponding first and second memory cells obtain potentials of the second and fourth electrodes allowing turn-on in response to the predetermined potential when the corresponding first and second memory cells are selected for the reading, respectively, and to set the potentials of the corresponding bit line pairs to a second level making the first and second MOS transistors in the corresponding first and second memory cells obtain potentials of the second and fourth electrodes not allowing turn-on in response to the predetermined potential when the corresponding first and second memory cells are not selected for the reading, respectively.

According to the above aspect, the first and second memory cells corresponding to each bit line pair are connected between the bit line and the inverted bit line.

Therefore, in the operation of reading data, the selected first and second memory cells are set to a state allowing turn-on of the MOS transistor in response to activation of the word line to the predetermined potential owing to the coupling of the capacitor which is caused by setting of the corresponding bit line pair to the first level.

Meanwhile, each of the unselected first and second memory cells is set to a state not allowing turn-on of the MOS transistor in response to the predetermined potential of the word line owing to setting of the corresponding bit line pair to the second level.

Therefore, when the word line is activated to the predetermined potential, the MOS transistor is turned on only in the selected one among the plurality of first or second memory cells connected to the activated word line. Therefore, electric charges (data) held at the selected first or second memory cell among the plurality of memory cells connected to the word line are read therefrom onto the corresponding bit line pair.

Further, the plurality of memory cells connected to each bit line pair include the first memory cell connected at its MOS transistor to the bit line and the second memory cell connected at its MOS transistor to the inverted bit line, so that capacity balance of the respective bit line pairs can be kept.

According to the above structure, since the bit line pairs are selectively operated by controlling the potentials of the bit line pairs, the power consumption can be reduced. Since the bit line pairs are connected to the memory cells having different connections forms, the capacity balance of the bit line pairs can be kept. Consequently, a sense margin can be increased.

The semiconductor memory device according to the above aspect may additionally include each of the structures described below.

A semiconductor memory device according to yet another aspect of the invention includes a plurality of bit line pairs, a word line, a plurality of memory cells and a plurality of sense amplifier circuits.

The plurality of bit line pairs each have a bit line and an inverted bit line, and are parallel to each other. The word line is arranged to cross the plurality of bit line pairs, and is set to a first potential in the operation of reading data.

The plurality of memory cells are arranged at crossings of the plurality of bit line pairs and the word line, respectively, and each are connected to the bit line pair and the word line forming the corresponding crossing. The memory cell connected to each of the bit line pairs has a capacitor having first and second electrodes and connected at its first electrode to the inverted bit line, and an MOS transistor having a gate electrode receiving the potential of the word line and connected between the second electrode and the bit line.

The plurality of sense amplifier circuits are provided correspondingly to the plurality of bit line pairs, respectively, and each are operable to sense and amplify the potential difference of the corresponding bit line pair. Each of the plurality of sense amplifier circuits includes an equalizing circuit for equalizing the potentials of the corresponding bit line pair, and an amplifying circuit for changing the potentials of the corresponding bit line pair toward a second potential and amplifying the potential difference appearing on the corresponding bit line pair.

Each of the plurality of sense amplifier circuits is operable, in the operation of reading data and particularly in the case of selection of the corresponding memory cell for the reading, to equalize and set the potentials of the corresponding bit line pair to a first level making the MOS transistor of at least the selected memory cell obtain the potential of the second electrode allowing turn-on in response to the potential at the first level, release the equalized state prior to setting of the potential of the word line to the first potential, and amplify the potential difference of the bit line pair after setting of the word line to the first potential, and is also operable, in the case of unselection of the corresponding memory cell for reading, to set the potentials of the corresponding bit line pair to a second level making the MOS transistor in the unselected memory cell obtain the potential of said second electrode not allowing turn-on in response to the first potential.

According to the above aspect, each of the plurality of memory cells is connected between the corresponding bit line and the inverted bit line. Therefore, in the operation of reading data, the selected memory cell is set to a state allowing turn-on of the MOS transistor in response to activation of the word line to the first potential owing to the coupling of the capacitor which is caused by setting of the equalized corresponding bit line pair to the first level.

Meanwhile, each of the unselected memory cells is set to a state not allowing turn-on of the MOS transistor in response to the first potential of the word line owing to setting of the corresponding bit line pair to the second level.

Therefore, when the word line is activated to the first potential, the MOS transistor is turned on only in the selected one among the plurality of memory cells connected to the activated word line. Therefore, electric charges (data) held at the selected memory cell among the plurality of memory cells connected to the word line are read therefrom onto the corresponding bit line pair.

Further, in the operation of reading data, amplification of the potential difference of the bit line pair starts simultaneously with activation of the word line. Therefore, fast read operation is allowed.

According to the above structure, since the bit line pairs are selectively operated by controlling the potentials of the bit line pairs, the power consumption can be reduced. Further, amplification of the potential difference of the bit line pair starts simultaneously with activation of the word line, so that fast read operation can be performed.

A semiconductor memory device according to further another aspect of the invention includes a plurality of bit line pairs, a word line, a plurality of memory cells and a plurality of sense amplifier circuits.

The plurality of bit line pairs each have a bit line and an inverted bit line, and are parallel to each other. The word line is arranged to cross the plurality of bit line pairs, and is set to a first potential in the operation of reading data.

The plurality of memory cells are arranged at crossings of the plurality of bit line pairs and the word line, respectively, and each are connected to the bit line pair and the word line forming the corresponding crossing. The memory cell connected to each of the bit line pairs has a capacitor having first and second electrodes and connected at its first electrode to the inverted bit line, and an MOS transistor having a gate electrode receiving the potential of the word line and connected between the second electrode and the bit line.

The plurality of sense amplifier circuits are provided correspondingly to the plurality of bit line pairs, respectively, and each are operable to sense and amplify the potential difference of the corresponding bit line pair. Each of the plurality of sense amplifier circuits includes an equalizing circuit for equalizing the potentials of the corresponding bit line pair, and an amplifying circuit for changing the potentials of the corresponding bit line pair toward a second potential and amplifying the potential difference appearing on the corresponding bit line pair so as to turn on the corresponding MOS transistor in response to the first potential.

Each of the plurality of sense amplifier circuits is operable, in the operation of reading data and particularly in the case of selection of the corresponding memory cell for reading, to release the equalized state of the potentials of the equalized corresponding bit line pair prior to setting of the word line to the first potential, and amplify the potential difference of the bit line pair after setting of the word line to the first potential, and is also operable, in the case of unselection of the corresponding memory cell for reading, to set the potentials of the corresponding bit line pair to a second level making the MOS transistor in the unselected memory cell obtain the potential of said second electrode not allowing turn-on in response to the first potential.

According to the above aspect, each of the plurality of memory cells is connected between the corresponding bit line and the inverted bit line. Therefore, in the operation of reading data, the selected memory cell is set to such a state that the MOS transistor is turned on owing to coupling of the capacitor caused by setting of the corresponding bit line pair to the second level, after the word line is activated to the first potential.

Meanwhile, each of the unselected memory cells is set to a state not allowing turn-on of the MOS transistor in response to the second potential of the corresponding bit line pair.

Therefore, when the word line is activated to the first potential, the MOS transistor is turned on only in the selected one among the plurality of memory cells connected to the activated word line. Therefore, electric charges (data) held at the selected memory cell among the plurality of memory cells connected to the word line are read therefrom onto the corresponding bit line pair.

Further, in the operation of reading data, the bit line pair corresponding to the selected memory cell starts to change its potential toward the second potential after setting of the word line to the first potential, and amplification of the bit line pair starts. Therefore, it is not necessary to delay the amplification by the sense amplifier circuit until the potential difference occurring at the bit line pair is transmitted to the sense amplifier circuit, and thus fast read operation is allowed.

According to the above structure, since the bit line pairs are selectively operated by controlling the potentials of the bit line pairs, the power consumption can be reduced. Further, amplification of the bit line pair starts in accordance with occurrence of the potential difference at the bit line pair after activation of the word line, so that it is not necessary to delay amplification by the sense amplifier circuit until the potential difference occurring at the bit line pair is transmitted to the sense amplifier circuit. Therefore, fast read operation can be performed.

The semiconductor memory device of the above aspect may additionally include a structure in which each of the plurality of sense amplifier circuits is operable, in the restore operation after reading of data from the corresponding bit line pair, to restore the potentials of the bit line pair to the potentials in the equalized state before reading of data.

According to the above structure, control is performed, in the restore operation, to restore the potentials of the bit line pair to the potentials in the equalized state before the data reading. Therefore, such a conventional operation is not required that the word line is deactivated after the potentials of the bit line pair reach a sufficiently high level in the restore operation, so that fast restoring can be performed.

A semiconductor memory device according to a further aspect of the invention includes a plurality of bit line pairs, a word line, a plurality of memory cells and a plurality of sense amplifier circuits.

The plurality of bit line pairs each have a bit line and an inverted bit line, and are parallel to each other. The word line is arranged to cross the plurality of bit line pairs, and changes its potential from a first level to a second level in the operation of reading data.

The plurality of memory cells are arranged at crossings of the plurality of bit line pairs and the word line, respectively, and each are connected to the bit line pair and the word line forming the corresponding crossing. The memory cell connected to each of the bit line pairs has a capacitor having first and second electrodes and connected at its first electrode to the inverted bit line, and an MOS transistor having a gate electrode receiving the potential of the word line and connected between the second electrode and the bit line.

The plurality of sense amplifier circuits are provided correspondingly to the plurality of bit line pairs, respectively, and each are operable to sense and amplify the potential difference of the corresponding bit line pair.

Further, each of the plurality of sense amplifier circuits is operable, in the operation of reading data, to equalize, before setting of said word line to said second level, the potentials of the corresponding bit line pair to a third level intermediate the first and second level making the MOS transistor in the corresponding memory cell obtain the potential of the second electrode allowing turn-on in response to the second level, and amplify the potential difference, after setting of the word line to the second level, by amplifying the potential transmitted from the corresponding memory cell to one of the paired bit lines to a fourth level higher than the third level and amplifying the potential transmitted from the memory cell to the other of the paired bit lines to a fifth level lower than the third level.

According to the above structure, each of the plurality of memory cells is connected between the corresponding bit line and the inverted bit line. In the operation of reading data, the potentials of the bit line pair are equalized in advance to the third level within a variable range of the potential of the word line defined between the first and second levels. When the potential of the word line is activated to the second level, charges held at the memory cell are read onto the bit line and the inverted bit line.

Therefore, a potential difference occurring at the bit line pair is larger than that in the prior art. Accordingly, the sense amplifier circuit can stably perform amplification. The potential of one of the paired bit lines is amplified to the third level, and the potential of the other of the paired bit lines is amplified to the fourth level. Thus, the amplification is performed such that the potential difference read from the memory cell onto the bit line pair is large and the potential difference of the bit line pair expands to both the positive and negative sides.

Therefore, in the case that a predetermined amplified potential difference of the bit line pair is to be obtained, amplification can be performed with a smaller amplification factor of the bit line pair than the prior art.

As described above, charges held at the memory cell are read onto the bit line and the inverted bit line, so that the potential difference occurring at the bit line pair can be larger than that in the prior art. Therefore, the sense amplifier circuit can stably perform the amplifying operation. Further, the potential difference expands to both the positive and negative sides. Therefore, in the case that a predetermined amplified potential difference of the bit line pair is to be obtained, amplification can be performed with a smaller amplification factor of the bit line pair than the prior art. Since the potential difference occurring at the bit line pair can be large, the memory cell can hold charges larger in quantity than the prior art.

A semiconductor memory device according to a further aspect of the invention includes a plurality of bit line pairs, a word line, a plurality of memory cells and a plurality of sense amplifier circuits.

The plurality of bit line pairs each have a bit line and an inverted bit line, and are parallel to each other. The word line crosses the plurality of bit line pairs, and changes its potential from a first level to a second level in the operation of reading data.

The plurality of memory cells are arranged at crossings of the plurality of bit line pairs and the word line, respectively, and each are connected to the bit line pair and the word line forming the corresponding crossing. The memory cell connected to each of the bit line pairs has a capacitor having first and second electrodes and connected at its first electrode to the inverted bit line, and an MOS transistor having a gate electrode receiving the potential of the word line and connected between the second electrode and the bit line.

The plurality of sense amplifier circuits are provided correspondingly to the plurality of bit line pairs, respectively, and each are operable to sense and amplify the potential difference of the corresponding bit line pair.

Further, each of the plurality of sense amplifier circuits is operable, in the operation of reading data, to equalize, before setting of the word line to the second level, the potentials of the corresponding bit line pair to the first level allowing the memory cell to turn on in response to the second level, and to amplify, after setting of the word line to the second level, the potential difference of the corresponding bit line pair by amplifying the potential transmitted from the corresponding memory cell to one of the paired bit lines to a third level higher than the first level and amplifying the potential transmitted from the memory cell to the other of the paired bit lines to a fourth level lower than the first level.

According to the above structure, each of the plurality of memory cells is connected between the corresponding bit line pair and the inverted bit line pair. In the operation of reading data, the potentials of the bit line pair are equalized in advance to the first level equal to the potential level of the word line in the standby state. When the potential of the word line is activated to the second level, charges held at the memory cell are read onto the bit line and the inverted bit line.

Therefore, a potential difference occurring at the bit line pair is larger than that in the prior art. Accordingly, the sense amplifier circuit can stably perform amplification. The potential of one of the paired bit lines is amplified to the third level, and the potential of the other of the paired bit lines is amplified to the fourth level.

Thus, the amplification is performed such that a large potential difference is read from the memory cell onto the bit line pair and the potential difference of the bit line pair expands to both the positive and negative sides. Therefore, in the case that a predetermined amplified potential difference of the bit line pair is to be obtained, amplification can be performed with a smaller amplification factor of the bit line pair than the prior art.

Further, in the standby state, the potential of the word line is equal to the potentials of the bit line pair, so that a leak current does not flow even when they are short-circuited.

As described above, charges held at the memory cell are read onto the bit line and the inverted bit line, so that the potential difference occurring at the bit line pair can be larger than that in the prior art. Therefore, the sense amplifier circuit can stably perform the amplifying operation.

Further, the potential difference expands to both the positive and negative sides. Therefore, in the case that a predetermined amplified potential difference of the bit line pair is to be obtained, amplification can be performed with a smaller amplification factor of the bit line pair than the prior art. Since the potential difference occurring at the bit line pair can be large, the memory cell can hold charges larger in quantity than the prior art.

Further, even when the word line and the bit line pair are short-circuited in the standby state, a leak current due to the short-circuit can be prevented, because the potential of the word line is equal to the potentials of the bit line pair.

A semiconductor memory device according to a further aspect of the invention includes a plurality of word lines, a plurality of column select lines, a plurality of bit lines, a plurality of memory cells and a column selecting circuit. The plurality of word lines are arranged in parallel to each other, and are selectively set to a predetermined potential. The plurality of column select lines are arranged to cross the plurality of word lines, and are selectively activated. The plurality of bit lines are provided correspondingly to the plurality of column select lines, respectively, are arranged alternately to the column select lines, and each have a length shorter than half the length of the column select line.

The plurality of memory cells are arranged at crossings of the plurality of word lines and pairs of the column select lines and the bit lines neighboring to each other, respectively, and each are connected to the column select line, the bit line and the word line.

The memory cell connected to each pair of column select line and the bit line includes a capacitor having first and second electrodes and connected at its first electrode to the column select line, and an MOS transistor having a gate electrode receiving the potential of the word line and connected between the second electrode and the bit line.

The column selecting circuit receives a column address and is responsive to the column address to set only the potential of the column select line in a selected column to a level making the MOS transistor in the memory cell connected to the column select line obtain the potential of the second electrode allowing turn-on in response to the predetermined potential.

In the above structure, each of the plurality of memory cells is connected at its capacitor to the column select line.

Therefore, in the operation of reading data, the selected memory cell is set to a state allowing turn-on of the MOS transistor in response to activation of the word line to a predetermined potential owing to coupling of the capacitor caused by activation of the corresponding column select line to the predetermined level by the column selecting circuit. Meanwhile, the unselected memory cell is not set to the above state, because the corresponding column select line is not activated.

Therefore, when the word line is activated to the predetermined potential, the MOS transistor is turned on only in the selected one among the plurality of memory cells connected to the activated word line. Accordingly, charges (data) held at the memory cell selected by the column selecting circuit from the plurality of memory cells connected to the activated word line are read onto the corresponding bit line.

As described above, in the structure provided with the memory cells which include the capacitors connected to the column select lines and the MOS transistors connected to the bit lines, the bit lines are selectively operated by controlling the potentials of the column select lines, so that the power consumption can be reduced.

The semiconductor memory device according to the above aspect may additionally include such a structure that the plurality of memory cells connected to one of adjacent two pairs of the column select lines and bit lines are connected to the word line different from the word line connected to the plurality of memory cells connected to the other of the adjacent two pairs of the column select lines and bit lines.

According to this structure, while operation is being performed by the one of the adjacent two pairs of the column select lines and bit lines, the operation is not performed by the other of the two pairs of the column select lines and bit lines. Therefore, the unoperating column select lines and bit lines can act to shied noises. Consequently, a sense margin can be increased.

A semiconductor memory device according to a further aspect of the invention includes a plurality of main column select lines, a plurality of column select sub-lines, a plurality of bit lines, a plurality of word lines, a plurality of memory cells, a main column selecting circuit and a column selecting sub-circuit.

The plurality of main column select lines are arranged in parallel to each other, and are selectively activated. The plurality of column select sub-lines are provided correspondingly to the plurality of main column select lines, respectively, are arranged alternately to the main column select lines, and each have a length shorter than half the length of the main column select line.

The plurality of bit lines are provided correspondingly to the plurality of column select sub-lines, respectively, and are arranged alternately to the column select sub-lines. The plurality of word lines are arranged to cross the plurality of main column select lines, the plurality of column select sub-lines and the plurality of bit lines, and are selectively activated to a predetermined potential.

The plurality of memory cells are arranged at crossings of the plurality of word lines and pairs of the column select lines and the bit lines neighboring to each other, respectively, and each are connected to the column select sub-line, the bit line and the word line.

The memory cell connected to the paired column select sub-lines and the bit line includes a capacitor having first and second electrodes and connected at its first electrode to the column select sub-lines, and an MOS transistor having a gate electrode receiving the potential of the word line and connected between the second electrode and the bit line.

The main column select circuit selectively activates the plurality of main column select lines. The column select sub-circuit receives the potential of each of the plurality of main column select lines, and sets the potential of the column select sub-line corresponding to the activated main column select line to a level making the MOS transistor in the memory cell connected to the corresponding column select sub-line obtain the potential of the second electrode allowing turn-on in response to the predetermined potential.

As described above, owing to selective activation of the plurality of main column select lines by the main column select circuit, the column select sub-circuit to be operated is selected. The selected column select sub-circuit activates the corresponding column select sub-line.

Each of the plurality of memory cells is connected at its capacitor to the column select sub-line. Therefore, by the activation of the column select sub-line, the MOS transistor in the memory cell connected thereto is enabled to turn on in response to the activation of the word line to the predetermined potential.

When the word line is activated to the predetermined potential, therefore, the MOS transistor is turned on only in the selected memory cell among the plurality of memory cells connected to the activated word line. Therefore, charges (data) held at the memory cell selected by the column select sub-circuit from the plurality of memory cells connected to the word line are read therefrom onto the corresponding bit line.

As described above, in the structure provided with the memory cells which include the capacitors connected to the column select sub-lines and the MOS transistors connected to the bit lines, the bit lines are selectively operated by controlling the potentials of the column select sub-lines, so that the power consumption can be reduced. Since the bit lines are selectively operated by the control of the potentials of the column select sub-lines having a small capacity, fast read operation can be performed.

A semiconductor memory device according to a further aspect of the invention includes a plurality of word lines, a plurality of column select lines, a plurality of bit lines, a plurality of memory cells and a column selecting circuit.

The plurality of word lines are arranged in parallel to each other, and are selectively set to a predetermined potential. The plurality of column select lines are arranged to cross the plurality of word lines, and are selectively activated. The plurality of bit lines are provided correspondingly to the plurality of column select lines, respectively, are arranged alternately to the column select lines, and each have a length shorter than half the length of the column select line.

The plurality of memory cells are arranged at crossings of the plurality of word lines and pairs of the column select lines and the bit lines neighboring to each other, respectively, and each are connected to the corresponding column select line, the bit line and the word line.

The memory cell connected to each pair of the column select line and the bit line includes a capacitor having first and second electrodes and connected at its first electrode to the bit line, and an MOS transistor having a gate electrode receiving the potential of the word line and connected between the second electrode and the column select line.

The column selecting circuit receives a column address and is responsive to the column address to set only the potential of the column select line in a selected column to a level making the MOS transistor in the memory cell connected to the column select line obtain the potential of the second electrode allowing turn-on in response to the predetermined potential.

In the above structure, each of the plurality of memory cells is connected at its MOS transistor to the column select line.

Therefore, in the operation of reading data, the selected memory cell is set, in response to activation of the corresponding column select line by the column select circuit, to a state allowing turn-on of the MOS transistor in the memory cell in response to activation of the word line to a predetermined potential. Meanwhile, the unselected memory cell is not set to the above state, because the corresponding column select line is not activated.

Therefore, when the word line is activated to the predetermined potential, the MOS transistor is turned on only in the selected one among the plurality of memory cells connected to the activated word line.

Accordingly, charges (data) held at the memory cell selected by the column selecting circuit from the plurality of memory cells connected to the activated word line are read onto the corresponding bit line.

As described above, in the structure provided with the memory cells which include the capacitors connected to the bit lines and the MOS transistors connected to the column select lines, the bit lines are selectively operated by controlling the potentials of the column select lines, so that the power consumption can be reduced.

A semiconductor memory device according to a further aspect of the invention includes a plurality of main column select lines, a plurality of column select sub-lines, a plurality of bit lines, a plurality of word lines, a plurality of memory cells, a main column selecting circuit and a column selecting sub-circuit.

The plurality of main column select lines are arranged in parallel to each other, and are selectively activated. The plurality of column select sub-lines are provided correspondingly to the plurality of main column select lines, respectively, are arranged alternately to the main column select lines, and each have a length shorter than half the length of the main column select line.

The plurality of bit lines are provided correspondingly to the plurality of column select sub-lines, respectively, and are arranged alternately to the column select sub-lines. The plurality of word lines are arranged to cross the plurality of main column select lines, the plurality of column select sub-lines and the plurality of bit lines, and are selectively activated to a predetermined potential.

The plurality of memory cells are arranged at crossings of the plurality of word lines and pairs of the column select sub-lines and the bit lines neighboring to each other, respectively, and each are connected to the corresponding column select sub-line, the bit line and the word line.

The memory cell connected to each pair of the column select sub-line and the bit line includes a capacitor having first and second electrodes and connected at its first electrode to the bit line, and an MOS transistor having a gate electrode receiving the potential of the word line and connected between the second electrode and the column select sub-line.

The main column select circuit selectively activates the plurality of column select lines. The column select sub-circuit receives the potential of each of the plurality of main column select lines, and sets the potential of the column select sub-line corresponding to the activated main column select line to a level making the MOS transistor in the memory cell connected to the corresponding column select sub-line obtain the potential of the second electrode allowing turn-on in response to the predetermined potential. As described above, owing to selective activation of the plurality of main column select lines by the main column select circuit, the column select sub-circuit to be operated is selected. The selected column select sub-circuit activates the corresponding column select sub-line.

Each of the plurality of memory cells is connected at its MOS transistor to the column select sub-line. Therefore, by the activation of the column select sub-line, the MOS transistor in the memory cell connected thereto is enabled to turn on in response to the activation of the word line to the predetermined potential.

When the word line is activated to the predetermined potential, therefore, the MOS transistor is turned on only in the selected memory cell among the plurality of memory cells connected to the activated word line. Therefore, charges (data) held at the memory cell selected by the column select sub-circuit from the plurality of memory cells connected to the word line are read therefrom onto the corresponding bit line.

As described above, in the structure provided with the memory cells which include the capacitors connected to the bit lines and the MOS transistors connected to the column select sub-lines, the bit lines are selectively operated by controlling the potential of the column select sub-line, so that the power consumption can be reduced. Since the bit lines are selectively operated by the control of the potentials of the column select sub-lines having a small capacity, fast read operation can be performed.

A semiconductor memory device according to a further aspect of the invention includes a plurality of bit line pairs, a word line, a plurality of memory cells, a plurality of sense amplifier circuits and a word driver circuit.

The plurality of bit line pairs each have a bit line and an inverted bit line, and are parallel to each other. The word line is arranged to cross the plurality of bit line pairs.

The plurality of memory cells are arranged at crossings of the plurality of bit line pairs and the word line, respectively, and each are connected to the bit line pair and the word line forming the corresponding crossing. The memory cell connected to each of the bit line pairs has a capacitor having first and second electrodes and connected at its first electrode to the inverted bit line, and an MOS transistor having a gate electrode receiving the potential of the word line and connected between the second electrode and the bit line.

The plurality of sense amplifier circuits are provided correspondingly to the plurality of bit line pairs, respectively, and each being operable to sense and amplify the potential difference of the corresponding bit line pair.

Each of the plurality of sense amplifier circuits is operable, in the read operation, to lower the potentials of the corresponding bit line pair from an equalized first level to a second level when the corresponding memory cell is selected for the reading, and to hold the potentials of the corresponding bit line pair at the equalized first level when the corresponding memory cell is not selected for the reading, and is operable, in the refresh operation, to equalize the potentials of the corresponding bit line pair to the first level.

The word driver circuit is operable, in the read operation, to set the potential of the word line to a third level allowing turn-on of only the MOS transistor in the selected memory cell, and is operable, in the refresh operation, to set the potential of the word line to a fourth level allowing turn-on of all the memory cells.

According to the above aspect, only the bit line pair corresponding to the selected memory cell among the plurality of bit line pairs equalized to the first level is set to the second level in the read operation. In the refresh operation, the plurality of bit line pairs are held at the equalized first level.

Further, the potential of the word line is set, in the read operation, to the third level allowing turn-on of only the MOS transistor in the selected memory cell, and is set, in the refresh operation, to the fourth level allowing turn-on of the MOS transistors in all the memory cells.

Owing to the above relationship between the potentials of the bit line pair and the potential of the word line, both the read and refresh operations can be executed by setting the potential of the activated word line in the read and refresh operations to different levels under the condition that the potentials of the bit line pair are set to a constant level in the standby state.

As described above, the bit line pairs are selectively operated by controlling the potentials of the bit line pairs in the read operation in the read operation, so that the power consumption can be reduced. Further, by setting the potential of the word line activated in the read operation and the potential of the word line activated in the refresh operation to different levels, both the read operation and the refresh operation can be executed under the condition that the potentials of the bit line pair are set to a constant level in the standby state.

According to a further aspect of the invention, a semiconductor memory device for executing a retention mode for performing refreshing and an access mode for performing refreshing and reading, includes a plurality of bit line pairs, a word line, a plurality of memory cells, a plurality of sense amplifier circuits and a word driver circuit.

The plurality of bit line pairs each have a bit line and an inverted bit line, and are parallel to each other. The word line is arranged to cross the plurality of bit line pairs.

The plurality of memory cells are arranged at crossings of the plurality of bit line pairs and the word line, respectively, and each are connected to the bit line pair and the word line forming the corresponding crossing. The memory cell connected to each of the bit line pairs has a capacitor having first and second electrodes and connected at its first electrode to the inverted bit line, and an MOS transistor having a gate electrode receiving the potential of the word line and connected between the second electrode and the bit line.

The plurality of sense amplifier circuits are provided correspondingly to the plurality of bit line pairs, respectively, and each are operable to sense and amplify the potential difference of the corresponding bit line pair. Each of the plurality of sense amplifier circuits is operable, during standby in the retention mode, to equalize the potentials of the corresponding bit line pair to a first level, and thereafter perform sensing and amplifying of the potential difference of the corresponding bit line pair, and is operable, during standby in the access mode, to equalize the potentials of the corresponding bit line pair to a second level, and thereafter perform sensing and amplifying of the potential difference of the corresponding bit line pair.

The word driver circuit is provided for controlling the potential of the word line. The word driver circuit is operable, during standby in the retention mode, to set the potential of the word line to the first level and thereafter activate the word line, and is operable, during standby in the access mode, to set the potential of the word line to a third level different from the second level and thereafter activate the word line.

According to the above structure, in the retention mode, each of the plurality of sense amplifier circuits equalizes the potentials of the bit line pair to the first level during the standby, and thereafter operates to sense and amplify the potential difference of the corresponding bit line pair. Further, in this mode, the word driver circuit sets the potential of the word line to the first level during the standby, and thereafter activates the word line.

Meanwhile, in the access mode, each of the plurality of sense amplifier circuits equalizes the potentials of the bit line pair to the second level during the standby, and thereafter operates to sense and amplify the potential difference of the corresponding bit line pair. Further, in this mode, the word driver circuit sets the potential of the word line to the third level during the standby, and thereafter activates the word line.

Owing to relationship between the potentials of the bit line pair and the potential of the word line, both the retention mode and the access mode are executed.

As described above, the potentials of the bit line pair and the word line during standby in the retention mode are set to the levels different from those of the bit line pair and the word line during standby in the access mode. Owing to this structure, both the retention mode and the access mode can be executed.

The semiconductor memory device according to the above aspect may include a short-circuiting circuit for short-circuiting the bit line pair set to the second level and the word line set to the third level when the operation shifts from the access mode to the retention mode, and thereby obtaining the potentials of the bit line pair and the word line for the standby in the retention mode.

According to the above structure, the short-circuiting circuit short-circuits the bit line pair and the word line when the operation shifts from the access mode to the retention mode. Thereby, the potentials of the bit line pair and the word line for the standby in the retention mode can be obtained. Accordingly, the operation can shift rapidly from the access mode to the retention mode, and the power consumption during shifting of the mode can be reduced.

A semiconductor memory device according to a further aspect of the invention includes a plurality of bit line pairs, a plurality of word lines, a plurality of memory cells, a plurality of sense amplifier circuits, a plurality of bit line pair select lines and a plurality of gate circuits.

The plurality of bit line pairs each have a bit line and an inverted bit line, and are parallel to each other. The plurality of word lines are arranged to cross the plurality of bit line pairs, and are selectively activated in the operation of reading data.

The plurality of memory cells are arranged at crossings of the plurality of bit line pairs and the plurality of word lines, respectively, and each are connected to the bit line pair and the word line forming the corresponding crossing. The memory cell connected to each of the bit line pairs includes a capacitor having first and second electrodes and connected at its second electrode to the bit line, and an MOS transistor having a gate electrode receiving the potential of the word line and connected between the second electrode and the inverted bit line.

In connection with the adjacent two bit line pairs, the memory cells connected to one of the two bit line pairs and the memory cells connected to the other of the two bit line pairs are connected to the different word lines.

The plurality of sense amplifier circuits each are provided correspondingly to at least two of the bit line pairs spaced from each other by at least one of the bit line pairs for selectively sensing and amplifying the potential differences of the corresponding bit line pairs.

The plurality of bit line pair select lines are provided correspondingly to the plurality of bit line pairs, respectively, are arranged in a direction crossing the plurality of bit line pairs, and are selectively activated for transmitting the potentials of the corresponding bit line pair to the corresponding sense amplifier circuit.

The plurality of gate circuits are provided correspondingly to the plurality of bit line pairs, respectively, are connected between the plurality of bit line pairs and the sense amplifier circuits, respectively, and each are operable to receive the potentials of the corresponding bit line pair select line for transmitting the potentials of the corresponding bit line pair to the corresponding sense amplifier circuit.

According to the above structure, each of the plurality of memory cells is connected between the corresponding bit line and the inverted bit line. Electric charges held at the memory cells are transmitted onto the corresponding bit line pairs. When the plurality of bit line pair select lines corresponding to the plurality of bit line pairs are selectively activated, the gate circuit corresponding to the activated bit line pair among the plurality of gate circuits transmits the potentials of the selected bit line pair to the corresponding sense amplifier circuit.

In connection with the adjacent two bit line pairs, the memory cells connected to one of the two bit line pairs and the memory cells connected to the other of the two bit line pairs are connected to the different word lines.

When one of the word lines is activated, therefore, electric charges are not transmitted onto both the adjacent bit line pairs. Thereby, the unoperated bit line pair acts as a noise shield for the operating bit line pair.

As described above, since one sense amplifier circuit is provided correspondingly to the plurality of bit line pairs, the restrictions on the layout pitch of sense amplifiers can be eased. Further, charges are not transmitted onto both the adjacent bit line pairs when one of the word lines is activated, so that the unoperating bit line pair can act as the noise shield for the operating bit line pair.

A semiconductor memory device according to a further aspect of the invention includes a plurality of word lines, a plurality of electrode nodes, a plurality of bit lines, a plurality of word lines, a plurality of memory cells, a first sense amplifier circuit, a second sense amplifier circuit, a plurality of select lines and a plurality of gate circuits.

The plurality of word lines are parallel to each other. The plurality of gate electrodes are arranged to cross the plurality of word lines. The plurality of bit lines are arranged to cross the plurality of word lines and in parallel to the plurality of gate electrodes. Each of the plurality of bit lines is provided correspondingly to the adjacent two electrode nodes, and is arranged between them.

The plurality of memory cells are arranged at crossings formed by the adjacent gate electrodes and the bit lines with respect to the word lines, respectively, and each are connected to the electrode node, the bit line and the word line forming the corresponding crossing.

The plurality of memory cells connected to each of the bit lines and the two electrode nodes corresponding to the bit line include a first memory cell connected to one of the electrode nodes and the bit line, and a second memory cell connected to the other electrode node and the bit line.

The first memory cell includes a first capacitor having first and second electrodes and connected at its first electrode to the one of the electrode nodes, and a first MOS transistor having a gate electrode receiving the potential of the first word line and connected between the first electrode and the bit line.

The second memory cell includes a second capacitor having third and fourth electrodes and connected at its third electrode to the other electrode node, and a second MOS transistor having a gate electrode receiving the potential of the second word line and connected between the third electrode and the bit line.

The first sense amplifier circuit is provided correspondingly to a plurality of pairs of the bit lines and the electrode nodes connected to the first memory cells for selectively sensing and amplifying the potential differences of these pairs. The second sense amplifier circuit is provided correspondingly to a plurality of pairs of the bit lines and the electrode nodes connected to the second memory cells for selectively sensing and amplifying the potential differences of these pairs.

The plurality of select lines are provided correspondingly to a plurality of pairs of the bit lines and the electrode nodes, respectively, are arranged in a direction crossing the plurality of electrode nodes and the plurality of bit lines, and are selectively activated for transmitting the potentials of the corresponding bit line and electrode node to the corresponding first or second sense amplifier circuit.

The plurality of gate circuits are provided correspondingly to a plurality of pairs of the bit lines and the gate electrodes, respectively, are connected between these pairs and the corresponding first or second sense amplifier circuit, respectively, and each are operable to receive the potential of the corresponding select line and transmit the potentials of the corresponding pair of the electrode node and the bit line to the corresponding first or second sense amplifier circuit when the select line is activated.

As described above, each of the first and second memory cells is connected between the bit line pair and the electrode node forming the corresponding pair. Electric charges held at the memory cell thus constructed are transmitted onto the corresponding bit line pair and the electrode node.

When the plurality of select lines corresponding to the plurality of respective pairs of the bit lines and the electrode nodes are activated, the corresponding gate circuit among the plurality of gate circuits transmits the potentials of the pair of the selected bit line and electrode node to the corresponding first or second sense amplifier circuit.

The first and second memory cells connected to one bit line are connected to different word lines. When one of the word lines is activated, therefore, electric charges are not transmitted from both the first and second memory cells to the pair of the electrode node and the bit line including the commonly used bit line. Thereby, the electrode node not supplied with charges acts as a noise shield for the electrode node and the bit line receiving the charges.

Since the adjacent pairs of the bit lines and the electrode nodes commonly use the bit lines, the restrictions on the layout pitch of the bit lines are eased. Further, a connection form of the commonly used bit line and the corresponding electrode node with respect to the capacitor and the MOS transistor in the first memory cell is different from that in the second memory cell, so that capacity balance is kept in the paired bit lines and electrode nodes As described above, each sense amplifier circuit is provided correspondingly to the plurality of pairs of the bit lines and electrode nodes, so that the restrictions on the layout pitch of the sense amplifiers can be eased.

Further, the first and second memory cells connected to the common bit line are connected to the different word lines, so that, in the case where one of the word lines is activated, electric charges are not transmitted from both the first and second memory cells to the pair of the electrode node and the bit line including the commonly used bit line.

Therefore, the electrode node not supplied with the charges can act as a noise shield for the electrode node and bit line receiving the charges.

Further, the bit lines are commonly used by the adjacent pairs of the bit lines and electrode nodes, so that the restrictions on the layout pitch of the bit lines can be eased. Since the connection form of the commonly used bit line and the corresponding electrode nodes with respect to the capacitor and the MOS transistor in the first memory cell is different from that in the second memory cell, the capacity balance can be kept at the paired bit lines and electrode nodes, so that the sense margin can be increased.

A semiconductor memory device according to a further aspect of the invention includes a plurality of first word lines, a plurality of second word lines, a plurality of bit lines and a plurality of memory cells.

Each of the plurality of first word lines is made of metal. The plurality of second word lines are arranged along the plurality of first word lines, each contain polycrystalline silicon, and each are connected at a plurality of positions to the first word line. The plurality of bit lines are arranged in a direction crossing the plurality of second word lines.

The plurality of memory cells are arranged at crossings of the plurality of second word lines and the plurality of bit lines, respectively, and each are connected to the second word line and the bit line. The plurality of second word lines are connected to the first word lines such that the adjacent two second word lines are connected at a plurality of the same positions to the common first word line.

According to the above structure, the plurality of adjacent second word lines crossing the bit lines and connected to the memory cells are connected to the common first word line made of metal. Since the first word line is commonly used by the plurality of second word lines as described above, the restrictions on the layout pitch of the first word lines can be eased. Further, a resistance value of the word lines can be reduced.

A semiconductor memory device according to a further aspect of the invention includes a plurality of first word lines, a plurality of second word lines, a plurality of bit line pairs and a plurality of memory cells.

Each of the plurality of first word lines is made of metal. The plurality of second word lines are arranged along the plurality of first word lines, each contain polycrystalline silicon, and each are connected at a plurality of positions to the first word line. The plurality of bit line pairs are arranged in a direction crossing the plurality of second word lines.

The plurality of memory cells are arranged at crossings of the plurality of second word lines and the plurality of bit line pairs, respectively, and each are connected to the second word line and the bit line pair. The plurality of second word lines are connected to the first word lines such that the adjacent two second word lines are connected at a plurality of the same positions to the common first word line.

According to the above structure, the plurality of adjacent second word lines crossing the bit line pairs and connected to the memory cells are connected to the common first word line made of metal. Since the first word line is commonly used by the plurality of second word lines as described above, the restrictions on the layout pitch of the first word lines can be eased. Further, a resistance value of the word lines can be reduced.

A further aspect of the invention provides a semiconductor memory device formed on a semiconductor substrate and including a plurality of bit line pairs, a plurality of word lines and a plurality of memory cells.

Each of the plurality of bit line pairs has a bit line and an inverted bit line. The plurality of word lines are arranged to cross the plurality of bit line pairs. The memory cells are arranged at crossings of the plurality of bit line pairs and the plurality of word lines, respectively, and each are connected to the bit line pair and the word line forming the corresponding crossing.

The memory cells connected to each of the bit line pairs each include a capacitor and an MOS transistor connected in series between the bit line and the inverted bit line of the corresponding bit line pair. The capacitor includes a lower electrode, a dielectric thin film and an upper electrode. The lower electrode in each memory cell is isolated from those in the other memory cells. The dielectric thin film is formed on the lower electrode, and is made of high dielectric material. The upper electrodes each are formed on the lower electrode with the dielectric thin film therebetween, and are divided at a pitch of arrangement of the bit line pairs.

According to the above structure, the capacitor including the upper electrode divided with the pitch of arrangement of the bit line pairs is provided with the dielectric thin film located between the upper and lower electrode and made of the high dielectric material. Therefore, the electrodes of a planar stack type are formed, and thus the process of manufacturing the memory cells can be eased.

In the semiconductor memory device according to this aspect of the invention, the dielectric thin film may be formed of ferroelectric material instead of high dielectric material.

According to the above structure, the capacitor including the upper electrode divided with the pitch of arrangement of the bit line pairs is provided with the dielectric thin film located arranged between the upper and lower electrodes and made of the high dielectric material. Therefore, the electrodes of a planar stack type are formed, and thus the process of manufacturing the memory cells can be eased.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 25 is a timing chart showing specific operation waveforms of respective portions of the DRAM in FIG. 23.

DESCRIPTION OF THE PREFERRED EMBODIMENTS

Embodiments of the invention will be described below.

First Embodiment

Figure 1:
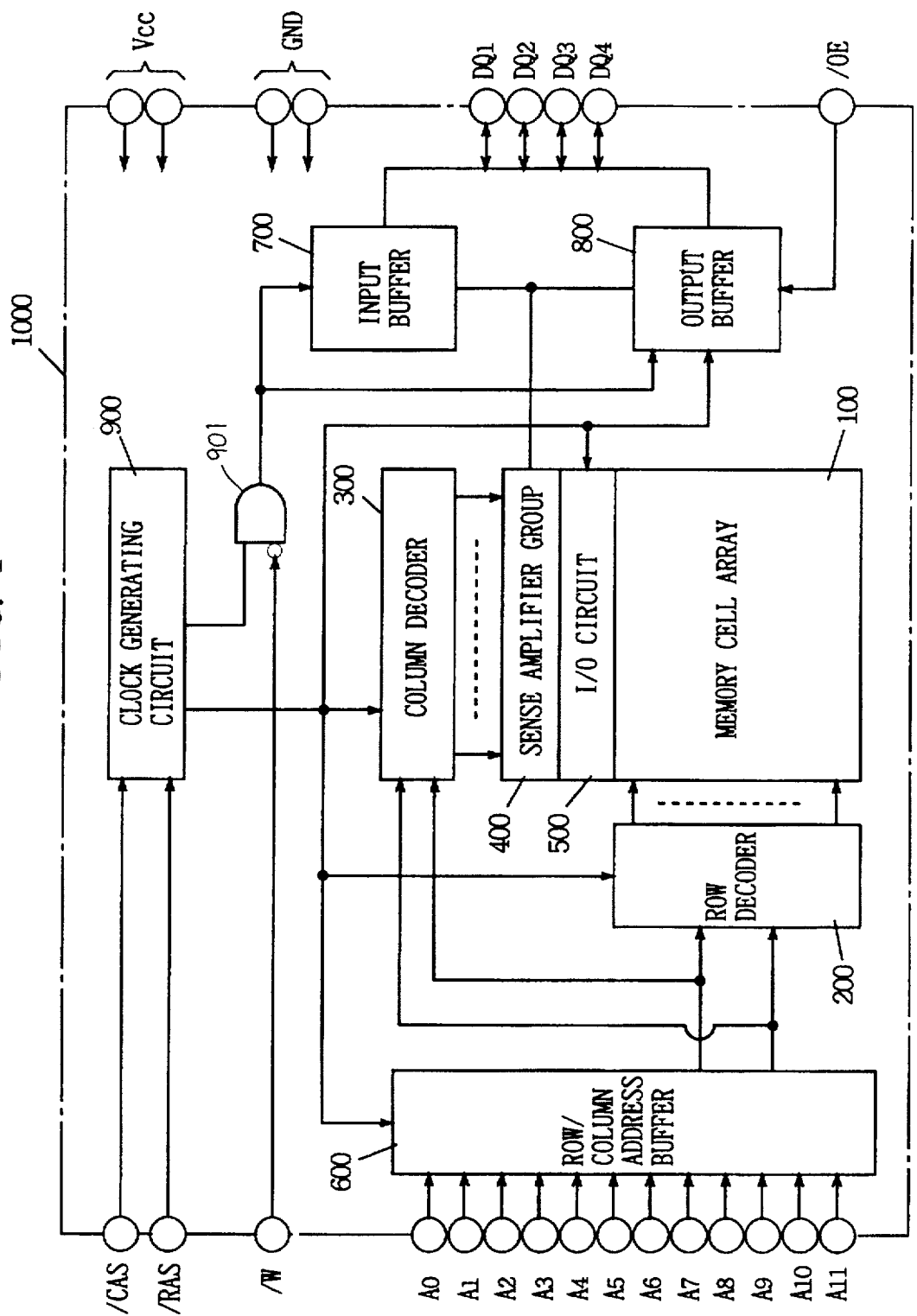
FIG. 1 is a block diagram showing a whole structure of a DRAM of a first embodiment.

FIG. 1 is a block diagram showing a whole structure of a DRAM of a first embodiment.

Referring to FIG. 1, a DRAM 1000 includes a memory cell array 100, a row decoder 200, a column decoder 300, a sense amplifier group 400, an I/O (input/output) circuit 500, a row/column address buffer 600, an input buffer 700, an output buffer 800, a clock generating circuit 900 and a logic gate 901.

DRAM 1000 operates with a power supply potential Vcc and a ground potential GND. Memory cell array 100 includes a plurality of word lines, a plurality of bit line pairs crossing the word lines and memory cells arranged at crossings of the plurality of word lines and the plurality of bit line pairs, respectively. These memory cells are adapted to accumulated electric charges corresponding to data.

Clock generating circuit 900 receives a column address strobe signal/CAS and a row address strobe signal/RAS and generates a clock signal in response to these signals.

The clock signal is supplied to row decoder 200, column decoder 300 and row/column address buffer 600, and is also supplied via logic gate 901 to input buffer 700 and output buffer 800. Row decoder 200 and others receiving the clock signal operate in response to the supplied clock signal.

Row/column address buffer 600 receives external address signals A0-A11, and supplies an internal address signal to row decoder 200 and column decoder 300. Row decoder 200 selectively drives the plurality of word lines based on the internal address signal. Column decoder 300 selects one from the plurality of bit line pairs based on the internal address signal.

Sense amplifier group 400 includes a plurality of sense amplifiers. Each sense amplifier senses and amplifies a potential difference of the corresponding bit line pair. I/O circuit 500 externally supplies a signal at a level, which corresponds to the potential difference of the bit line pair selected by column decoder 300, via output buffer 800. I/O circuit 500 supplies a potential difference, which corresponds to data externally supplied via input buffer 700, to the bit line pair selected by column decoder 300.

Figure 2:
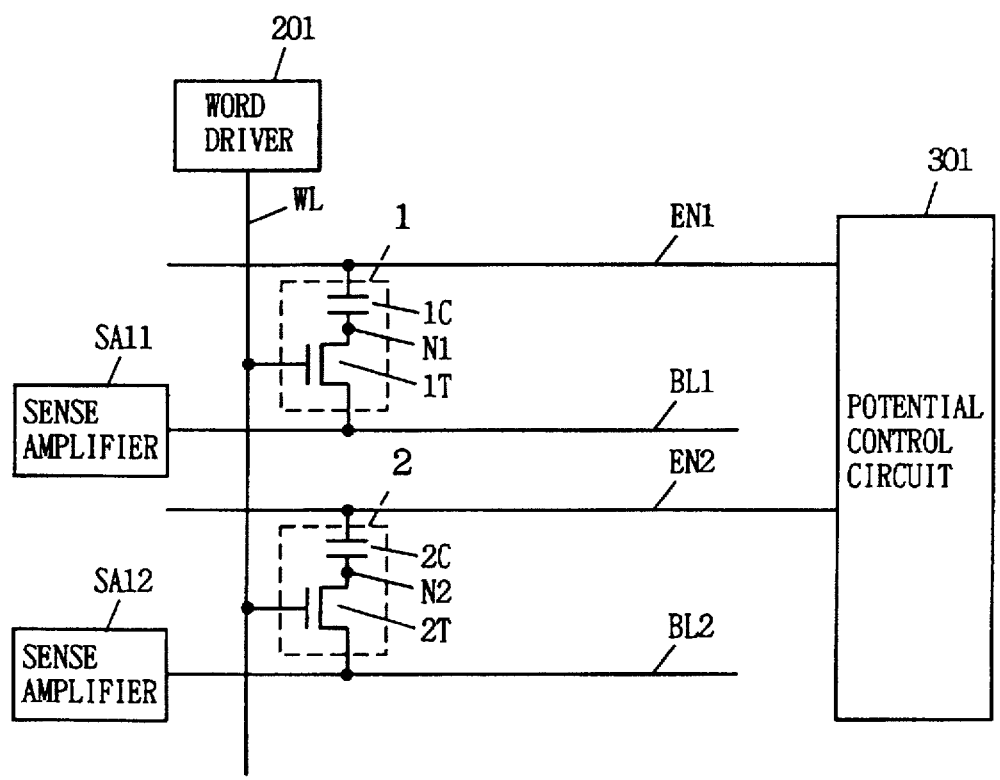
FIG. 2 is a circuit diagram showing a structure of a major portion of the DRAM of the first embodiment.

The DRAM thus constructed will be described below more in detail. FIG. 2 is a circuit diagram showing a structure of a major portion of the DRAM of the first embodiment.

The DRAM includes word lines WL (only one is shown in FIG. 2), bit lines BL1 and BL2, electrode nodes EN1 and EN2, memory cells 1 and 2, word drivers 201 (only one is shown in FIG. 2), a potential control circuits 301, and sense amplifiers SA11 and SA12.

Word line WL is arranged to cross bit lines BL1 and BL2. Electrode nodes EN1 and EN2 are parallel to bit lines BL1 and BL2. Memory cell 1 is arranged at a crossing formed by word line WL with respect to bit line BL1 and electrode node EN1. Memory cell 2 is arranged at a crossing formed by word line WL with respect to bit line BL2 and electrode node EN2.

Memory cell 1 includes an N-channel MOS transistor 1T and a capacitor 1C. Capacitor 1C is connected at one of its electrodes to electrode node EN1. Transistor 1T has a gate electrode connected to word line WL, a source electrode (or drain electrode) connected to bit line BL1, and a drain electrode (or source electrode) connected to the other electrode of capacitor 1C. A connection node of transistor 1T and capacitor 1C forms a storage node N1 for holding storage charges.

Memory cell 2 has a structure similar to that of memory cell 1. Namely, memory cell 2 includes an N channel MOS transistor 2T and a capacitor 2C, which are connected to word line WL, bit line BL2 and electrode node EN2 in a connection manner similar to that of memory cell 1. A connection node between transistor 2T and capacitor 2C forms a storage node N2.

The potential of word line WL is raised or lowered by word driver 201. The potential of each of electrode nodes EN1 and EN2 is controlled by potential control circuit 301. Potential control circuit 301 is included, for example, in column decoder 300 in FIG. 1.

Sense amplifier SA11 is connected to bit line BL1, and sense amplifier SA12 is connected to bit line BL2. Each of sense amplifiers SA11 and SA12 is provided for amplifying the potential of the corresponding bit line.

Figure 3:
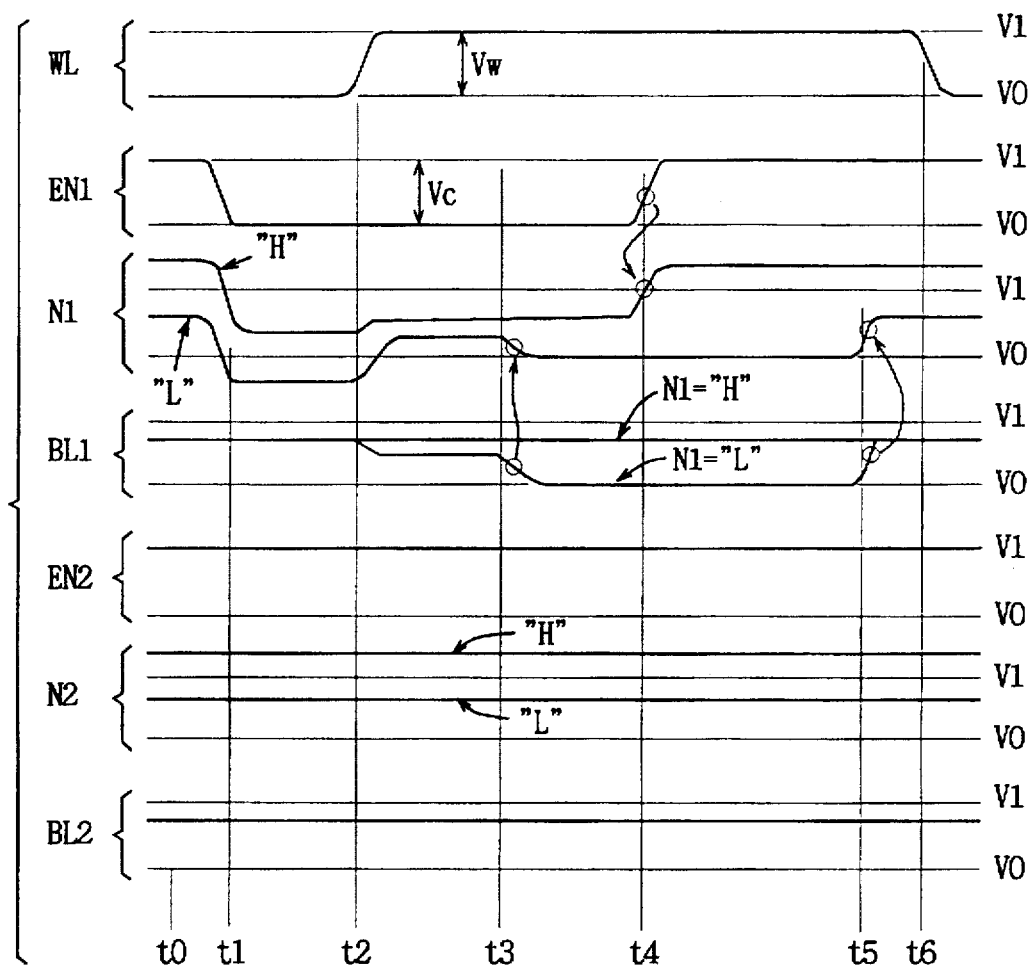
FIG. 3 is a timing chart showing waveforms of respective portions of the DRAM in FIG. 2.

Operation of the DRAM in FIG. 2 will be described below. FIG. 3 is a timing chart showing waveforms of respective portions of the DRAM in FIG. 2.

Referring to FIG. 3, this timing chart shows operation waveforms of word line WL, electrode node EN1, storage node N1, bit line BL1, electrode node EN2, storage node N2 and bit line BL2.

The following description is based on the conditions defined as below. A potential V1 is at a level equal or close to that of power supply potential Vcc. A potential V0 is at the level equal or close to the level of ground potential GND (0V).

Further, a voltage Vth is a threshold voltage of each of transistors 1 and 2, a voltage Vw is a raised voltage of word line WL, a voltage Vc is a lowered voltage of each of electrode nodes EN1 and EN2, a potential Vb is an initial potential of each of bit lines BL1 and BL2, and a potential Vs is a potential of each of storage nodes N1 and N2.

Further, in each of memory cells 1 and 2, the potential of storage node at the H-level is equal to (Vw−Vth+Vc), and the potential at the L-level is equal to (Vw−Vth).

At time t0 in the operation, the initial potentials Vb of both bit lines BL1 and BL2 are floated at the level of potential V1. The initial potential Vb may be different from V1. More specifically, the initial potential Vb is required only to satisfy a relationship of Vb≧Vw−Vth, and may be set to either of a fixed state instead or the floated state.

At subsequent time t1, the potential of electrode node EN1 is lowered by lowered voltage Vc. In this case, the potential of electrode node EN1 is lowered from potential V1 to potential V0. Lowered voltage Vc may be different from Vcc−GND.

In this case, electrode node EN2 is held at potential V1. Since electrode node EN1 is lowered as described above, potential Vs of storage node N1 is lowered by lowered voltage Vc owing to coupling of capacitor 1C.

When storage node N1 is at the H-level, the coupling acts to set the potential to Vw−Vth. Meanwhile, when storage node N1 is at the L-level, the coupling acts to set the potential to Vw−Vth−Vc.

At time t2, the potential of word line WL rise raised voltage Vw. Here, the potential of word line WL rise from V0 to V1. When potential Vs of storage node N1 is at the L-level, it is equal to or lower than Vw−Vth. Therefore, transistor 1T is turned on in response to potential rise of word line WL.

Storage node N2 keeps potential Vs not lower than Vw−Vth regardless of its level (i.e., L-level or H-level). Therefore, even when the potential of word line WL rises, transistor T2 maintains the off state.

Therefore, when the potential of word line WL is raised, data stored in memory cell 1 is destroyed, and electric charges held therein are read onto bit line BL1. In this case, memory cell 2 holds the storage data, and thus electric charges held therein are not read onto bit line BL2.

At time t3, the potential read onto bit line BL1 is amplified by sense amplifier SA11. When the potential corresponding to the storage data at the L-level is amplified, bit line BL1 and storage node N1 are set to the level of potential V0.

For amplifying the potential corresponding to the storage data at the H-level, the potential of bit line BL1 attains the level of potential V1, and potential Vs of storage node N1 attains Vw−Vth. In this case, electric charges are not read onto bit line BL2, so that the potential thereof is not amplified.

At time t4, the potential of electrode node EN1 is restored to the level of potential V1. In response to this, potential Vs of storage node N1 is set as follows. When it corresponds to the storage data at the H-level, the coupling of capacitor 1C acts to set potential Vs of storage node N1 to the level of Vs=Vw−Vth+Vc. Meanwhile, when it corresponds to the storage data at the L-level, potential Vs of storage node N1 is held at Vs=V0.

At time t5, the potential of bit line BL1 is restored to the level of potential V1. In response to this, potential Vs of storage node N1 is set as follows. When it corresponds to the storage data at the L-level, potential Vs goes to Vs=Vw−Vth. Thereafter, the potential of word line WL is restored to potential V0. In this manner, a series of operations for reading are completed.

According to the above operations, one (or a part) of multiple memory cells 1 and 2 connected to the same word line WL can be set to a read and undestroyed state by selectively operating the bit lines and electrode nodes. The read and undestroyed state is the state that it is not necessary to write into the memory cell the data which was once read therefrom.

According to the first embodiment, since the bit lines are selectively operated, as described above, power consumption can be reduced. Since reading of data is performed by controlling the potential of electrode node, the raised voltage of word line can be small.

In this first embodiment, the order of operations executed at timings t4, t5 and 56 may be arbitrarily changed. This can also achieve an effect similar to the effect already described. The operations executed at times t3 and t2 may be executed simultaneously. This can also achieve an effect similar to the effect already described.

Second Embodiment

A second embodiment will be described below. The following description of the second embodiment relates to a case where the operation executed at time t1 in FIG. 3 showing the first embodiment is executed after the operation executed at time t2. Thus, the following description will be given on the case where the potential of word line WL is raised before lowering the potential of electrode node EN1.

Figure 4:
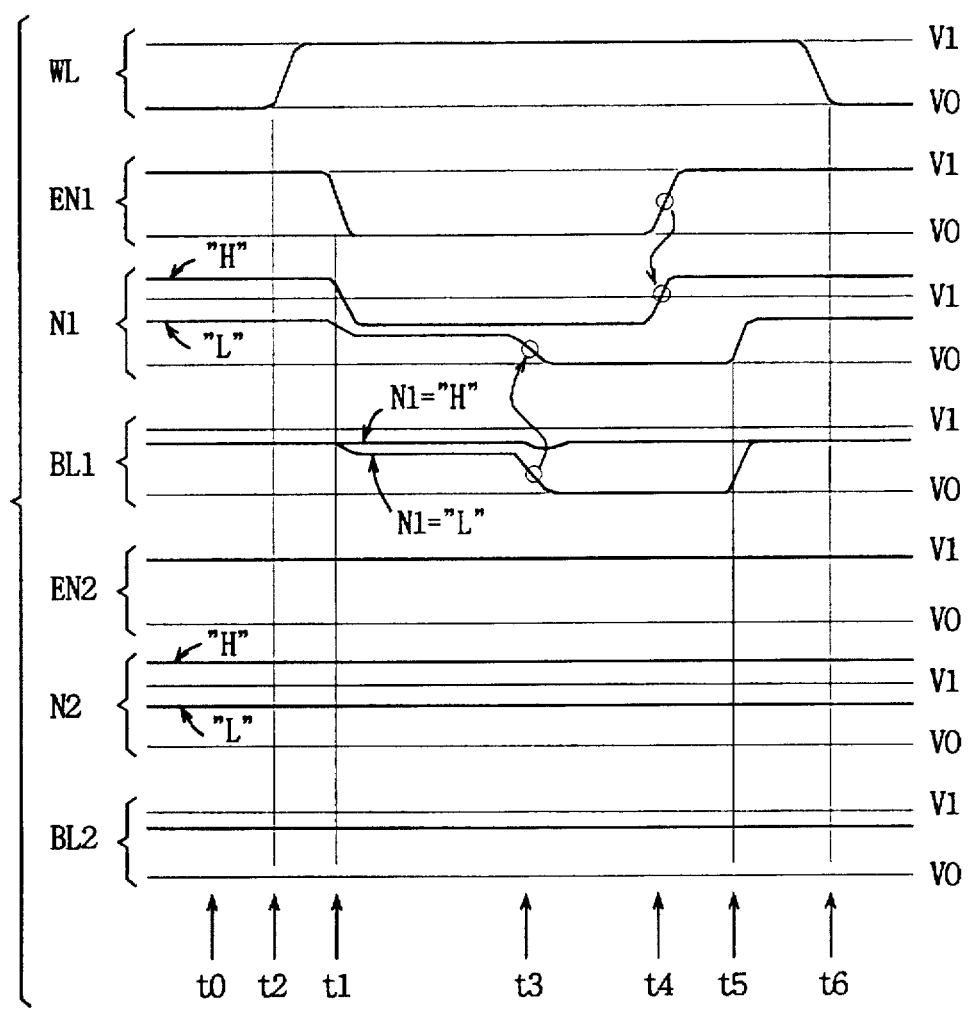
FIG. 4 is a timing chart showing waveforms of respective portions of a DRAM of a second embodiment.

FIG. 4 is a timing chart showing operation waveforms of respective portions of a DRAM of the second embodiment. Description for FIG. 4 will be given only operations different from those in FIG. 3.

In the first embodiment, when the potential of electrode node EN1 lowers, potential Ns of storage node N1 may attain Vw−Vth−Vc (when it corresponds to the storage data at the L-level). In this case, potential Vs of storage node N1 may be lower than the ground potential GND depending on the relationship between potentials Vw, Vc and Vth. If Vs is lower than GND, unnecessary charges may flow into storage node N1.

The above situation can be avoided by lowering the potential of electrode node EN1 after raising the potential of word line WL as shown in FIG. 4. Thereby, potential Vs of storage node EN1 can be equal to or higher than the ground potential GND.

In addition to the above, the second embodiment can achieve an effect similar to that of the first embodiment. That is, a part of multiple memory cells 1 and 2 connected to the same word line WL can be set to the read and undestroyed state. Therefore, the bit lines can be operated selectively, and thus the power consumption can be reduced. Further, the raised voltage of the word line can be small.

Also in this second embodiment, the order of the operations executed at times t4, t5 and t6 may be changed. The same effect can be achieved even in this case.

Third Embodiment

A third embodiment will be described below. In the first and second embodiments, charges corresponding to the storage data at the H-level are not read at all or are read only slightly onto bit line BL1. The following description of the third embodiment relates to a structure in which charges corresponding to the storage data at the H-level can be sufficiently read onto bit line BL1.

Figure 5:
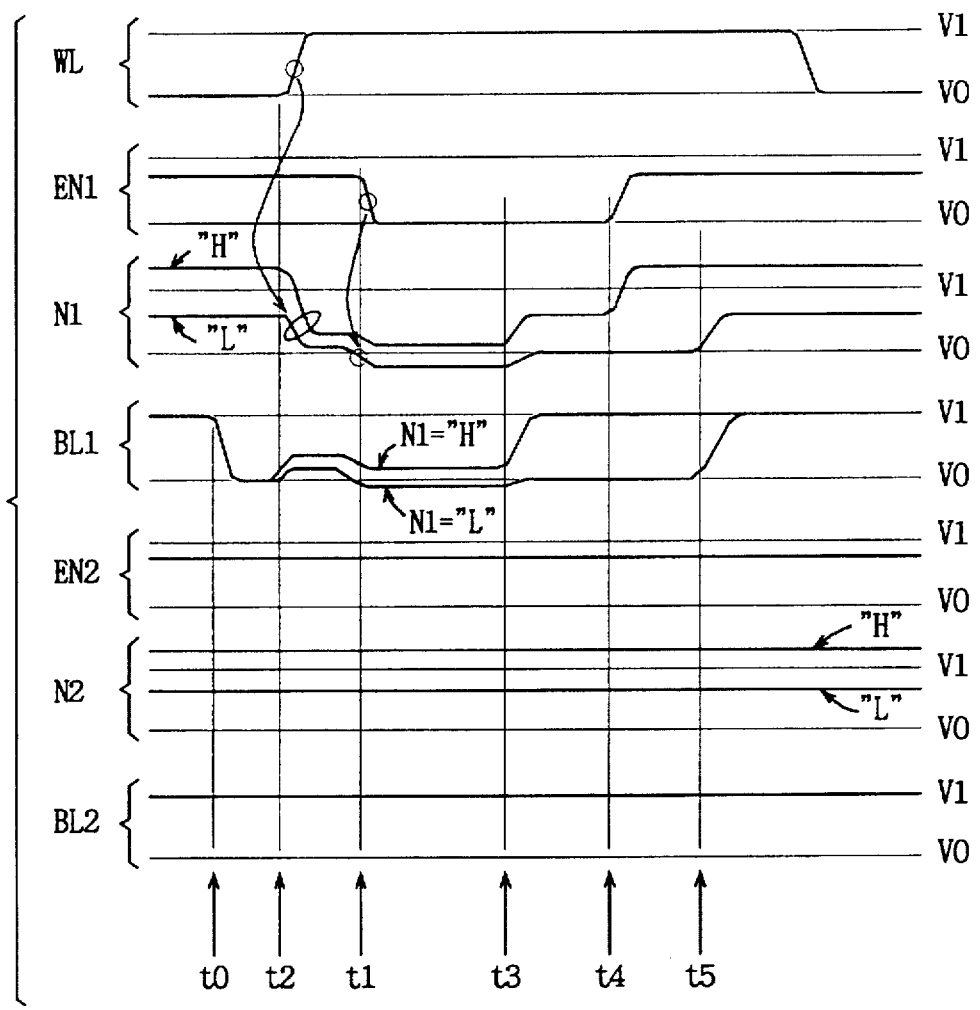
FIG. 5 is a timing chart showing waveforms of respective portions of a DRAM of a third embodiment.

FIG. 5 is a timing chart showing waveforms of respective portions of a DRAM of the third embodiment. Description for FIG. 5 will be given only on the operations different from those shown in FIGS. 3 and 4.

The operation shown in FIG. 5 is a modification of the operation of the second embodiment. In the operation, the potential of bit line BL1 lowers from potential V1 to potential V0 at time t0. Thereafter, the operations are controlled in the same manner as the second embodiment.

In this manner, bit line BL1 is set to a lower potential before the potential rising of word line WL. Therefore, transistor 1T can be turned on in response to rising of the potential of word line WL in both cases of correspondence to the storage data at the H-level and correspondence to the storage data at the L-level.

In this example, therefore, charges corresponding to the storage data at the H-level are read onto bit line BL1, so that amplification starting at time t3 can be performed easily.

In connection with FIG. 5, description has been given on the operations which are performed to lower the potential of bit line BL1 based on the operations in FIG. 4. Alternatively, the potential of bit line BL1 may be lowered based on the operations of the first embodiment in FIG. 3.

Further, the third embodiment can achieve an effect similar to those of the first and second embodiments. That is, a part of the multiple memory cells connected to the same word line can be set to the read and undestroyed state. Therefore, the bit lines can be operated selectively, and thus the power consumption can be reduced. Also, the raised potential of word line can be small. Further, in this third embodiment, the order of operations executed at times t4, t5 and t6 can be arbitrarily changed. Even in this case, the same or similar effect can be achieved.

Fourth Embodiment

A fourth embodiment will be described below. The following description of the fourth embodiment relates to an example in which transistors of memory cells 1 and 2 in the structure shown in FIG. 2 are replaced with P-channel MOS transistors.

Figure 6:
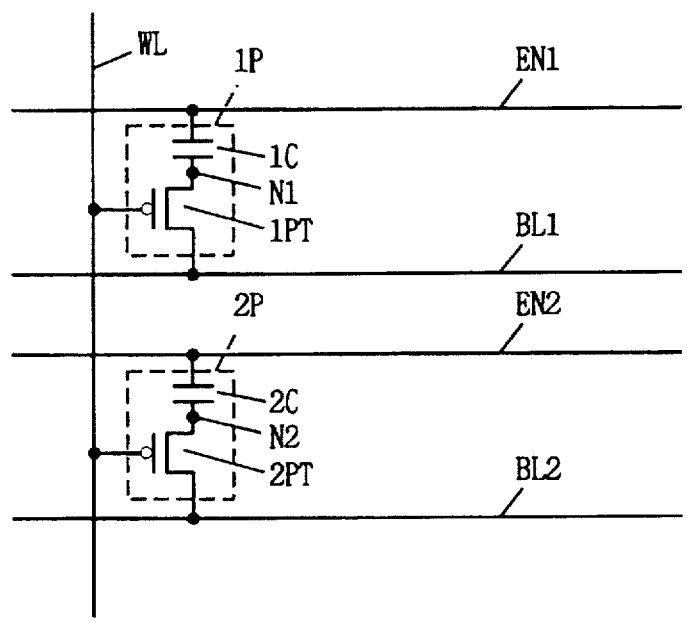
FIGS. 6 through 15 are circuit diagrams showing structures of major portions of DRAMs of 4th through 13th embodiments, respectively.

FIG. 6 is a circuit diagram showing a structure of a major portion of the DRAM of the fourth embodiment.

The structure in FIG. 6 differs from that in FIG. 2 in the following points. Memory cells 1 and 2 in the structure shown in FIG. 2 are replaced with memory cells 1P and 2P. Each of memory cells 1P and 2P differs from memory cell 1 or 2 in FIG. 2 in that the MOS transistor is a P-channel MOS transistor 1PT or 2PT.

In this structure, control is performed similarly to the embodiments 1–3, so that an effect similar to those by embodiments 1–3 can be achieved.

The replacement of the transistors with the P-channel MOS transistors described above can be applied also to memory cells in embodiments 5–12 which will be described below.

Fifth Embodiment

A fifth embodiment will be described below. The following description of the fifth embodiment relates to another example of a structure of a DRAM which can operate similarly to those in the embodiments 1-3.

Figure 7:
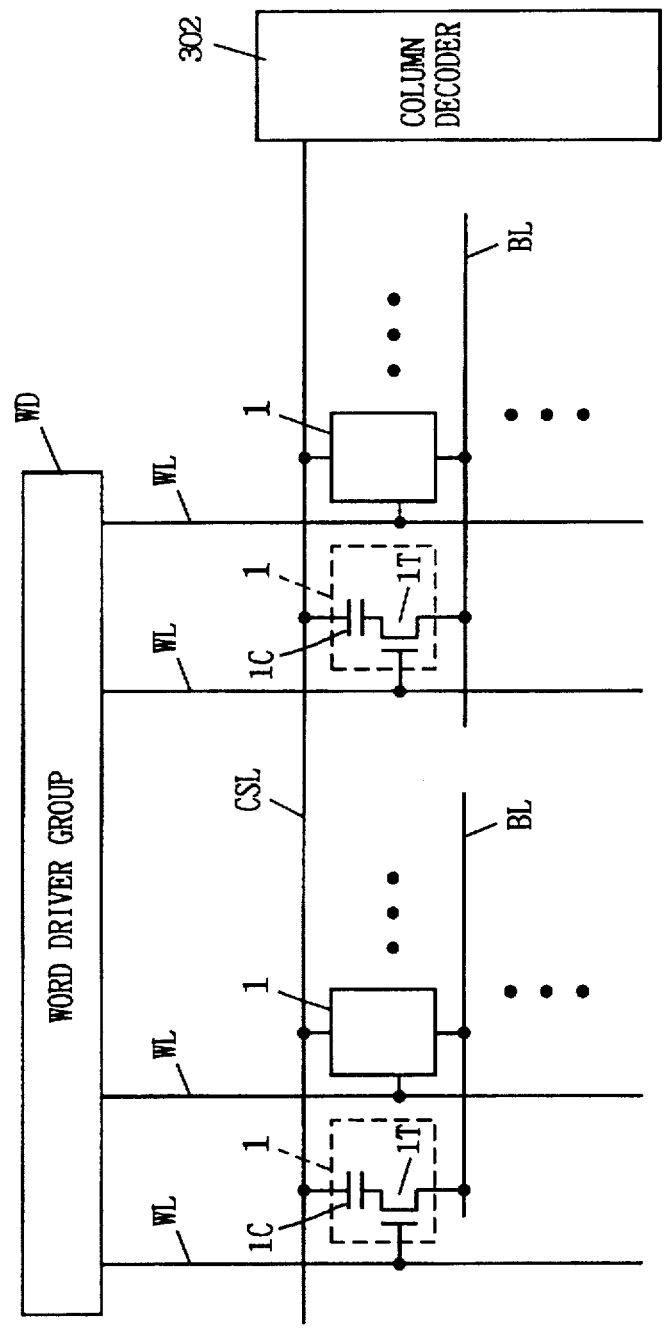

FIG. 7 is a circuit diagram showing a structure of a major portion of a DRAM of the fifth embodiment. In FIG. 7, the same portions as those in FIG. 2 bear the same reference numbers and will not be described below.

The structure in FIG. 7 differs from that in FIG. 2 in the following points. Instead of the electrode nodes, column select lines CSL are arranged. Column select lines CSL are selectively activated by a column decoder 302 to control their potentials. Bit line BL is divided into a plurality of portions. The length of column select line CSL is equal to or longer than double the length of one divided bit line BL.

A plurality of memory cells 1 are connected between one column select line CSL and one bit line BL. In each memory cell 1, capacitor 1C is connected to column select line CLS, and transistor 1T is connected to bit line BL. The plurality of memory cells 1 connected to one column select line CLS are connected to different word lines WL, respectively.

The plurality of word lines WL are selectively activated by a word driver group WD containing the plurality of word drivers corresponding to these word lines, respectively. According to this structure, memory cell 1 for data reading can be selected by selectively activating word line WL and selectively activating column select line CLS.

By controlling the potential of column select line CLS selected by column decoder 302 in the manner described in connection with the first through third embodiments, the operation can be performed similarly to those embodiments. Column select line CSL may be made of metal such as platinum (Pt). In this case, the upper electrode of capacitor 1C does not require a metal interconnection at the upper layer and a contact portion, so that the manufacturing process can be significantly simplified.

Sixth Embodiment

A sixth embodiment will be described below. The following description of the sixth embodiment relates to a modification of the fifth embodiment.

Figure 8:
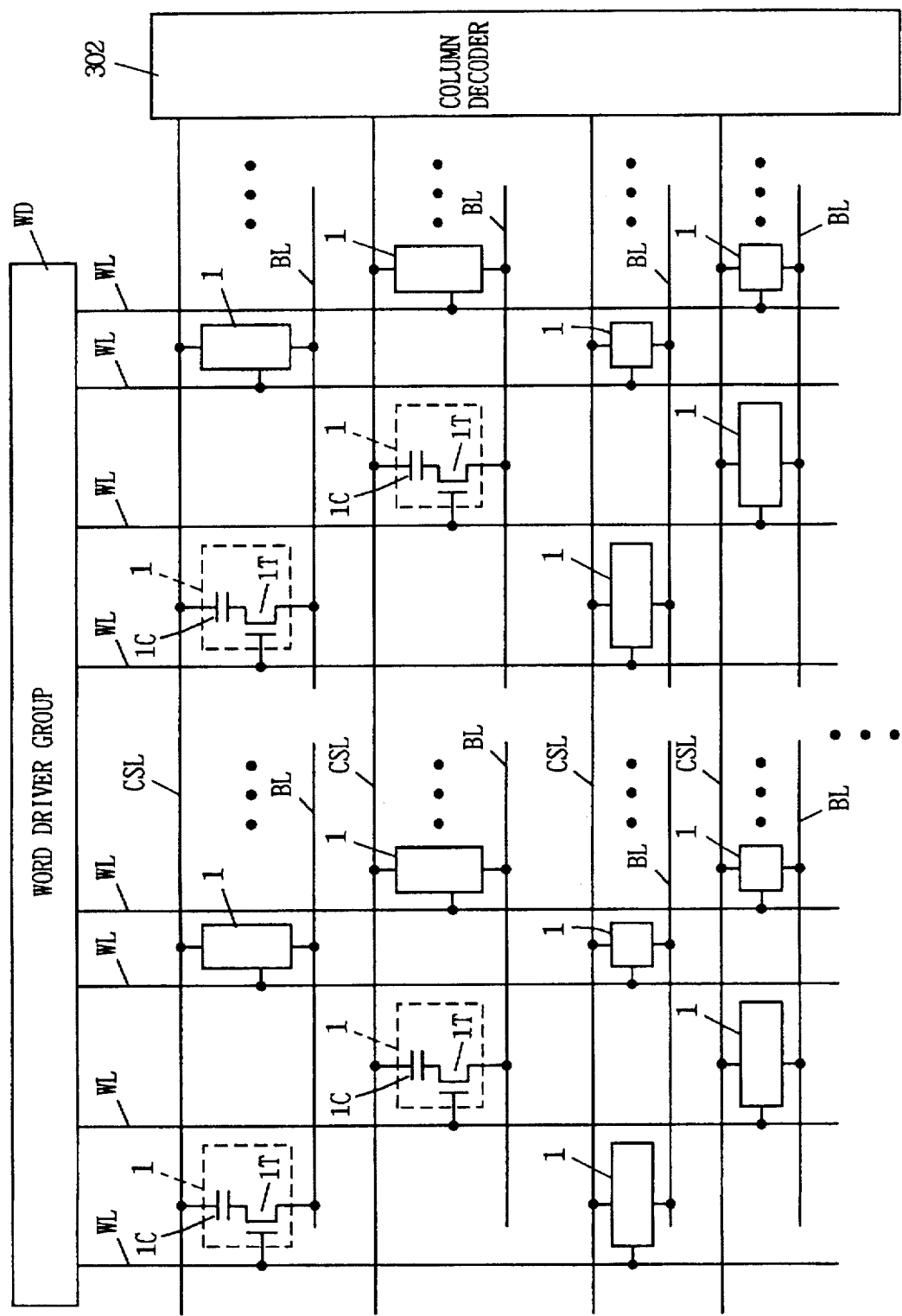

FIG. 8 is a circuit diagram showing a structure of a major portion of a DRAM of the sixth embodiment. In FIG. 8, portions similar to those in FIG. 7 bear the same reference numbers, and will not be described below.

The structure in FIG. 8 has such a distinctive structure that the plurality of memory cells 1 in one column and the plurality of memory cells 1 in the adjacent column are arranged alternately to each other, and all are connected to different word lines. In this structure, when one word line WL is activated, data is read only onto one of adjacent two bit lines BL. Therefore, when one word line WL is activated, data is read onto only parallel bit lines BL at alternate positions.

Since data is not read onto both the adjacent bit lines, bit line BL not supplied with data acts as a shield for canceling noises occurring between the plurality of bit lines BL supplied with data. Therefore, this structure can increase a sense margin in the operation of amplifying the potential of bit line BL.

Further, the sixth embodiment can achieve an effect similar to that achieved by the fifth embodiment.

Seventh Embodiment

A seventh embodiment will be described below. The following description of the seventh embodiment relates to an example in which the structure shown in FIG. 7 is additionally provided with column sub-decoders and column select sub-lines, and the memory cells are connected between the column select sub-lines and the bit lines.

Figure 9:
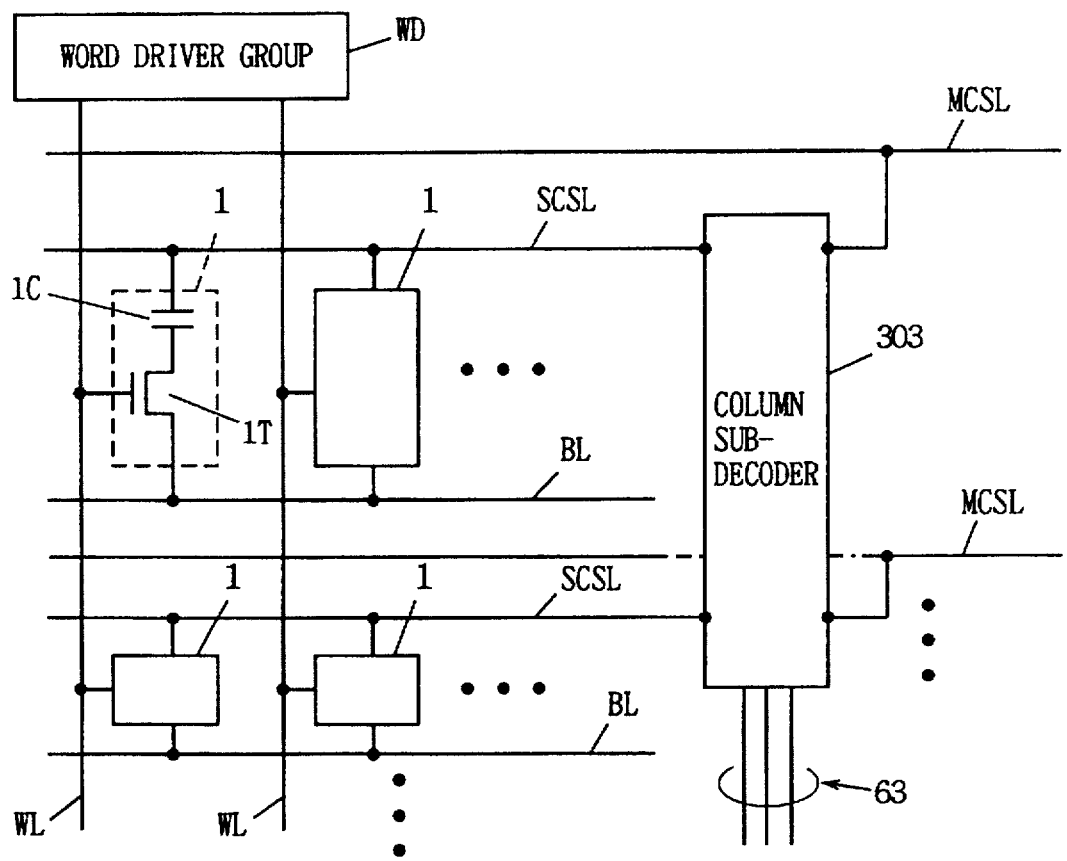

FIG. 9 is a circuit diagram showing a structure of a major portion of a DRAM of the seventh embodiment. The structure in FIG. 9 differs from that in FIG. 7 in the following point.

Column sub-decoders 303 are connected to main column select lines MCSL to be selectively activated by the column decoder (not shown). Each column sub-decoder 303 corresponds to a predetermined number of main column select lines MCSL.

Each column sub-decoder 303 is provided correspondingly to a predetermined number of rows and a predetermined number of columns. A plurality of column select sub-lines SCSL are connected to each column select sub-decoder 303. Further, a plurality of column decode lines 63 are connected to each column sub-decoder 303. A plurality of column select sub-lines SCSL are provided correspondingly to each main column select line MCSL.

Column select sub-lines SCSL are arranged parallel to bit lines BL. Each column select sub-line SCSL is provided correspondingly to one bit line BL. Each memory cell 1 is connected between corresponding bit line BL and column select sub-line SCSL. In this example, each memory cell 1 is connected at capacitor 1C to column select sub-line SCSL. The plurality of column select sub-lines SCSL connected t one column select sub-line 303 are selectively activated by column select sub-line 303.

In the operation, column select sub-line 303 selectively activates column select sub-line SCSL in response to activation of corresponding main column select line MCSL. Thereby, the selectively activated word line WL and the selectively activated column select sub-line SCSL select memory cell 1 from which data is to be read.

According to this structure, column sub-decoder 303 controls the potentials of column select sub-lines SCSL similarly to the electrode nodes shown in the first through third embodiments, whereby operation can be performed similarly to the first through third embodiments.

In this seventh embodiment, the plurality of column select sub-lines SCSL are provided correspondingly to one main column select line MCSL, and selection of the column is performed by the plurality of column sub-decoders 303 in a divided manner. Therefore, column select sub-line SCSL has a capacity smaller than that of column select line CLS shown in FIG. 7. Therefore, the DRAM in FIG. 7 can perform faster operations than the DRAM of the fifth embodiment.

Eighth Embodiment

An eighth embodiment will be described below. The following description of the eighth embodiment relates to a modification of the seventh embodiment.

Figure 10:
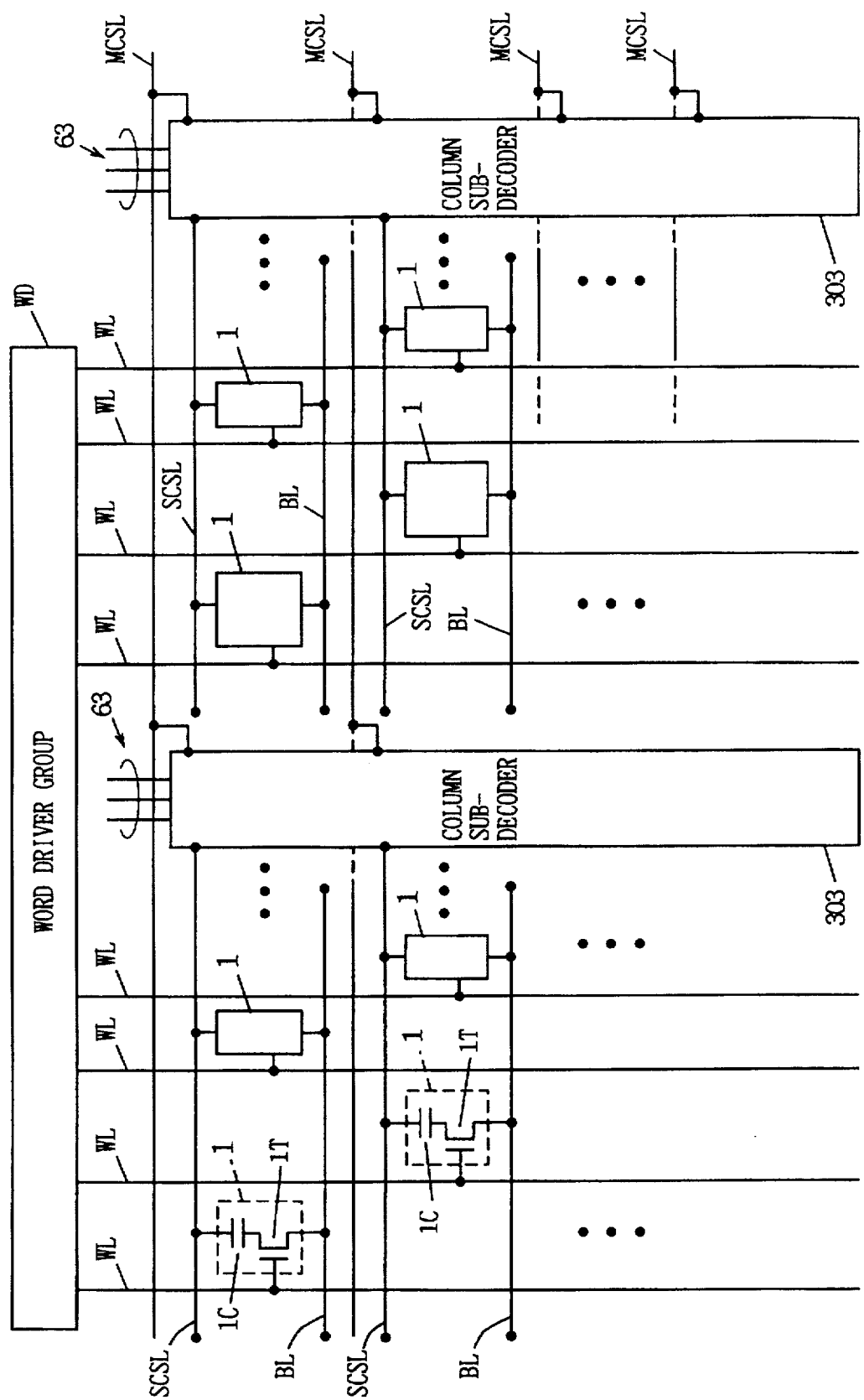

FIG. 10 is a circuit diagram showing a structure of a major portion of a DRAM of the eighth embodiment. In FIG. 10, portions similar to those in FIG. 9 bear the same reference numbers, and will not be described below.

The structure in FIG. 10 has such a distinctive portion that the plurality of memory cells 1 in one column and the plurality of memory cells 1 in the adjacent column are arranged alternately to each other, and all are connected to different word lines. Therefore, in the structure in FIG. 10, data are read onto alternate bit lines BL when one word line WL is activated, as is done in the sixth embodiment.

Therefore, bit line BL not supplied with read data and corresponding column select sub-line SCSL act as a shield for canceling noises occurring between the plurality of bit lines BL supplied with read data. This can increase a sense margin in the operation of amplifying the potential of bit line BL.

Ninth Embodiment

A ninth embodiment will be described below. The following description of the ninth embodiment relates to a modification of the fifth embodiment.

Figure 11:
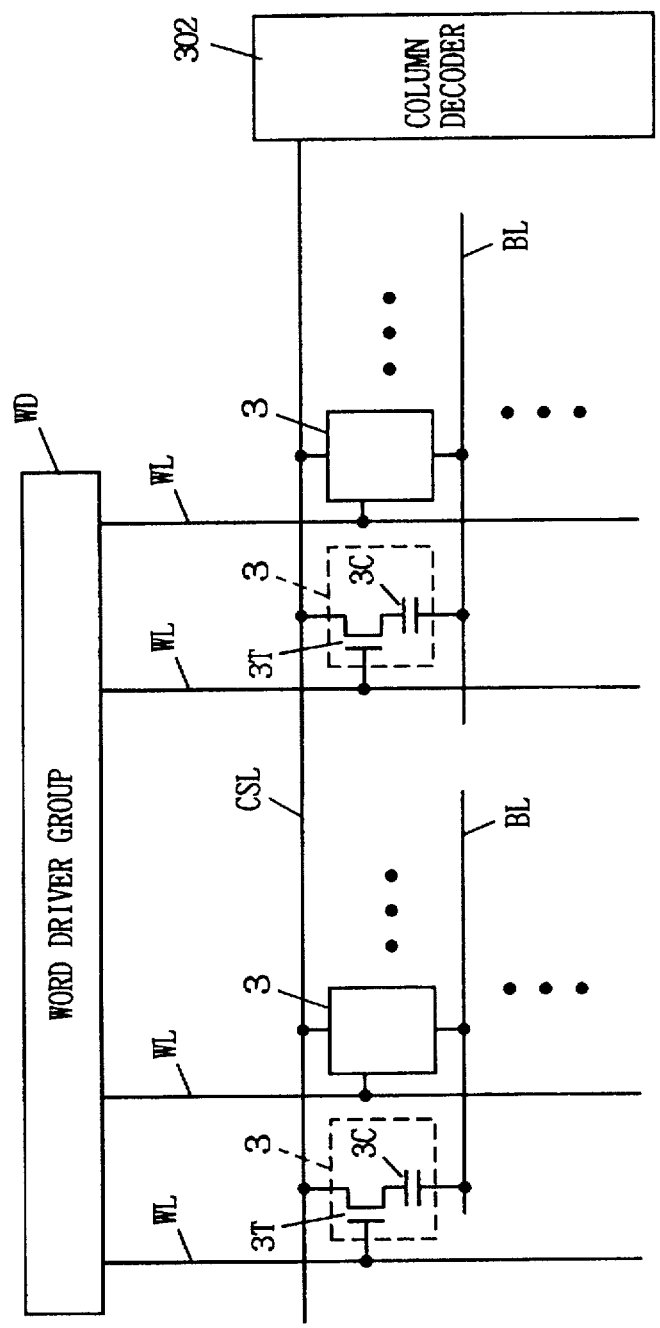

FIG. 11 is a circuit diagram showing a structure of a major portion of a DRAM of the ninth embodiment. In FIG. 11, portions similar to those in FIG. 7 bear the same reference numbers, and will not be described below.

The structure shown in FIG. 11 differs from that in FIG. 7 in the structure of each memory cell 3. Each memory cell 3 is connected at its capacitor 3C to bit line BL and is connected at its transistor 3T to column select line CLS in contrast to memory cell 1. Also in this structure, the operation can be performed similarly to the fifth embodiment, and thus an effect similar to that of the fifth embodiment can be achieved.

Tenth Embodiment

A tenth embodiment will be described below. The following description of the tenth embodiment relates to a modification of the sixth embodiment.

Figure 12:
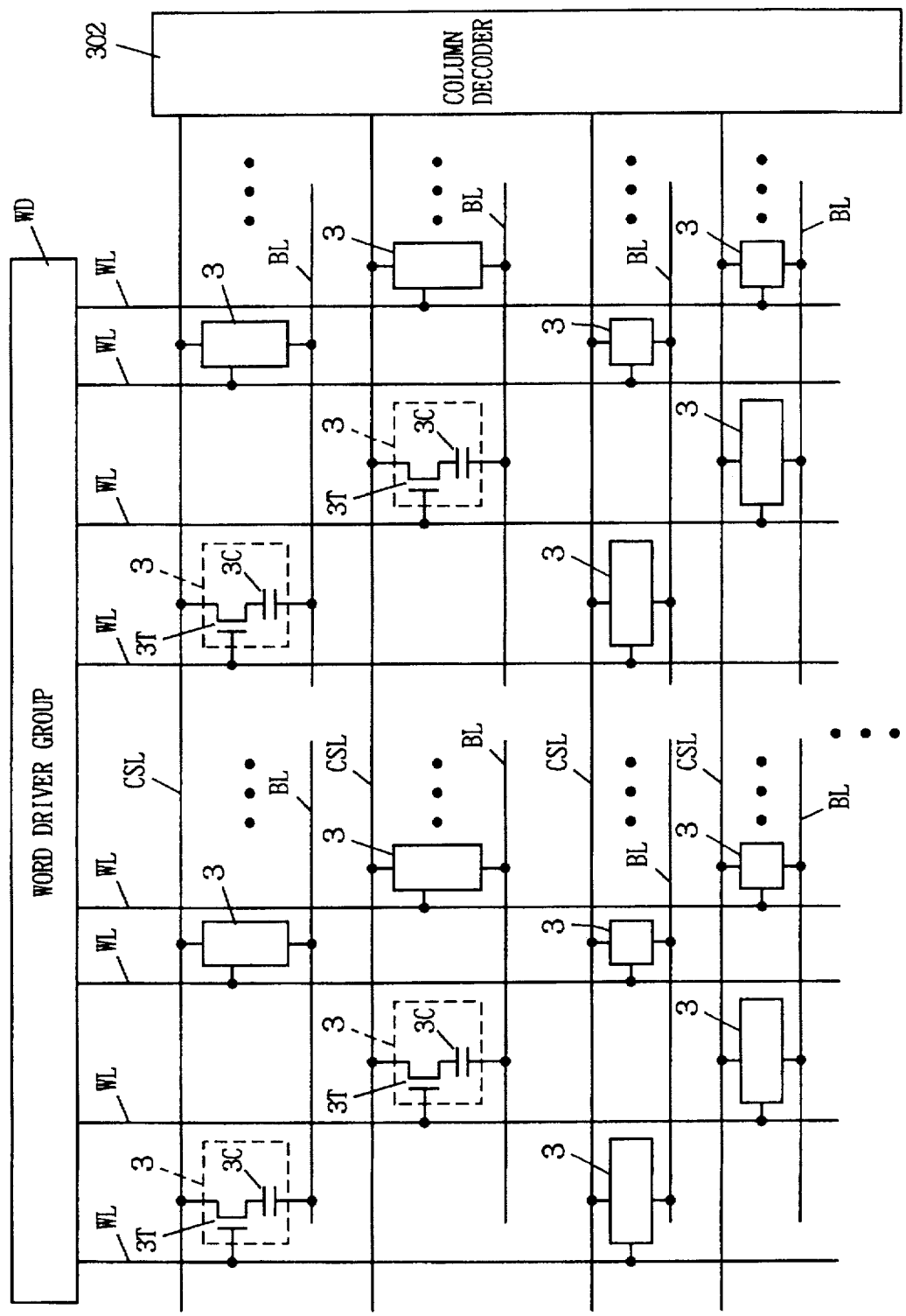

FIG. 12 is a circuit diagram showing a structure of a major portion of a DRAM of the tenth embodiment. In FIG. 12, portions similar to those in FIG. 8 bear the same reference numbers, and will not be described below.

The structure in FIG. 12 differs from that in FIG. 8 in a connection form of memory cells 3. Each memory cell 3 is connected at its capacitor 3C to bit line BL and is connected at its transistor 3T to column select line CLS in contrast to memory cell 1 in FIG. 8. Also in this structure, operation can be performed similarly to the sixth embodiment, and thus an effect similar to that of the sixth embodiment can be achieved.

Eleventh Embodiment

An eleventh embodiment will be described below. The following description of the eleventh embodiment relates to a modification of the seventh embodiment.

Figure 13:
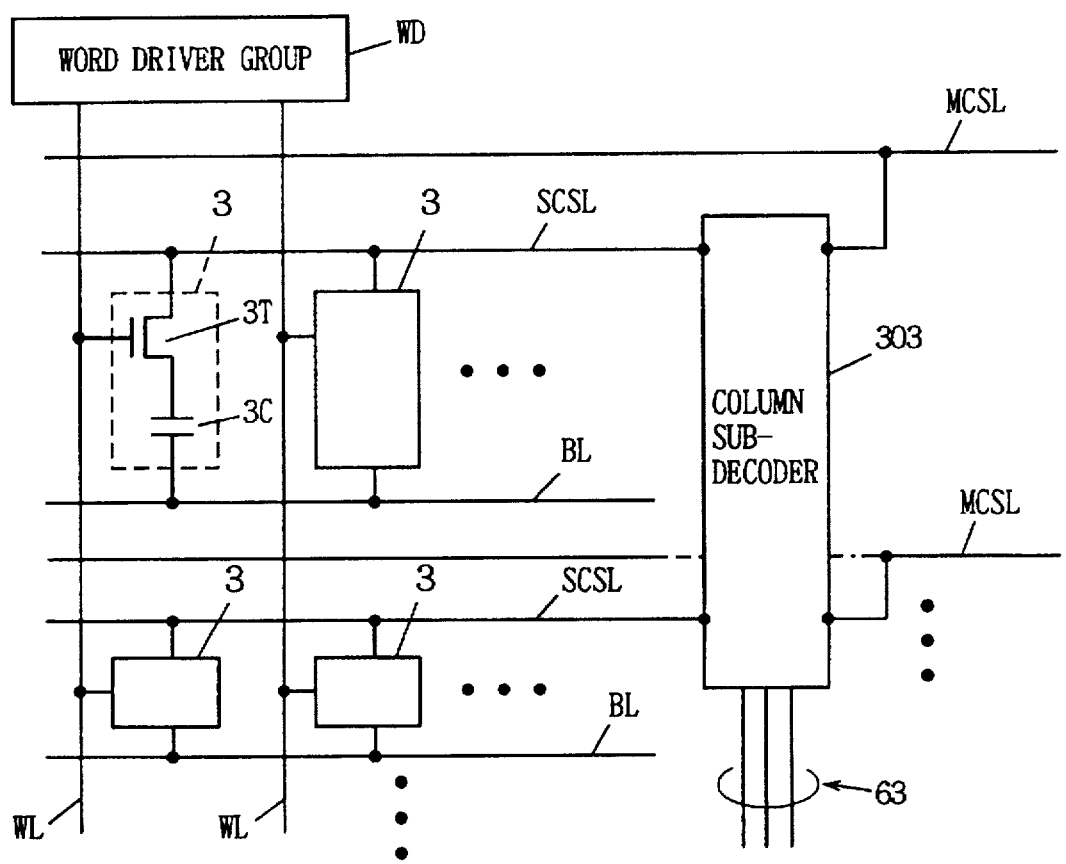

FIG. 13 is a circuit diagram showing a structure of a major portion of a DRAM of the eleventh embodiment. In FIG. 13, portions similar to those in FIG. 9 bear the same reference numbers, and will not be described below.

The structure in FIG. 13 differs from that in FIG. 9 in a connection form of memory cells 3. Each memory cell 3 is connected at its capacitor 3C to bit line BL and is connected at its transistor 3T to column select sub-line SCLS in contrast to memory cell 1 in FIG. 9. Also in this structure, operation can be performed similarly to the seventh embodiment. Consequently, an effect similar to that of the seventh embodiment can be achieved.

Twelfth Embodiment

An twelfth embodiment will be described below. The following description of the twelfth embodiment relates to a modification of the eighth embodiment.

Figure 14:
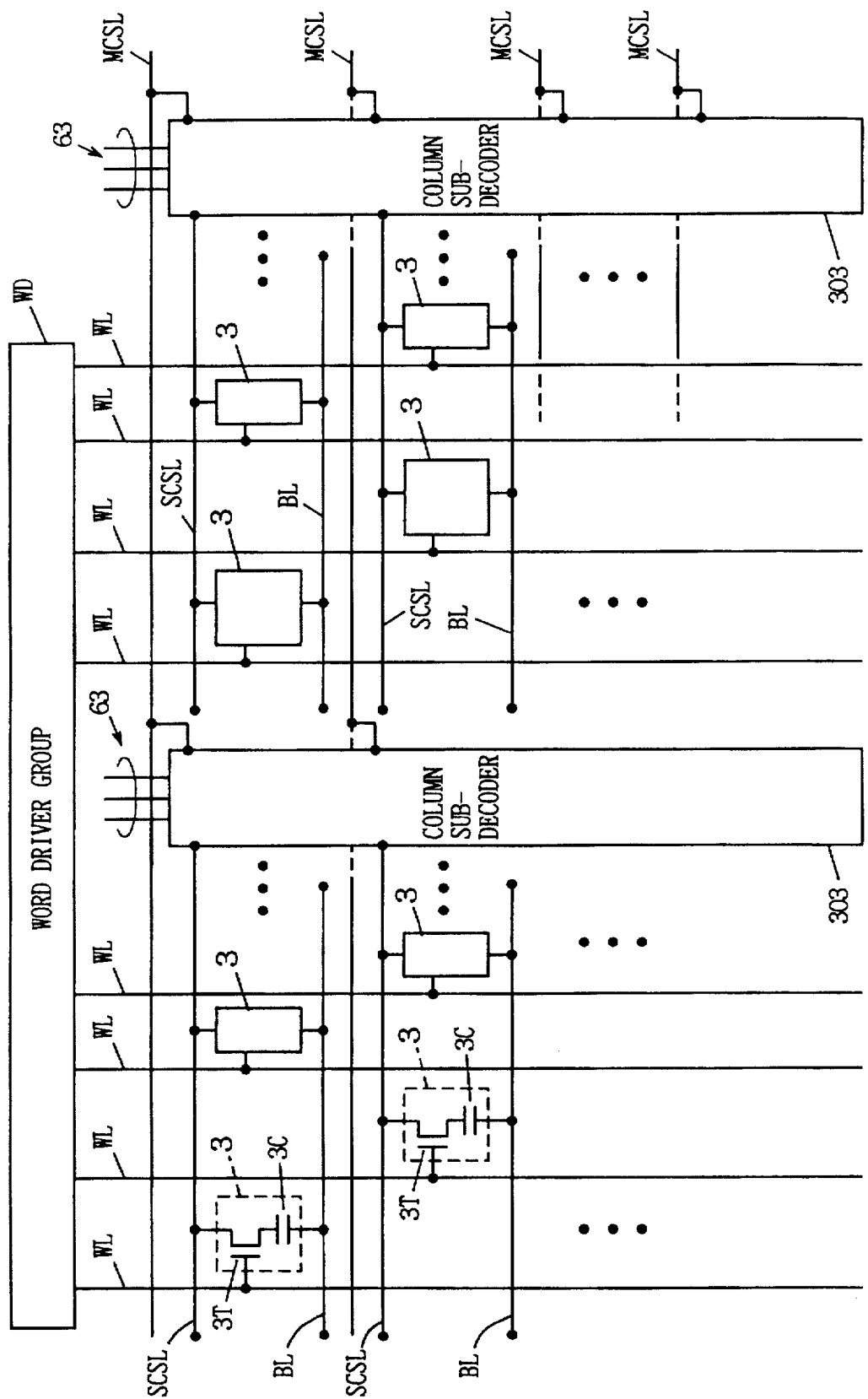

FIG. 14 is a circuit diagram showing a structure of a major portion of a DRAM of the twelfth embodiment. In FIG. 14, portions similar to those in FIG. 10 bear the same reference numbers, and will not be described below.

The structure in FIG. 14 differs from that in FIG. 10 in a connection form of memory cells 3. Each memory cell 3 is connected at its capacitor 3C to bit line BL and is connected at its transistor 3T to column select sub-line SCLS in contrast to memory cell 1 in FIG. 10. Also in this structure, operation can be performed similarly to the eighth embodiment. Consequently, an effect similar to that of the eighth embodiment can be achieved.

Thirteenth Embodiment

A thirteenth embodiment will be described below. The following description of the thirteenth embodiment relates to an example, in which a memory cell is connected between a bit line and an inverted bit line paired with each other, and data read onto the bit line pair is amplified by a sense amplifier.

Figure 15:
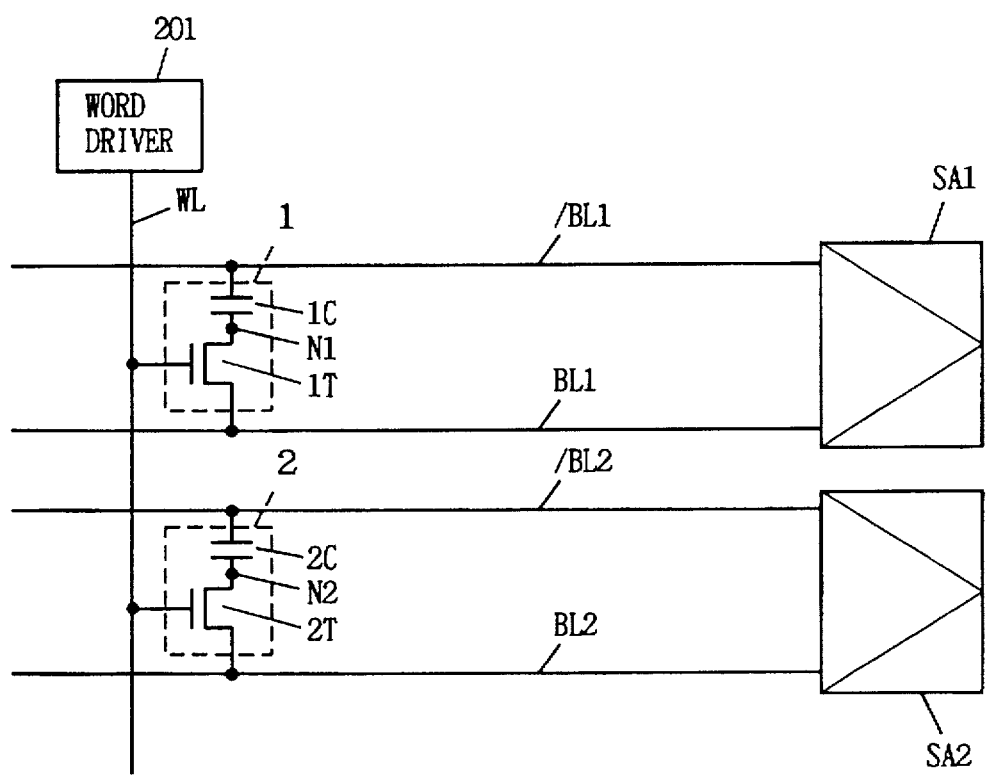

FIG. 15 is a circuit diagram showing a structure of a major portion of a DRAM of the thirteenth embodiment. In FIG. 15, portions similar to those in FIG. 2 bear the same reference numbers, and will not be described below.

The structure in FIG. 15 differs from that in FIG. 2 in the following point. Instead of electrode nodes EN1 and EN2, there are provided inverted bit lines /BL1 and /BL2, respectively. Bit line BL1 and inverted bit line /BL1 form the bit line pair, and bit line BL2 and inverted bit line /BL2 also form the bit line pair.

Further, bit line pair BL1 and /BL1 are connected to sense amplifier SA1. Bit line pair BL2 and /BL2 are connected to sense amplifier SA2. Each of sense amplifiers SA1 and SA2 senses and amplifies the potential difference of the corresponding bit line pair.

Figure 16:
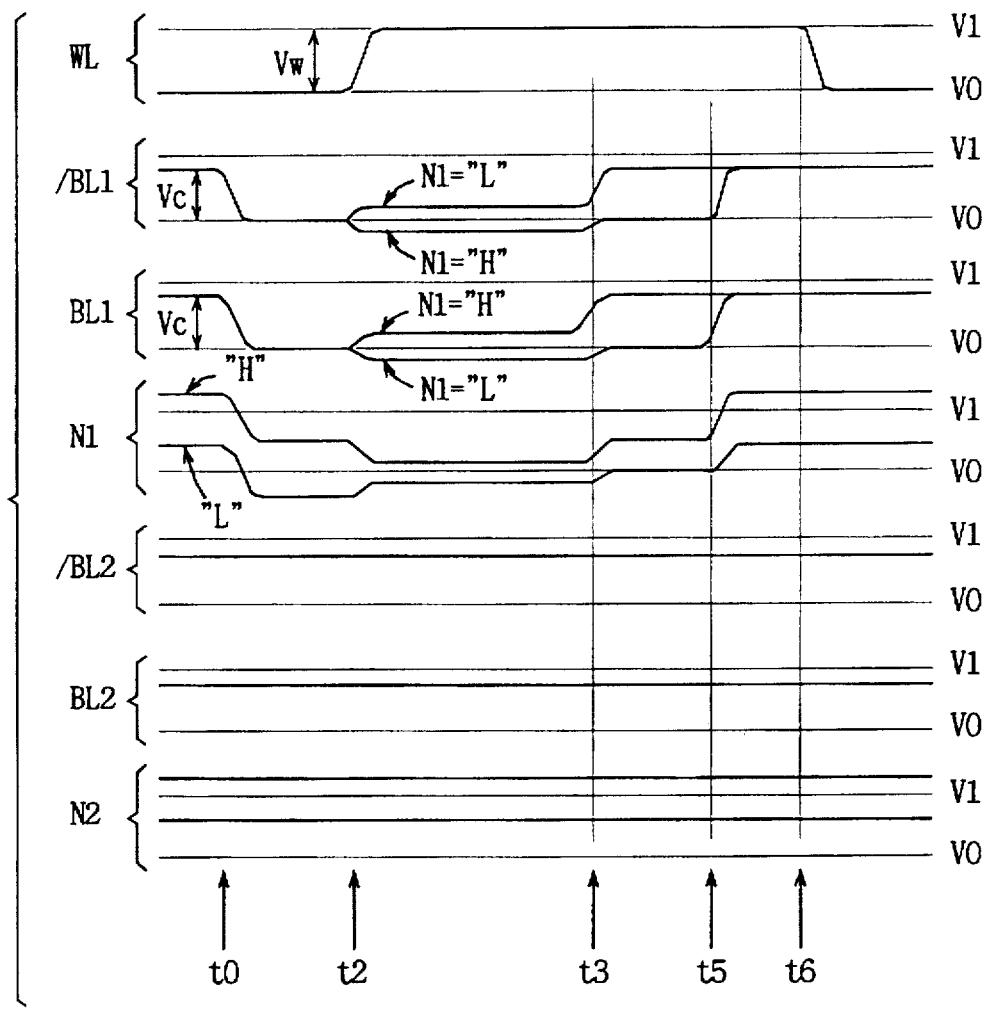
FIG. 16 is a timing chart showing waveforms of respective portions of the DRAM in FIG. 15.

Then, operation of the DRAM in FIG. 15 will be described below. FIG. 16 is a timing chart showing operation waveforms of respective portions of the DRAM in FIG. 15. In FIG. 16, there are shown operation waveforms of word line WL, inverted bit line /BL1, bit line BL1, storage node N1, inverted bit line /BL2, bit line BL2 and storage node N2.

The following description is given based on the following definition. A voltage Vb is an amplitude voltage of bit lines BL1 and BL2 and inverted bit lines /BL1 and /BL2. The potential of each of storage nodes N1 and N2 holds the level of Vw−Vth+Vb if it corresponds to storage data at the H-level, and holds the level of Vw−Vth if it corresponds to storage data at the L-level.

In the initial state, both the potentials of bit line BL1 and inverted bit line /BL1 are at the level of potential V1. These potentials may be at the level other than that of potential V1 provided that they satisfy the condition of Vb≧Vw−Vth. Further, the potentials of bit line BL2 and inverted bit line /BL2 are at the level of potential V1. These potentials may be floated or fixed.

At time t0, the potentials of bit line BL1 and inverted bit line /BL1 are lowered by lowered voltage Vc. Thereby, these potentials are set to the level of V0. The potentials may be lower to the level other than V0 provided that at least the condition of Vb<Vw−Vth is satisfied.

In response to the above lowering, potential Vs of storage node N1 is lowered by voltage Vc owing to coupling of capacitor 1C. As a result, potential Vs of storage node N1 attains the level of Vw−Vth if it corresponds to storage data at the H-level, and attains the level of Vw−Vth−Vb if it corresponds to storage data at the L-level.

At time t2, the potential of word line WL is raised by raised voltage Vw. Thereby, the potential of word line WL rises from V0 to V1. In this case, the potential of bit line BL1 is at the level not higher than Vw−Vth. Therefore, transistor 1T is turned on in both the cases that storage node N1 is at the level corresponding to storage data at the L-level and that it is at the level corresponding to storage data at the H-level.

In this case, therefore, bit line BL1 attains the following level. When storage node N1 is at the level corresponding to storage data at the H-level, the potential of bit line BL1 goes to Vb+ΔVH. When storage node N1 is at the level corresponding to storage data at the L-level, the potential of bit line BL1 goes to Vb−ΔVL.

Here, ΔVH represents a read potential difference with respect to bit line BL1 which occurs in the case of correspondence to storage data at the H-level. ΔVL represents a read potential difference with respect to bit line BL1 which occurs in the case of correspondence to storage data at the L-level.

In the above case, inverted bit line /BL1 attains the following potential level. When storage node N1 is at the level corresponding to storage data at the L-level, the potential of inverted bit line /BL1 goes to Vb+ΔVH. When storage node N1 is at the level corresponding to storage data at the H-level, the potential of inverted bit line /BL1 goes to Vb−ΔVL.

Meanwhile, the potential of storage node N2 is equal to or higher than Vw−Vth in both the cases of correspondence to storage data at the L-level and correspondence to storage data at the H-level. Therefore, transistor 2T maintains the off state even when the potential of word line WL is raised.

Therefore, when the potential of word line WL is raised as a result of the above operation, storage data in memory cell 1 is destroyed and electric charges corresponding to the data are read onto bit line BL1 and inverted bit line /BL. Meanwhile, memory cell 2 holds the storage data, and electric charges corresponding to the storage data are not read onto bit line BL2 and inverted bit line /BL2.

The thirteenth embodiment significantly differs from the first through third embodiments in the magnitude of potential difference occurring between bit line BL1 and inverted bit line /BL1. In this embodiment, potential difference ΔV is equal to ΔVH+ΔVL. Therefore, the thirteenth embodiment can obtain potential difference ΔV which is approximately twice as large as that in the first through third embodiments.

At time t3, sense amplifier SA1 amplifies the potential difference occurring at bit line pair BL1 and /BL1. Thereby, in the case of correspondence to the storage data at the L-level, both the potentials of bit line BL1 and storage node N1 attain the level of V0, and the potential of inverted bit line /BL1 attains the level of V1.

Meanwhile, in the case of correspondence to the storage data at the H-level, the potential of bit line BL1 attains the level of V1, potential Vs of storage node N1 goes to (Vw−Vth), and the potential of inverted bit line /BL attains the level of V0. Since charges are not read from memory cell 2 onto bit line pair BL2 and /BL2, sense amplifier SA2 does not perform amplification.

At time t5, the potentials of bit line BL1 and inverted bit line /BL1 are restored to the level of V1 (the potential of one of bit line BL1 and inverted bit line /BL is raised by amplitude voltage Vb).

In response to this, potential Vs of storage node N1 attains the following level. In the case of correspondence to storage data at the H-level, it is affected by coupling of inverted bit line /BL1 via capacitor 1C, so that potential Vs goes to Vw−Vth+Vb. In the case of correspondence to storage data at the L-level, potential Vs is charged to Vw−Vth via transistor 1T.

At time t6, the potential of word line WL is restored to the level of V0. Thereby, a series of operations for reading are completed.

Writing is performed similarly to the above operations except for that write data is applied to bit line BL1 and inverted bit line /BL1 before restoring bit line BL and inverted bit line /BL to the level of V1 at time t5.

By selectively operating the bit line pairs in this manner, the thirteenth embodiment can reduce power consumption. The thirteenth embodiment can also set a part (or all) of the multiple memory cells connected to the same word line to the read and undestroyed state. Further, the thirteenth embodiment can produce at the bit line pair the potential difference which is approximately twice as large as that in the conventional DRAM. Therefore, the sense operation can be performed stably. Since data reading is performed by controlling the potentials of bit line pair, the raised voltage of word line can be small.

In this thirteenth embodiment, the order of the operations at times t1 and time t2 can be changed. More specifically, the potentials of bit line BL and inverted bit line /BL may be lowered after raising the potential of word line WL. Also in this case, an effect similar to that already described can be obtained.

The operation at time t5 may be executed after the operation at time t6. Also in this case, an effect similar to those already described can be obtained.

Figure 17:
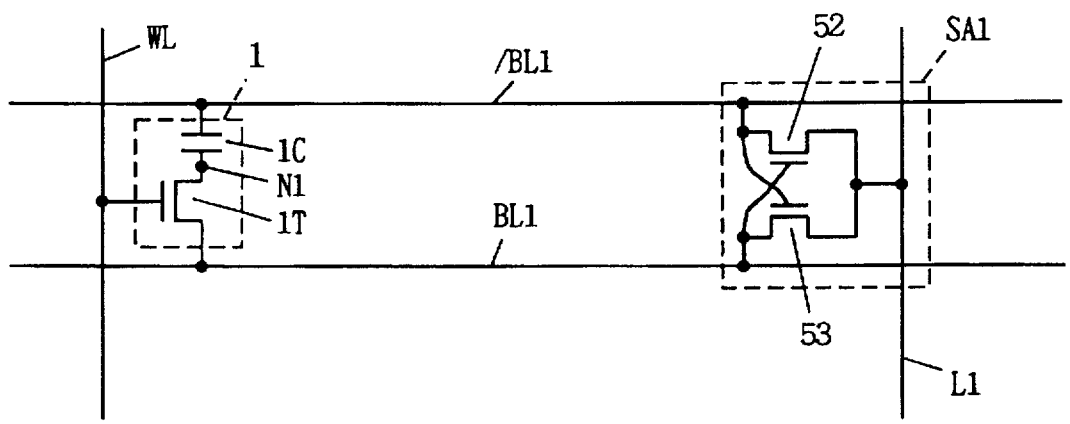
FIG. 17 is a circuit diagram showing a structure of a sense amplifier used in the DRAM in FIG. 15.

Description will now be given on a structure of a sense amplifier allowing execution of the operation of the thirteenth embodiment. FIG. 17 is a circuit diagram showing a sense amplifier used in the DRAM in FIG. 15.

FIG. 17 shows an example of sense amplifier SA1. Sense amplifier SA1 includes N-channel MOS transistors 52 and 53. A sense amplifier activating line L1 is arranged to cross bit line BL and inverted bit line /BL.

Transistor 52 is connected between inverted bit line /BL1 and sense amplifier activating line L1. Transistor 52 is connected at its gate electrode to bit line BL1. Transistor 53 is connected between bit line BL1 and sense amplifier activating line L1. Transistor 53 is connected at its gate electrode to inverted bit line /BL1.

When sense amplifier activating line L1 is activated, sense amplifier SA1 is activated. In the case where bit line pair BL1 and /BL1 has been equalized, the potentials of bit line pair BL1 and /BL1 are lowered when the potential of sense amplifier activating line L1 is lowered. When a potential difference occurs at bit line pair BL1 and /BL1, the potential difference is amplified.

Fourteenth Embodiment

Figure 18:
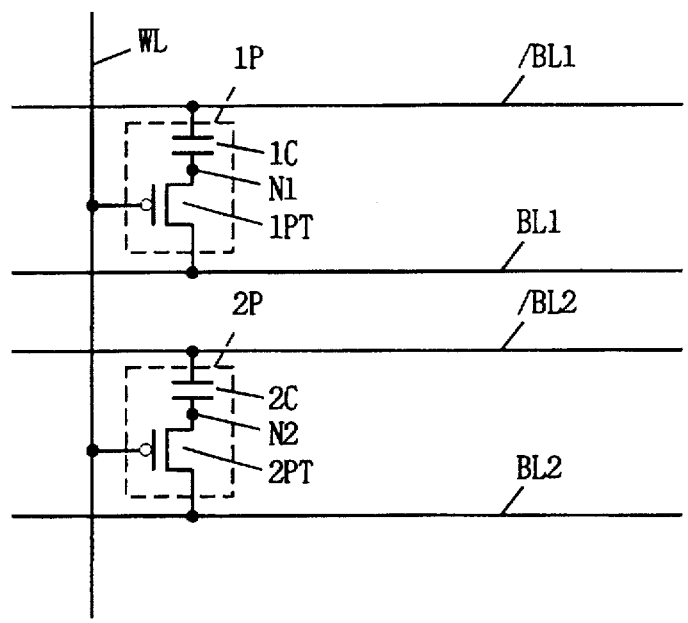
FIG. 18 is a circuit diagram showing a structure of a major portion of a DRAM of a 14th embodiment.

A fourteenth embodiment will be described below. The following description of the fourteenth embodiment relates to a modification of a structure of the thirteenth embodiment. FIG. 18 is a circuit diagram showing a structure of a major portion of a DRAM of the fourteenth embodiment. In FIG. 18, portions similar to those in FIG. 15 bear the same reference numbers, and will not be described below.

The structure in FIG. 18 differs from that in FIG. 15 in a structure of a memory cell. A memory cell 1P in FIG. 18 has a P-channel MOS transistor 1PT instead of N-channel MOS transistor in FIG. 15. Similarly, memory cell 2P has a P-channel MOS transistor 2PT. This structure can operate similarly to the thirteenth embodiment. As a result, it can achieve an effect similar to that of the thirteenth embodiment.

This replacement with the P-channel MOS transistor can be applied to memory cells of fifteenth through twenty-sixth embodiments to be described later.

Figure 19:
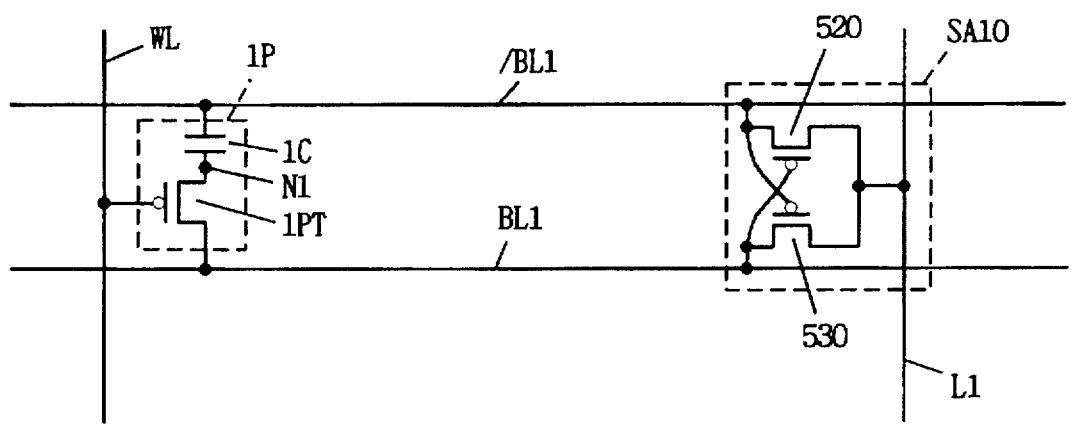
FIG. 19 is a circuit diagram showing a structure of a sense amplifier used in the DRAM in FIG. 18.

An example of the sense amplifier applied to the structure in FIG. 18 will be described below. FIG. 19 is a circuit diagram showing a structure of the sense amplifier used in the DRAM in FIG. 18. In FIG. 19, portions similar to those in FIG. 17 bear the same reference numbers, and will not be described below.

FIG. 19 shows an example of a sense amplifier SA10 corresponding to bit line pair BL1 and /BL1 connected to memory cell 1P. Sense amplifier SA10 includes P-channel MOS transistors 520 and 530.

Transistor 520 is connected between inverted bit line /BL and sense amplifier activating line L1. Transistor 520 is connected at its gate to bit line BL1.

Transistor 530 is connected between bit line BL1 and sense amplifier activating line L1. Transistor 530 is connected at its gate electrode to bit inverted line /BL1.

Owing to employment of sense amplifier SA10 thus constructed, this fourteenth embodiment can operate similarly to the thirteenth embodiment.

Fifteenth Embodiment

A fifteenth embodiment will be described below. The following description of the fifteenth embodiment relates to an example which is based on the structure of the fourteenth embodiment, and can provide the bit line and the inverted bit line having an equal capacity.

Figure 20:
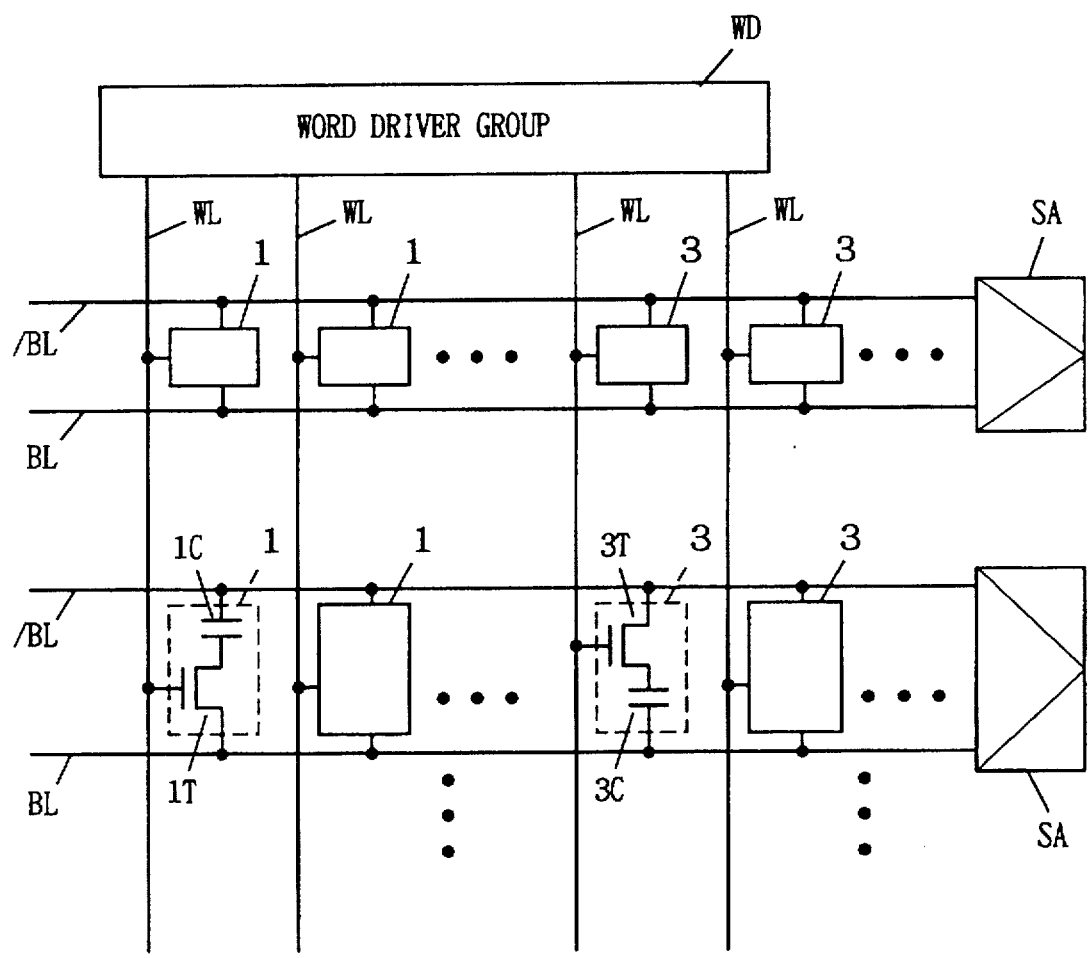
FIGS. 20 through 23 are circuit diagrams showing structures of major portions of DRAMs of 15th through 18th embodiments, respectively.

FIG. 20 is a circuit diagram showing a structure of a major portion of a DRAM of the fifteenth embodiment. In the DRAM in FIG. 20, word driver group WD selectively activates a plurality of word lines WL. A plurality of sense amplifiers SA are provided correspondingly to a plurality of bit line pairs BL and /BL, respectively.

This DRAM has such a distinctive feature that a plurality of memory cells 1 and a plurality of memory cells 3 having different connection forms are connected to each bit line pair BL and /BL. Memory cells 1 are equal in number to memory cells 3.

Each memory cell 1 includes transistor 1T and capacitor 1C, and is connected at its transistor 1T to bit line BL and at its capacitor 1C to inverted bit line /BL. Each memory cell 3 includes transistor 3T and capacitor 3C, and is connected at its transistor 3T to inverted bit line /BL and at its capacitor 3C to bit line BL.

Since memory cells 1 and 3 which are equal in number and having different connection forms are connected to each bit line pair BL and /BL, capacity balance is kept between respective bit line pairs BL and /BL. As a result, a sense margin of each sense amplifier SA can be increased.

Sixteenth Embodiment

A sixteenth embodiment will now be described below. The following description of the sixteenth embodiment relates to an example providing a bit line and an inverted bit line having an equal capacity, similarly to the fifteenth embodiment.

Figure 21:
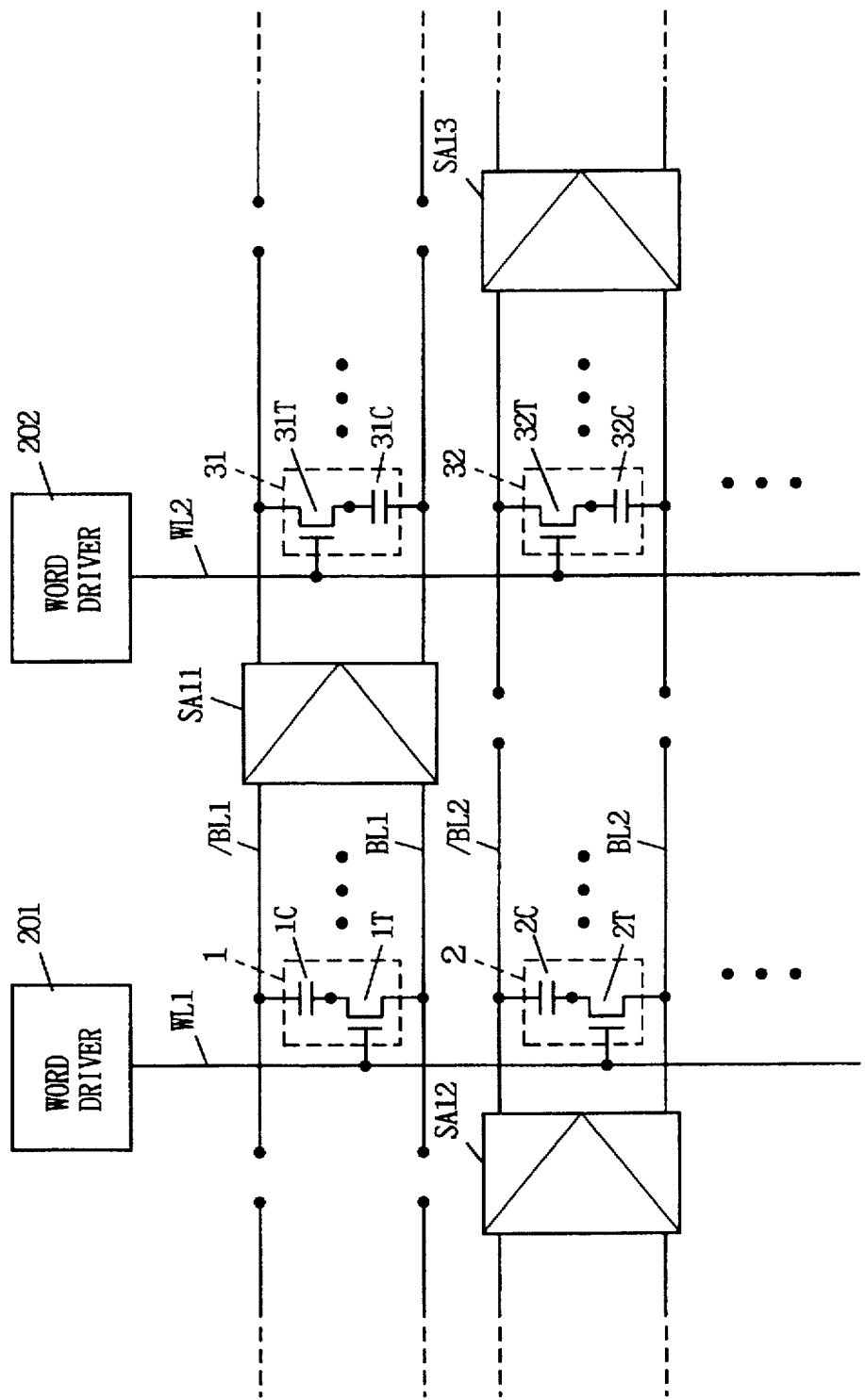

FIG. 21 is a circuit diagram showing a structure of a major portion of a DRAM of the sixteenth embodiment. In the DRAM of FIG. 21, word drivers 201, 202, . . . provided correspondingly to word lines WL1, WL2, . . . see selectively activate the word lines, respectively. A plurality of sense amplifiers SA11 are provided correspondingly to the plurality of bit line pairs BL1 and /BL1.

Each sense amplifier is disposed at a longitudinally middle portion of the corresponding bit line pair. The memory cell connected to the bit line pair at one side of each sense amplifier connected thereto has a connection form different from that of the memory cell connected to the bit line pair at the other side of the same sense amplifier.

More specifically, in connection with bit line pair BL1 and /BL1 to be discussed merely as an example, memory cell 1 disposed at one side of sense amplifier SA11 has capacitor 1C connected to inverted bit line /BL1 and transistor 1T connected to bit line BL1. Memory cell 31 disposed at the other side of sense amplifier SA11 has a transistor 31T connected to inverted bit line /BL1 and a capacitor 31C connected to bit line BL1.

Sense amplifiers SA11, . . . in one column and sense amplifiers SA12 and SA13, . . . in an adjacent column are disposed alternately. This can ease restrictions on a layout pitch of the sense amplifiers.

Seventeenth Embodiment

A seventeenth embodiment will be described below. The following description of the seventeenth embodiment relates to an example, which is based on the structure of the fifteenth embodiment, and has such a feature that the bit line and the inverted bit line have an equal capacity and an unoperating bit line pair acts as a shield against noises.

Figure 22:
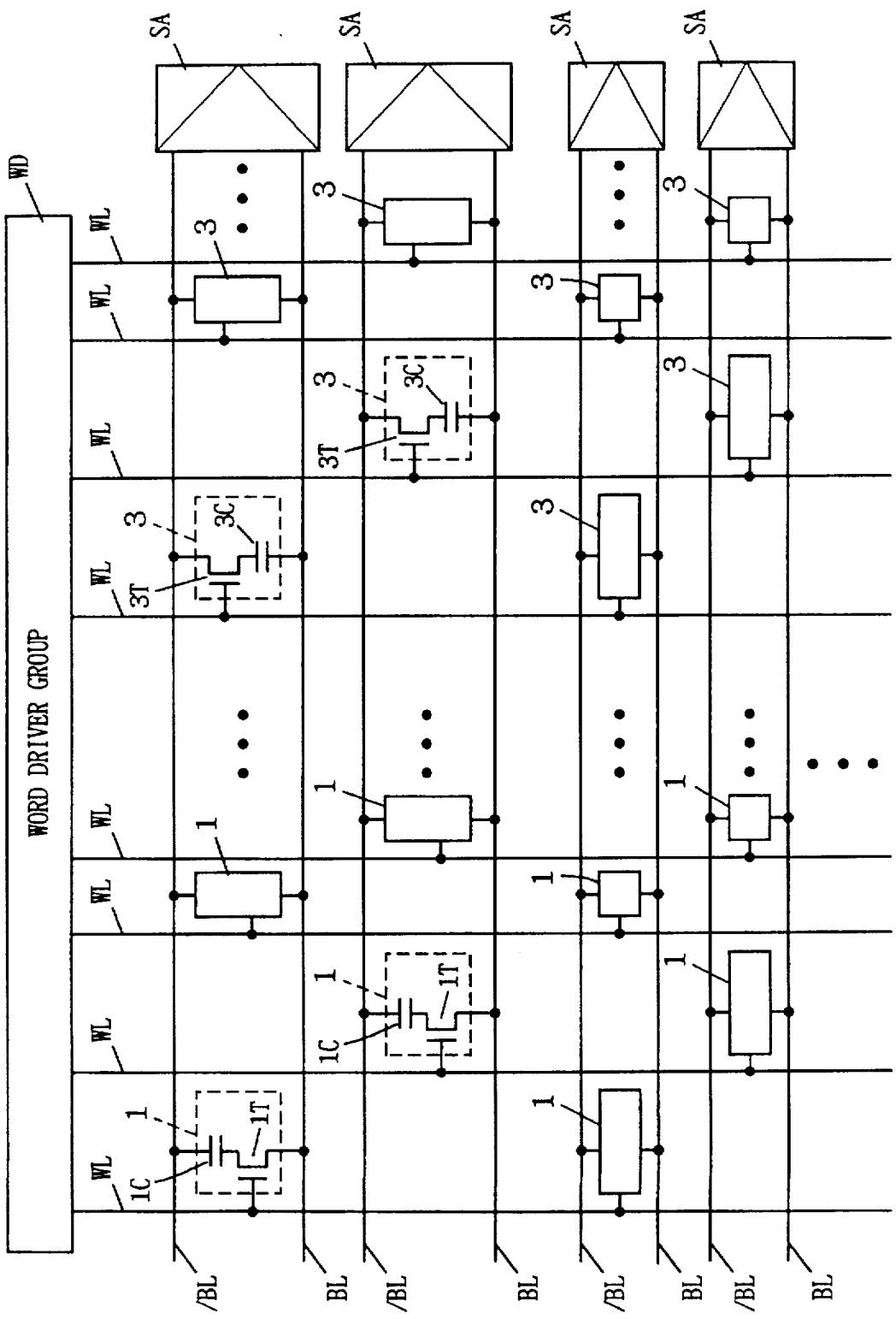

FIG. 22 is a circuit diagram showing a structure of a major portion of a DRAM of the seventeenth embodiment. In FIG. 22, portions similar to those in FIG. 20 bear the same reference numbers, and will not be described below.

Referring to FIG. 22, word driver group WD selectively activates the plurality of word lines WL. The plurality of sense amplifiers SA are provided correspondingly to the plurality of bit line pairs BL and /BL, respectively.

The DRAM has such a distinctive structure that the memory cells connected to one of the adjacent two bit line pairs are connected word lines WL different from those to which the memory cells connected to the other of the adjacent two bit line pairs are connected. Therefore, when one of word lines WL is activated, data is read onto the bit line pairs at alternate positions.

Therefore, the bit line pairs onto which data is not read act as a shield against noises generated from the bit line pairs onto which data is read. Therefore, by keeping the capacity balance between the bit line pairs, a sense margin can be increased, as can be done in the fifteenth embodiment, and further a sense margin of the sense amplifier can be increased.

Eighteenth Embodiment

An eighteenth embodiment will be described below. The following description of the eighteenth embodiment relates to an example in which data is read only from the selected bit line pair, and the potential difference of the bit line pair is amplified simultaneously with activation of the potential of the word line.

Figure 23:
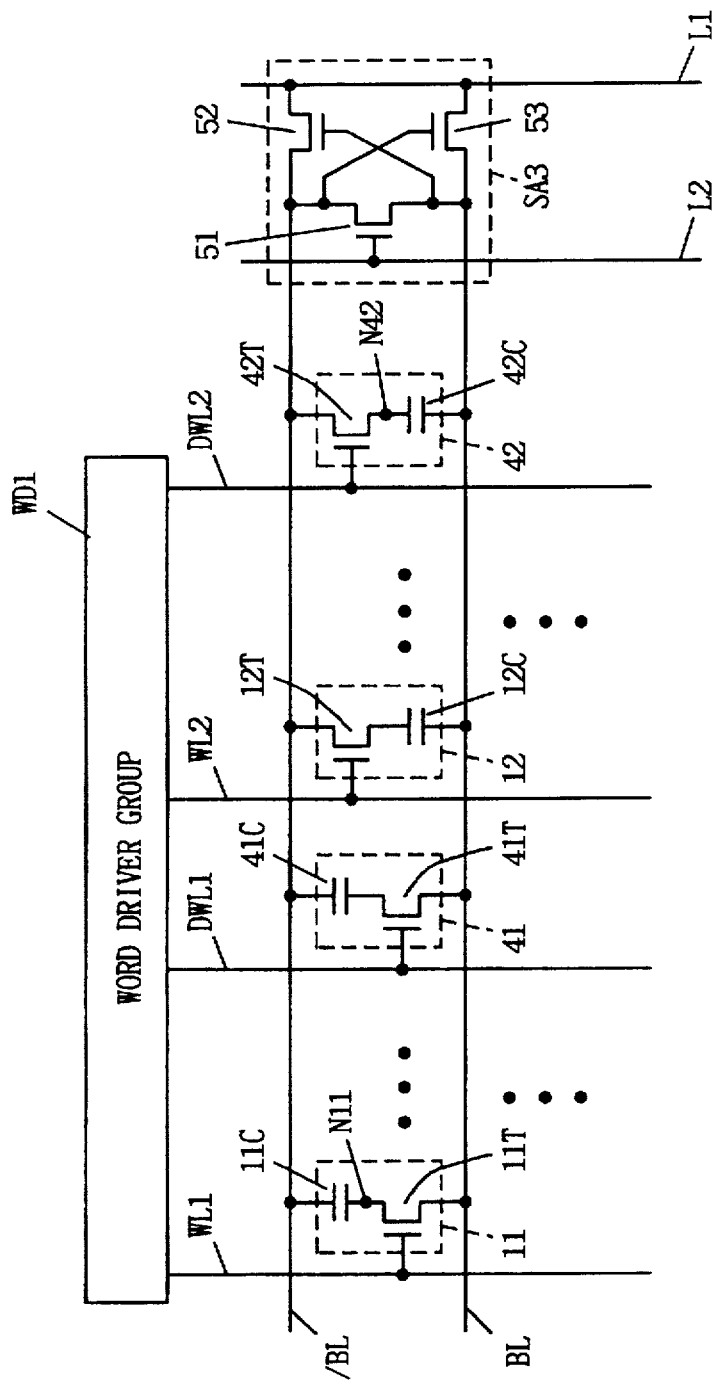

FIG. 23 is a circuit diagram of a major portion of a DRAM of the eighteenth embodiment.

The DRAM includes a plurality of word lines WL1, WL2, . . . , a plurality of dummy word lines DWL1, DWL2, . . . , a plurality of bit line pairs BL and /BL, . . . , a plurality of memory cells 11, 12, . . . , a plurality of dummy cells 41, 42, . . . , a word driver group WD1 and a plurality of sense amplifiers SA3, . . . . Word lines WL1, . . . and dummy word lines DWL1, . . . are arranged to cross bit line pairs BL and /BL. The memory cell is arranged at a crossing of each word line and each bit line pair. The dummy cell is arranged at a crossing of each dummy word line and each bit line pair.

Each of memory cells 11, 12, . . . and dummy cells 41, 42, . . . includes an N-channel MOS transistor (e.g., 11T, 12T, 41T or 42T) and a capacitor (e.g., 11C, 12C, 41C or 42C). The capacitor of each dummy cell has a capacity equal to half the capacity of the capacitor of each memory cell.

The memory cells connected to each bit line pair BL and /BL can keep the capacity balance between the paired bit lines BL and /BL, and for this purpose, half of the memory cells (e.g., memory cell 11) have such a connection form that the capacitor is connected to the inverted bit line /BL, and the other half of memory cells (e.g., memory cell 12) have such a connection form that the capacitor is connected to bit line BL.

Likewise, half of the dummy cells (e.g., dummy cell 41) have such a connection form that the capacitor is connected to inverted bit line /BL, and the other half of the dummy cells (e.g., dummy cell 42) have such a connection form that the capacitor is connected to bit line BL.

Word lines WL1, . . . are connected to memory cells 11, . . . , respectively. Dummy word lines DWL1, . . . are connected to dummy cells 41, . . . , respectively. These word lines and dummy word lines are selectively activated by word driver group WD1.

One sense amplifier SA3 is provided correspondingly to each bit line pair BL and /BL. Sense amplifier SA3 includes N-channel MOS transistors 51, 52 and 53.

Transistor 52 is connected between inverted bit line /BL and sense amplifier activating line L1. Transistor 52 receives on its gate electrode the potential of bit line BL. Transistor 53 is connected between bit line BL and sense amplifier activating line L1. Transistor 53 receives on its gate electrode the potential of inverted bit line /BL.

Transistor 51 is connected between bit line BL and inverted bit line /BL. Transistor 51 is connected at its gate electrode to a sense amplifier equalizing line L2.

In response to activation of sense amplifier equalizing line L2, transistor 51 in sense amplifier SA3 is turned on to equalize bit line pair BL and /BL. Also, in response to activation of sense amplifier activating line L1, transistors 52 and 53 amplify the potentials of bit line pair BL and /BL.

Figure 24:
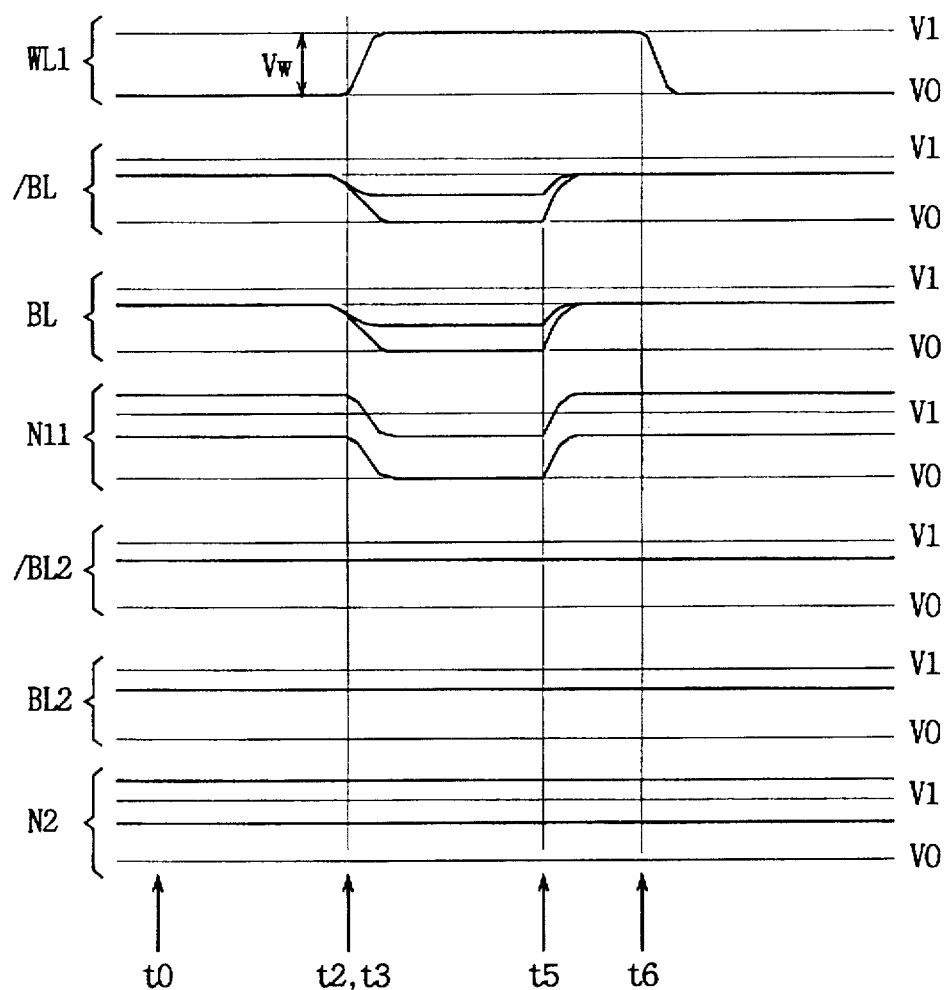
FIG. 24 is a timing chart schematically showing an operation of the DRAM in FIG. 23.

Description will now be given on the operation of the DRAM. FIG. 24 is a timing chart schematically showing the operation of the DRAM in FIG. 23. FIG. 25 is a timing chart showing specific operation waveforms of respective portions of the DRAM in FIG. 23. The operation will be described below with reference to FIGS. 24 and 25.

The following description is given based on the following assumption. A voltage Vb is a precharge potential of bit line BL and inverted bit line/BL. The potential of the storage node is at the level of Vw–Vth+Vb if it corresponds to storage data at the H-level, and is at the level of Vw–Vth if it corresponds to storage data at the L-level.

At t0 in FIG. 24, the potentials of selected bit line pair BL and /BL are at the level of potential V1 (more accurately, these potentials may be at the level other than V1 provided that they satisfy the condition of Vb≧Vw–Vth). The potentials of the unselected bit line pair (e.g., BL2 and /BL2) are floated or fixed at the level of V1.

At times t2 and t3, the potential of word line WL1 is raised by the raised voltage Vw from V0 to V1. Substantially simultaneously with this raising, sense amplifier SA3 amplifies the potential difference of bit line pair BL and /BL by reading charges while discharging bit line BL and inverted bit line /BL. This operation will be described below more in detail with reference to FIG. 25.

Referring to FIG. 25, activation of sense amplifier activating line L1 starts a time ta. In this case, sense amplifier activating line L1 is gradually discharged.

At time t3, discharging of bit line pair BL and /BL starts. At this point of time, the potential of sense amplifier equalizing line L2 is at the H-level, so that bit line pair BL and /BL has been equalized.

As the potentials of bit line pair BL and /BL lower, potential Vs of storage node N11 starts to lower owing to coupling of bit line pair BL and /BL. This operation is performed in the same manner in both the cases that storage node N11 corresponds to the storage data at the H-level and that it corresponds to the storage data at the L-level.

At time tb, sense amplifier equalizing line L2 is deactivated, so that equalized state of bit line pair BL and /BL is released.

At time t2, the potentials of both of word line WL1 and dummy word line DWL2 are raised by raised voltage Vw. If storage node N11 corresponds to the storage data at the L-level, charges are read onto bit line BL in response to the potential rising of WL1. This is owing to the fact that potential Vs of storage node N11 decreases to or below V1–Vth. If storage node N11 corresponds to the storage data at the H-level, charges are not read onto bit line BL.

In response to the potential rising of dummy word line DWL2, charges are read from dummy cell 42 onto bit line pair BL and /BL in a manner similar to the reading from memory cell 11.

Capacitor 42C of dummy cell 42 is half the capacity of capacitor 11C of memory cell 11. Therefore, the quantity of charges read from dummy cell 42 is half the quantity of charges read from memory cell 11 (in the case of correspondence to the storage data at the L-level).

In the case of correspondence to the storage data at the L-level, therefore, the potential difference is read from dummy cell 42 onto bit line pair BL and /BL as described below, assuming that –ΔV is a potential difference read from memory cell 11 onto bit line BL, and +ΔV is read from memory cell 11 onto inverted bit line /BL.

The read potential difference applied from dummy cell 42 to bit line BL goes to +(½)ΔV, and the read potential difference applied from dummy cell 42 to inverted bit line /BL goes to –(½)ΔV. As a result of reading in this manner, the potential of inverted bit line /BL exceeds the potential of bit line BL.

Meanwhile in the case of correspondence to the storage data at the H-level, the read potential difference from memory cell 11 to bit line BL goes to 0V, and also the read potential difference from memory cell 11 to inverted bit line /BL goes to 0V. The read potential difference from dummy cell 42 to bit line BL goes to +(½)ΔV, and the read potential difference from dummy cell 42 to inverted bit line /BL goes to –(½)ΔV.

As a result, the potential of bit line BL exceeds the potential of inverted bit line /BL by ΔV. In this state, sense amplifier SA3 further performs the amplification.

At time tc, the potential difference of bit line pair BL and /BL is amplified. At this time tc, storage node N11 is charged from bit line BL through transistor 11T when reading storage data at the H-level. Thereby, data Vs of storage node N11 goes to V1–Vth.

At time td, respective portions enter the following state. When reading storage data at the L-level, the potentials of bit line BL and storage node N11 attain the level of V0, and the potential of inverted bit line /BL attains the level not lower than V1–Vth.

When reading storage data at the H-level, the potential of bit line BL attains the level not lower than V1–Vth, the potential of inverted bit line /BL attains the level of V0, and potential Vs of storage node N11 attain the level of V1–Vth.

At time t5, both the potentials of bit line pair BL and /BL are raised by Vb while keeping both of word line WL1 and dummy word line WL2 at the level of V0+Vw. As a result, the potential Vs of storage node N11 goes to V1−Vth in the case of reading of storage data at the L-level, and the potential Vs of storage node N11 goes to the level not lower than V1−Vth+Vb in the case of reading of storage data at the H-level.

At time t6, both the potentials of word line WL1 and dummy word line DWL2 are lowered to the level of V0. At time t7, both the potentials of sense amplifier equalizing line L2 and sense amplifier activating line L1 are raised to the level of V1. In this manner, the operation is completed.

By the operation described above, the DRAM can perform reading of data only onto the selected bit line pair among the plurality of bit line pairs. Further, this DRAM performs amplification of the potential difference of the bit line pair in addition to raising of the potential of the word line, so that the read operation can be faster than that in the thirteenth embodiment.

Although sense amplifier SA3 shown in FIG. 23 is formed of only N-channel MOS transistors, it may be of a CMOS type. This further increases the reliability in operation. In sense amplifier SA3, transistor 51 for equalizing may be replaced with a P-channel MOS transistor or a CMOS transfer gate.

In the eighteenth embodiment, the capacity of the capacitor in the dummy cell is half the capacity of the capacitor in the memory cell. However, another structure may be employed provided that it is possible to obtain the read potential difference smaller than the absolute value of read potential difference ΔV applied from the memory cell in the case of L-level reading.

Although FIG. 23 shows the folded bit line structure, it may be applied to an open bit line structure. Also, it can be applied to a shared sense amplifier structure in which multiple bit line pairs commonly use one sense amplifier.

Nineteenth Embodiment

A nineteenth embodiment will be described below. The following description of the nineteenth embodiment relates to another example of a control method for the DRAM in FIG. 23. According to the following example, the sense amplifier is activated after the equalized state of the bit line pair is released and the potential of the word line is raised.

Figure 26:
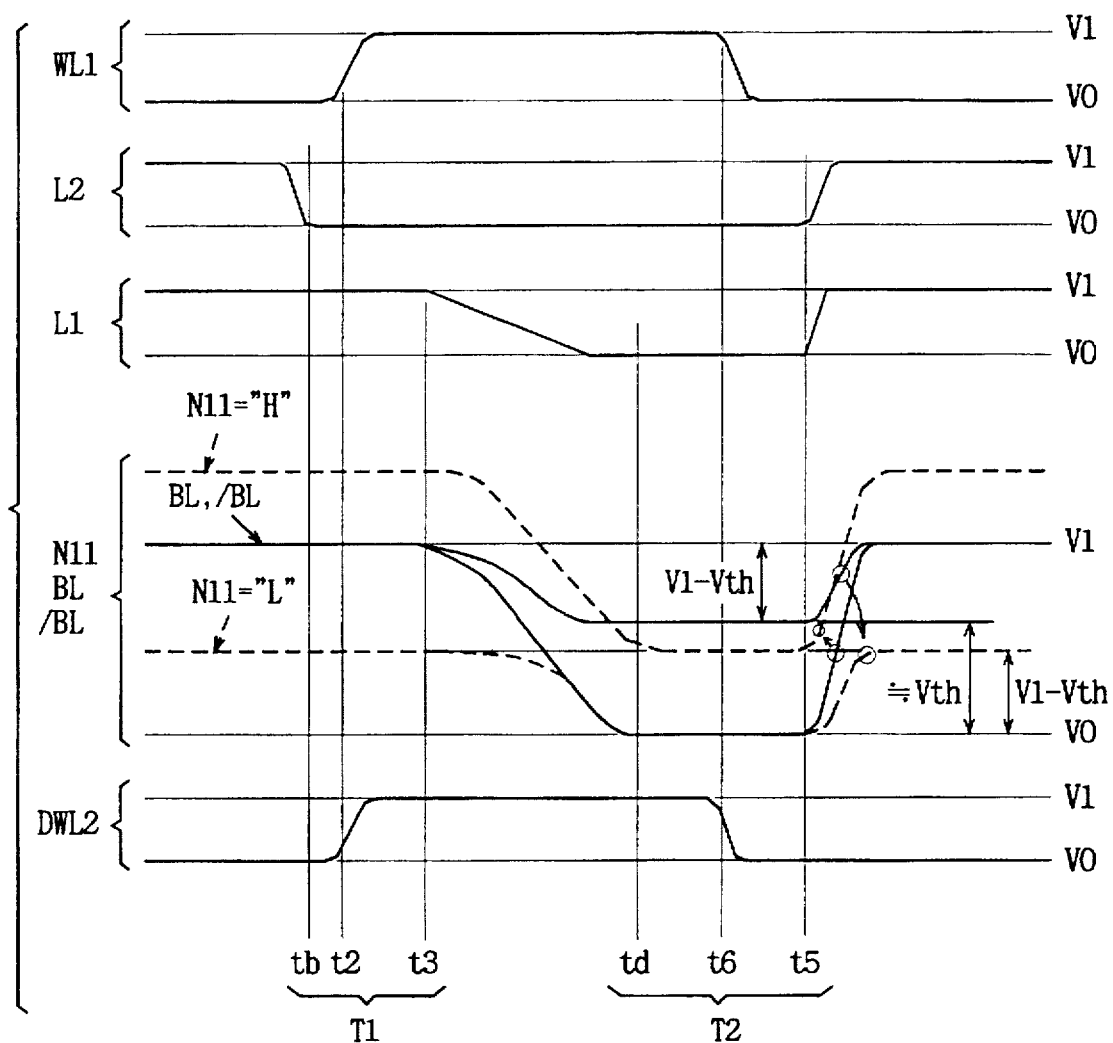
FIG. 26 is a timing chart showing operation waveforms of major portions of DRAMs of 19th and 20th embodiments.

The following operation is executed by the structure of the DRAM in FIG. 23. FIG. 26 is a timing chart showing waveforms of a major portion of the DRAM of the nineteenth and twentieth embodiments.

The nineteenth embodiment will be described below mainly with respect to timings within a timing range T1 in FIG. 26.

The operation of the nineteenth embodiment 19 differs from that in FIG. 25 in that sense amplifier activating line L1 is not activated at an early stage. Activation of sense amplifier activating line L1 is performed at time t3 after releasing of the equalized state of bit line pair BL and /BL at time tb and the raising of potentials of word line WL1 and dummy word line WL2 at time t2.

The potential difference does not occur at bit line pair BL and /BL before time t3. Since sense amplifier SA3 is activated at this point of time, operation for starting amplification of the potential difference of bit line pair BL and /BL starts at time t3.

When the operation is performed in this manner, charges of memory cell 11 and charges of dummy cell 42 corresponding to the storage data at the L-level are read onto bit line pair BL and /BL in accordance with lowering of the potentials of bit line pair BL and /BL. The charges thus read are amplified by sense amplifier SA3.

Therefore, it is not necessary to delay the timing of activation of sense amplifier SA3 until the read potential difference is transmitted to sense amplifier SA3. Therefore, the sense amplifier can perform amplification at an increased speed. The nineteenth embodiment can be applied to other embodiments already described.

Twentieth Embodiment

A twentieth embodiment will be described below. The following description of the twentieth embodiment relates to an example having a distinctive feature that the potentials of the bit line pair are raised after amplification of the bit line pair by the sense amplifier.

The following operation is executed by the structure of the DRAM of the structure shown in FIG. 23. The operation of this embodiment is shown in a timing range T2 in FIG. 26.

As can be seen from timing range T2 shown in FIG. 26, the potential of bit line BL is set to V0+Vth after activation of sense amplifier SA3, when reading data at the H-level. Therefore, when reading data at the H-level, the potential of storage node N11 goes to V1−Vth and the potential of inverted bit line /BL goes to the level of 0V at time td.

At time t6, both the potentials of word line WL1 and dummy word line DWL2 are lowered. At subsequent time t5, the potential of inverted bit line /BL is precharged to the level of V1. Thereby, the potential of storage node N11 is raised substantially to the level of V1−Vth+V1=2·V1−Vth.

When reading data at the L-level, the potential of storage node N11 goes to V0 and the potential of inverted bit line /BL goes to V1−Vth at time td. After the potentials of word line WL1 and dummy word line DWL2 are lowered at time t6, the potential of inverted bit line /BL is precharged to the level of V1 at time t5, whereby the potential of storage node N11 is raised substantially to the level of V1−(V0+Vth)+V0=V1−Vth.

By the above operation, the potential of storage node N11 is restored to the level in the initial state (i.e., the state before time tb) in both the cases of reading of data at the H-level and reading of data at the L-level.

As described above, this twentieth embodiment can perform the restoring operation without delaying lowering of the potential of the word line until the potential to be restored in the memory cell reaches a sufficient level. Therefore, the restoring operation can be performed faster.

In the twentieth embodiment, the restoring operation can be performed without restricting the order of the timing for precharging of the bit line pair and the timing for lowering the potential of the word line. Regardless of the order, the restore potential will return to the initial value. The operation of the twentieth embodiment can be applied to the other embodiments already described.

Twenty-first Embodiment

A twenty-first embodiment will be described below. The following description of the twenty-first embodiment relates to an example which can further increase the read potential difference.

The following operation is performed by the DRAM in FIG. 15. The operation can also be performed by the DRAM in FIG. 23.

Figure 27:
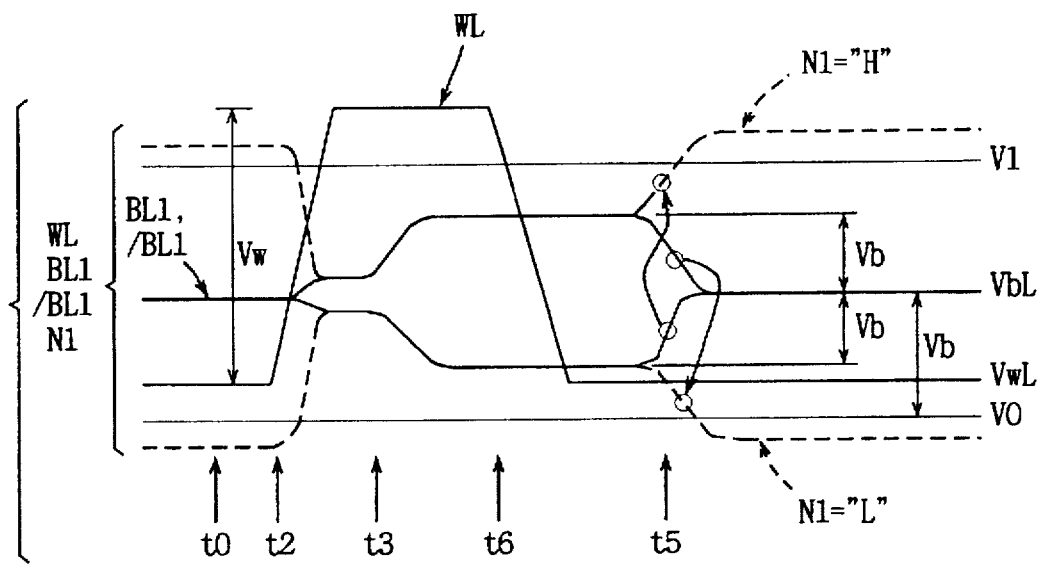
FIGS. 27 through 31 are timing charts showing operation waveforms of respective portions of DRAMs of 21st through 25th embodiments, respectively.

FIG. 27 is a timing chart showing operation waveforms of a DRAM of the twenty-first embodiment.

First, the initial state will be described below. Both the potentials of bit line BL and inverted bit line /BL are at the level of VbL. Here, potential VbL is at a level intermediate V0 and V1. The potential of word line WL is set to the level of VwL. The potential of VwL is at the level intermediate V0 and V1 and closer to V0.

The potential Vs of storage node N1 is set to the following level. In the case of correspondence to the storage data at the L-level, Vs is equal to VbL−2·Vb. In the case of correspondence to the storage data at the H-level, Vs is equal to VbL+2·Vb.

At time t0, bit line pair BL and /BL is floated at the equalized state.

At time t2, the potential of WL is raised from VwL by raised voltage Vw. Since potential VbL of bit line is set to the level not higher than VwL+Vw−Vth, transistor 1T is turned on in response to the potential rising of word line WL. This operation is performed in both the cases of reading of data at the L-level and of reading of data at the H-level.

Since the transistor 1T is turned on in this manner, charges are read from memory cell 1 onto bit lines BL1 and /BL1. The potential of bit line BL1 in this case is as follows. In the case of reading of data at the H-level, the potential at storage node N11 goes to Vc+2·ΔV. In the case of reading of data at the L-level, the potential at storage node N11 goes to Vb−2·ΔV.

Meanwhile, the potential of inverted bit line /BL1 goes to Vb−2ΔV in the case of reading of data at the H-level, and goes to Vb+2·ΔV in the case of reading of data at the L-level.

Here, 2·ΔV is the read potential difference applied to bit line BL, and can be expressed as 2·ΔV=2·Vb·Cs/(Cb+Cs). Here, Cb is a parasitic capacitance of bit line BL1 and inverted bit line /BL1. Cs is a of capacitor 1C. Therefore, the potential difference between bit line BL1 and inverted bit line /BL1 goes to 4·ΔV.

At time t3, the potential difference of bit line pair BL1 and /BL1 is amplified by sense amplifier SA1. This amplification sets the potentials of the respective portions as follows.

In the case of reading of data at the H-level, both the potentials of bit line BL1 and storage node N11 go to VbL+Vb, and the potential of inverted bit line /BL1 goes to VbL−Vb. In the case of reading of data at the L-level, both the potentials of bit line BL1 and storage node N11 go to VbL−Vb, and the potential of inverted bit line /BL1 goes to VbL+Vb.

At time t6, the potential of word line WL is restored to the level of VwL. At time t5, the potentials of bit line BL1 and inverted bit line /BL1 are restored to the level of VbL. This restoring of the potentials to VbL is accomplish by equalizing the bit line BL1 and inverted bit line /BL1.

When the bit line pair BL and /BL is set to the above potentials, potential Vs of storage node N11 attains the following level. In the case of reading of data at the H-level, potential Vs is set to VbL+2·Vb owing to the coupling of inverted bit line /BL1 through capacitor 1C. Similarly, in the case of reading of data at the L-level, potential Vs is set to VbL−2·Vb owing to the coupling of inverted bit line /BL1 through capacitor 1C. Therefore, the potential Vs of storage node N11 returns to the initial state.

In this manner, a series of operations for reading (or restoring and refreshing) are completed.

Writing is performed similarly to the above operations except for that write data is applied to bit line BL and inverted bit line /BL at time t6, i.e., before restoring the potential of word line WL to the level of VwL.

In the conventional DRAM, read potential difference ΔV between the bit line and the inverted bit line is Vb·Cs/(Cb+Cs) if the amplitudes of the bit line and inverted bit line are equal to Vb similarly to the twenty-first embodiment. In this twenty-first embodiment, therefore, if the amplitudes of the bit line and inverted bit line are equal to Vb, the quantity of charges held at the memory cell can be substantially twice as large as that in the prior art, and the potential difference of bit line pair caused by reading of charges is substantially four times as large as that in the prior art. Therefore, the twenty-first embodiment can perform the stable sense operation (i.e., amplification at time t3).

In other words, according to the twenty-first embodiment, the amplitudes of the bit line and the inverted bit line can be reduced to a quarter as compared with the prior art, if the potential difference to be generated by the reading of data is equal to that in the prior art. For example, the sense operation, therefore, can be performed with a quarter of power consumption in the prior art.

Twenty-second Embodiment

Figure 55:
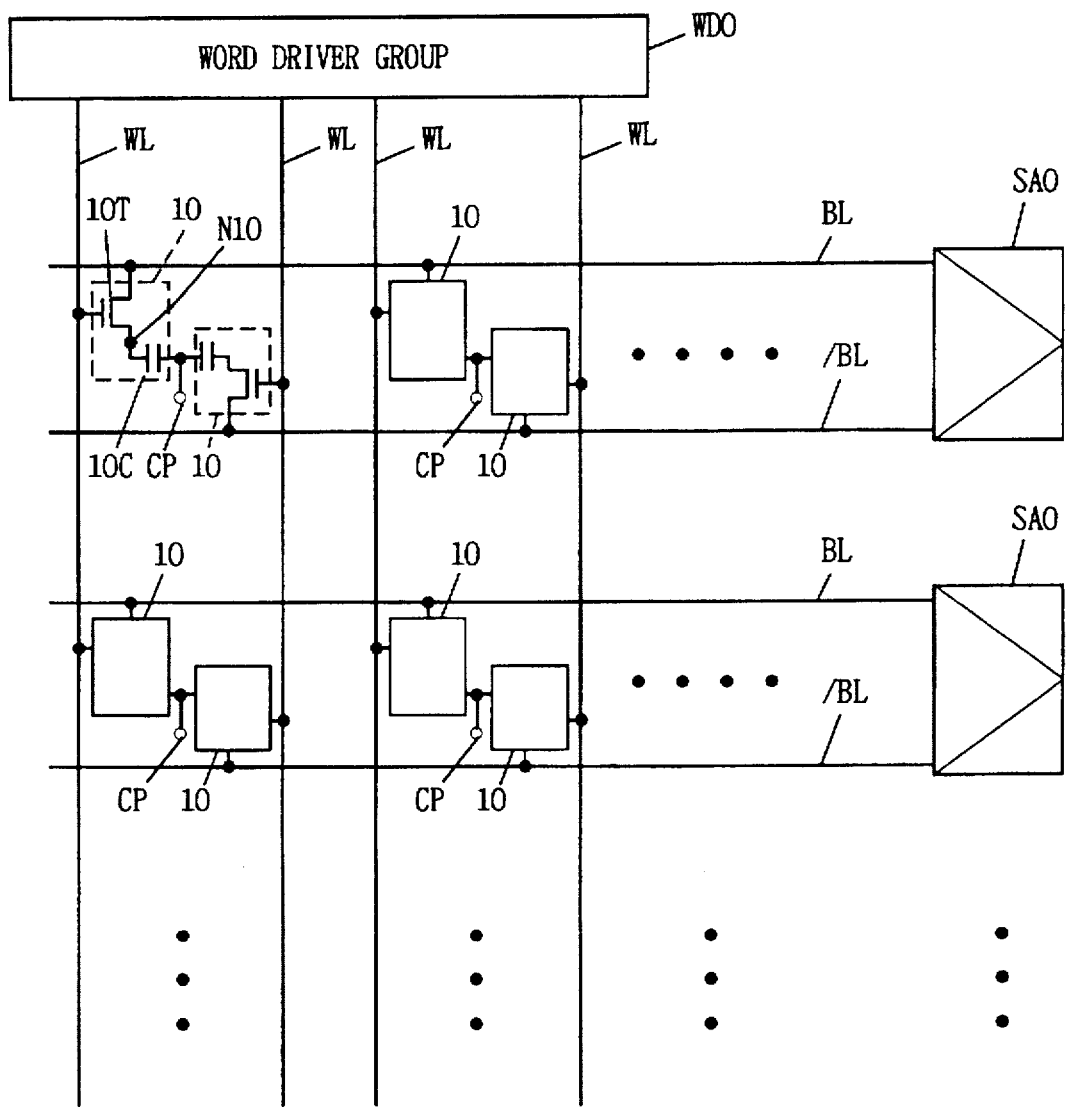
FIG. 55 is a circuit diagram showing a structure of a conventional DRAM.
Figure 56:
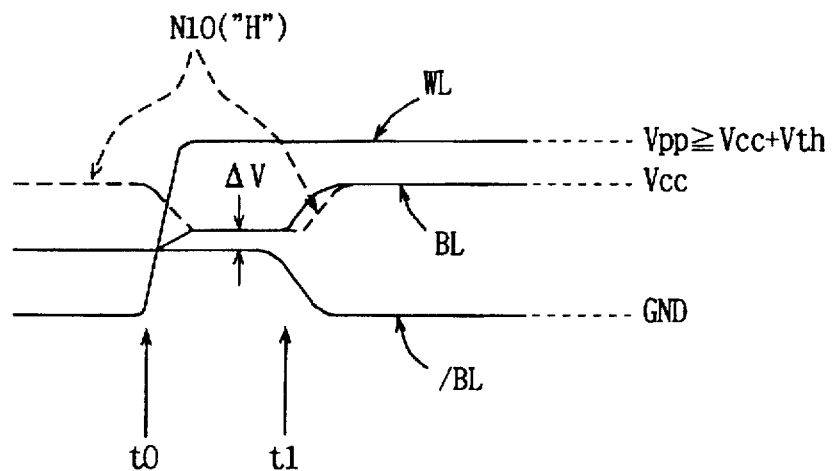
FIG. 56 is a timing chart showing operation waveforms of respective portions during reading of the conventional DRAM in FIG. 55.
Figure 57:
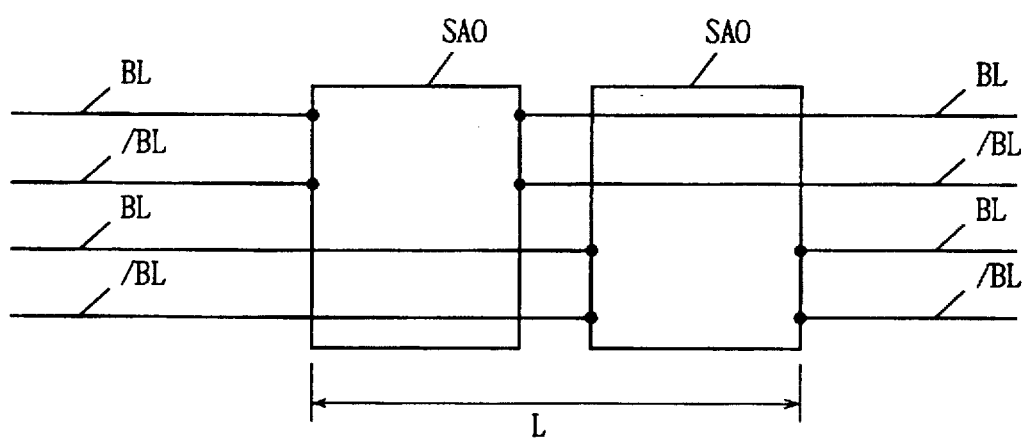
FIG. 57 is a block diagram showing a structure of a conventional DRAM easing restrictions on a sense amplifier pitch.

A twenty-second embodiment will be described below. The following description of the twenty-second embodiment relates to an example in which a leak current due to short circuit between the bit line pair and the word line is prevented. The following operation will be executed by a DRAM of FIG. 55.

Figure 28:
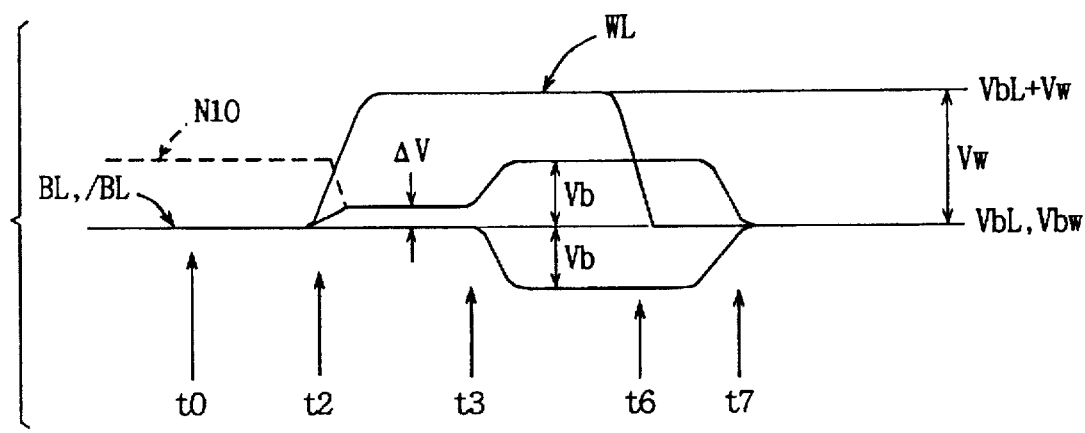

FIG. 28 is a timing chart showing operation waveforms of respective portions of the DRAM of the twenty-second embodiment.

First, an initial state will be described below. Initial potentials VbL of bit line BL and inverted bit line /BL are equal to initial potential Vbw of word line WL.

At time t0, the potentials of bit line BL and inverted bit line /BL are floated at the equalized potential of VbL.

At time t2, the potential of word line WL is raised by raised potential Vw from the level of VwL. Thereby, the potential of word line WL attains the level of VwL+Vw. Here, Vw satisfies a relationship of Vw≧Vb+Vth. In response to the potential rising of word line WL, charges are read onto bit line BL or inverted bit line /BL.

At time t3, the potential difference of bit line pair BL and /BL is amplified by sense amplifier SA0. Thereby, the potentials of respective portions attain the following levels. In the case of reading of data at the H-level, the potentials of bit line BL and storage node N10 each go to VbL+Vb, and the potential of inverted bit line /BL goes to VbL−Vb. In the case of reading of data at the L-level, the potentials of bit line BL and storage node N10 each go to VbL−Vb, and the potential of inverted bit line /BL goes to VbL+Vb.

At time t6, the potential of word line WL is restored to the level of VwL. At time t7, both the potentials of bit line BL and inverted bit line /BL are restored to the level of VbL. Thereby, the potentials of bit line pair BL and /BL return to the initial state.

Although, the potential Vs of storage node N10 is VbL−Vb in the case of reading of data at the L-level, the potential of storage node N10 is held because a state of VbL−Vb≧VwL−Vth is set. In the case of reading of data at the H-level, potential Vs of storage node N10 is VbL+Vb, and the potential at the L-level side of the amplitude of the bit line is VbL−Vb. In this case, the potential of storage node N10 is held owing to the state of VbL−Vb≧VwL−Vth.

In this manner, a series of operations for reading (or restoring and refreshing) are completed. In the above operations, the potentials of bit line pair are equal to the potential of word line WL in the standby state, so that a leak current due to short-circuit between these lines can be prevented.

Twenty-third Embodiment

A twenty-third embodiment will be described below. The following description of the twenty-third embodiment relates to an example which is based on the twenty-first embodiment and can prevent a leak current due to short circuit in the memory cell array. Thus, the twenty-third embodiment is a modification of the twenty-first embodiment.

Figure 29:
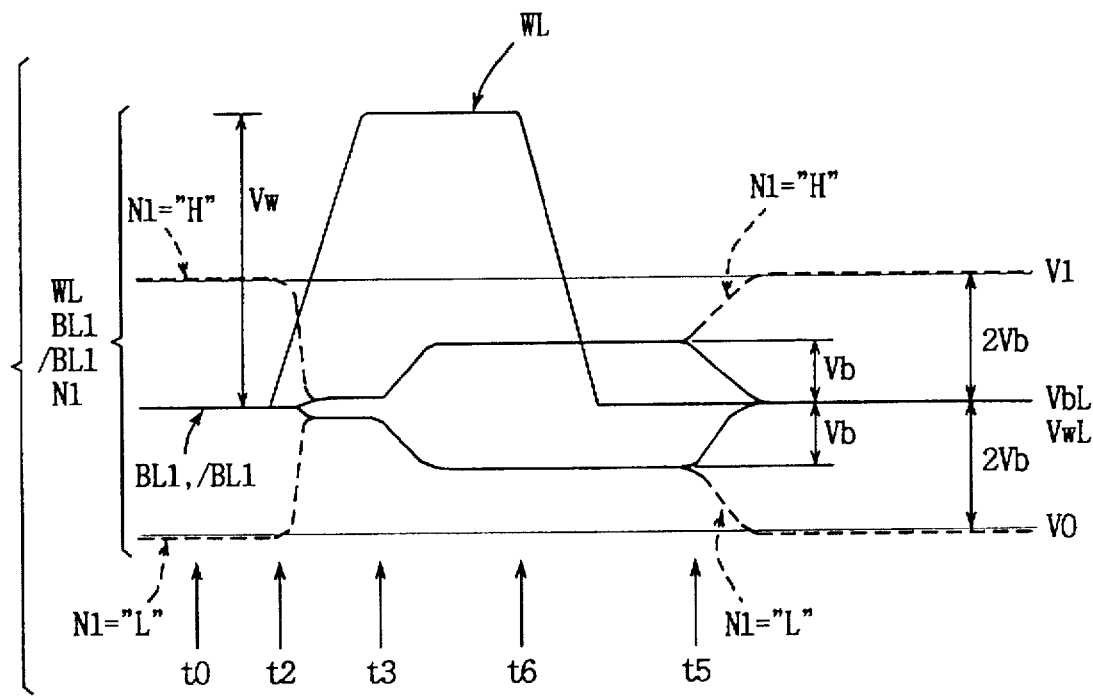

Similarly to the twenty-first embodiment, the following operation is performed by the DRAM in FIG. 15. This can be performed by the DRAM in FIG. 23. FIG. 29 is a timing chart showing operation waveforms of respective portions of the DRAM of the twenty-third embodiment.

The initial state will be described below. Both the potentials of bit line BL1 and inverted bit line /BL1 are set to the level of VbL. The potential of word line WL is set to the level of VwL. Here, potential VbL is equal to potential VwL.

The potential Vs of storage node N1 is set as follows. In the case of reading of data at the L-level, Vs is equal to VbL−2·Vb. In the case of reading of data at the H-level, Vs is equal to VbL+2·Vb. Further, threshold voltage Vth of transistor 1T is set to satisfy a relationship of Vth≧Vb.

At time t0, the potentials of bit line BL1 and inverted bit line /BL1 are floated at the equalized potential.

At time t2, the potential of word line WL is raised by raised potential Vw from the level of VwL. Thereby, the raised potential Vw satisfies the relationship of Vw≧VbL+Vb+Vth. In response to the potential rising of word line WL, charges are read onto bit line BL1 and inverted bit line /BL1. A potential difference of 4·ΔV results from this reading.

At time t3, the potential difference of bit line pair BL1 and /BL1 is amplified by sense amplifier SA1. Thereby, the potentials of respective portions attain the following levels.

In the case of reading of data at the H-level, both the potentials of bit line BL1 and storage node N1 each go to VbL+Vb, and the potential of inverted bit line /BL1 goes to VbL−Vb. In the case of reading of data at the L-level, both the potentials of bit line BL1 and storage node N1 each go to the level of VbL−Vb, and the potential of inverted bit line /BL1 goes to VbL+Vb.

At time t6, the potential of word line WL is restored to the level of VwL. At subsequent time t5, both the potentials of bit line BL1 and inverted bit line /BL1 are restored to the level of VbL. This level VbL is attained by equalizing the bit line BL and inverted bit line /BL.

When the bit line pair BL1 and /BL1 is set to the above potentials, potential Vs of storage node N1 attains the following level. In the case of reading of data at the H-level, storage node N1 attains potential Vs equal to VbL+2·Vb owing to the coupling of inverted bit line /BL1 through capacitor 1C. Similarly, in the case of reading of data at the L-level, storage node N1 attains potential Vs equal to VbL−2·Vb owing to the coupling of inverted bit line /BL1 through capacitor 1C. In this manner, the potentials of bit line BL1 and inverted bit line /BL1 return to the initial state.

In this manner, a series of operations for reading (or restoring and refreshing) are completed.

Writing is performed similarly to the above operations except for that write data is applied to bit line BL1 and inverted bit line /BL1 at time t6, i.e., before restoring the potential of word line WL to the level of VwL.

The twenty-third embodiment can achieve an effect similar to that of the twenty-first embodiment. Further, a leak current due to short circuit between the bit line pair and the word line can be prevented during standby, because the potentials of all the lines in the memory cell array are at the level of VbL. As a result, the twenty-third embodiment can further reduce a power consumption as compared with the twenty-first embodiment.

If the condition of Vth≧Vb is applied to the conventional DRAM, the raised potential Vw+VbL of word line must be higher by at least threshold voltage Vth than the potential of the storage node corresponding to the storage data at the H-level. Meanwhile, in the twenty-third embodiment, raised potential Vw+VbL of the word line is required to be higher only by Vth−Vb than the potential of the storage node corresponding to the storage node at the H-level. According to the twenty-third embodiment, therefore, the raised potential of word line can be lower than that in the prior art.

Twenty-fourth Embodiment

A twenty-fourth embodiment will be described below. The following description of the twenty-fourth embodiment relates to an example in which data reading is performed with all the bit lines in the refresh operation, and data reading (or writing) is performed with the selected bit line pair in the read (or write) operation.

Figure 30:
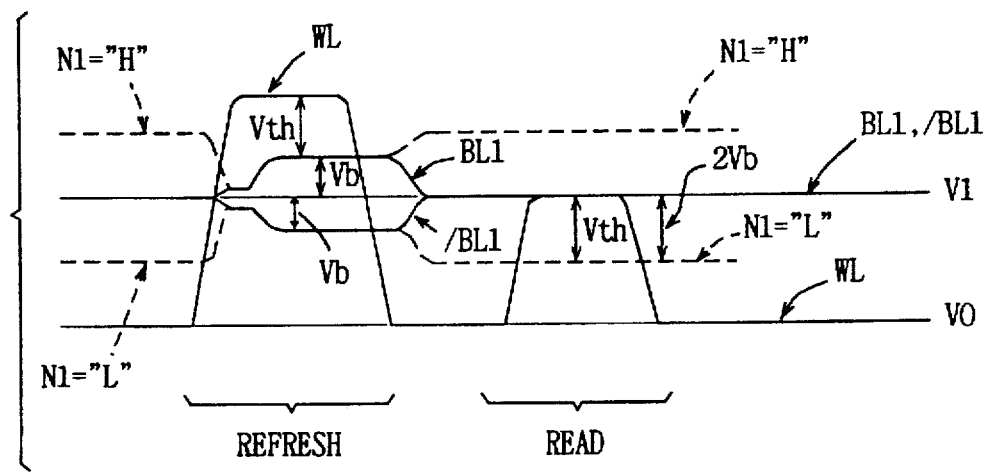

The following operation is executed by the DRAM of FIG. 15. FIG. 30 is a timing chart showing operation waveforms of respective portions of a DRAM of the twenty-fourth embodiment. FIG. 30 is a timing chart corresponding to the memory cell not selected in the read operation.

Referring to FIG. 30, the DRAM performs refreshing in the manner described in connection with the twenty-third embodiment, and performs reading (or writing) in the manner described in connection with the thirteenth embodiment. Thus, raised voltage Vw of word line WL in the refresh operation and that in the read (write) operation are controlled to be different from each other.

The state during standby will now be described below. Bit line pairs BL1 and /BL1 are at the level of V1, and word line WL is at the level of V0. In the following description of this twenty-fourth embodiment, it is assumed that Vb is used as the voltage amplitude of the bit line and threshold voltage Vth is equal to 2·Vb.

When the above standby condition is set, raised voltage Vw of word line WL must satisfy the condition of Vw≧V1+Vb+Vth in order to perform the operation of the twenty-third embodiment for refreshing. With the above raised voltage Vw, data is read onto all bit line pairs BL1 and BL1 in the refresh operation.

In order to perform the operations of the thirteenth embodiment for reading (or writing) with the standby condition described above, raised voltage Vw of word line WL must satisfy the condition of Vw≦V1−2·Vb+Vth. With the above raised voltage Vw, data is read onto only the selected bit line pair in the read (or write) operation.

Therefore, by providing a difference of at least 3−Vb=(V1+Vb+Vth)−(V1−2·Vb+Vth) between raised voltage Vw for refreshing and raised voltage Vw for reading (or writing), the refreshing and reading (or writing) can be executed with the same condition of the potential as that during standby according to this twenty-fourth embodiment.

Twenty-fifth Embodiment

Figure 31:
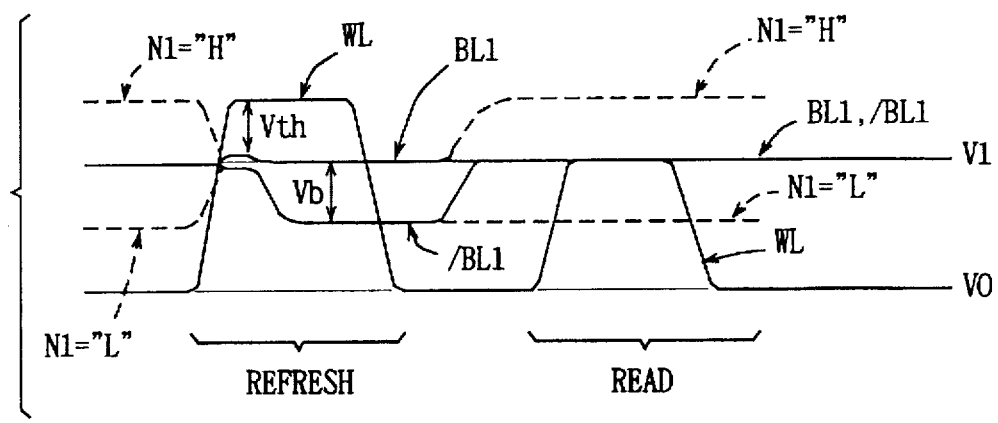

A twenty-fifth embodiment will be described below. The following description of the twenty-fifth embodiment relates to a modification of the operation of the twenty-fourth embodiment. FIG. 31 is a timing chart showing operation waveforms of respective portions of a DRAM of the twenty-fifth embodiment. In the following description, the same portions as those in the twenty-fourth embodiment will not be described.

The operations in FIG. 31 differ from those in FIG. 30 in the operations for refreshing. In the twenty-fifth embodiment, the potentials of bit line pair are limited not to exceed significantly a level of V1. Therefore, the condition of Vw≧V1+Vth is required for raised voltage Vw of word line WL in order to read charges from all the memory cells connected to one word line WL on to the corresponding bit line pairs in the refresh operation, respectively.

If it is assumed that threshold voltage of Vth of transistor 1T is equal to voltage amplitude Vb of each of paired bit lines BL1 and /BL1, raised potential Vw of word line WL in the read (or write) operation must satisfy the condition of Vw≦V1−Vb+Vth.

Therefore, by providing a difference of Vb=(V1+Vth)−(V1−Vb+Vth) in raised voltage Vw between refreshing and reading (or writing), the refreshing and reading (or writing) can be executed under condition that the potential during standby is constant.

Accordingly, the raised potential of the word line for refreshing in the twenty-fifth embodiment can be lower than that in the twenty-fourth embodiment. As a result, the power consumption can be reduced.

Twenty-sixth Embodiment

A twenty-sixth embodiment will be described below. The following description of the twenty-sixth embodiment relates to an example of a DRAM having a retention mode for executing only refreshing and an access mode for executing refreshing and reading (or writing), and in particular to an example in which charges are read from memory cells connected to a word line onto bit line pairs in the refresh operation, and charges are read only from a selected memory cell onto a corresponding bit line pair.

This twenty-sixth embodiment is applied to the DRAM of the structure in FIG. 15. In the following description, it is assumed that the threshold voltage Vth of the transistor in the memory cell is twice as large as voltage amplitude Vb of the bit line pair.

Figure 32:
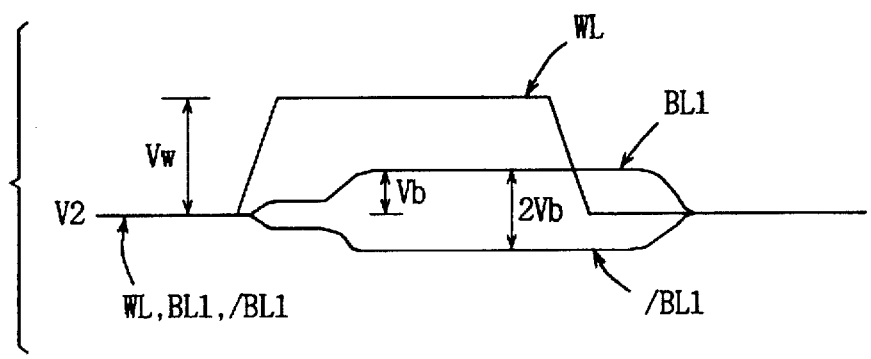
FIG. 32 is a timing chart showing operation waveforms of respective portions in a retention mode of a DRAM of a 26th embodiment.

FIG. 32 is a timing chart showing operation waveforms of respective portions in the retention mode of the DRAM of the twenty-sixth embodiment. Referring to FIG. 32, operations similar to those shown in FIG. 29 are performed in the retention mode. In this case, potential V2 of word line WL during standby is V0+2·Vb.

Figure 33:
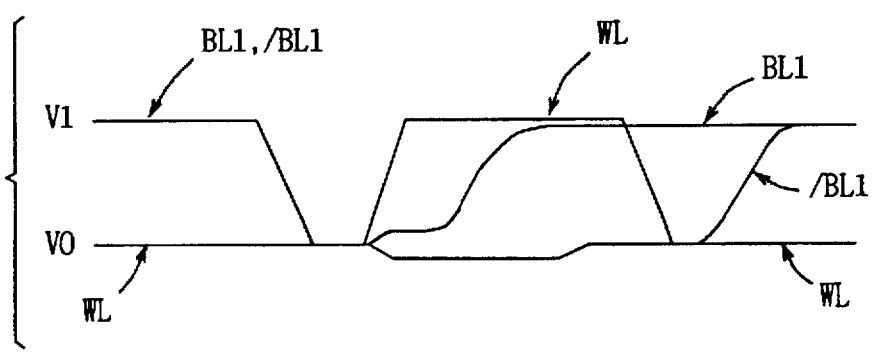
FIG. 33 is a timing chart showing operation waveforms of respective portions in an access mode of the DRAM of the 26th embodiment.

FIG. 33 is a timing chart showing operation waveforms of respective portions in the access mode of the DRAM of the twenty-sixth embodiment. FIG. 33 shows operations in the access mode. Referring to FIG. 33, operations similar to those shown in FIG. 30 are performed in the access mode. In this case, the potential of word line WL during standby is at the level of V0.

The above setting to the level of V0 is executed by the following reason. The potential of storage node of memory cell corresponding to the selected bit line pair lowers to the level of V0 in the operation of FIG. 16. In order to prevent destruction of the storage data at the L-level of the memory cell, therefore, the potential of word line during standby must be equal to or lower than V0−2·Vb+Vth.

According to the twenty-sixth embodiment, the DRAM having the retention mode and the access mode can execute these modes by setting the potential of word line WL in the retention mode and that in the access mode to different levels.

Further, by providing a difference of Vb=(V1+Vth)−(V1−Vb+Vth) in raised potential VwH of word line WL between the refresh operation and the read (or write) operation, both the refreshing and the reading (or writing) can be executed under the condition that the potential during standby is constant.

In the twenty-sixth embodiment, therefore, the raised voltage of word line for the refreshing can be lower than that in the twenty-fourth embodiment. As a result, the power consumption can be reduced.

Twenty-seventh Embodiment

A twenty-seventh embodiment will be described below. The following description of the twenty-seventh embodiment relates to an example in which shift of the mode from the access mode, which has already been described in connection with the twenty-sixth embodiment, to the retention mode can be executed rapidly with a low power consumption.

Figure 34:
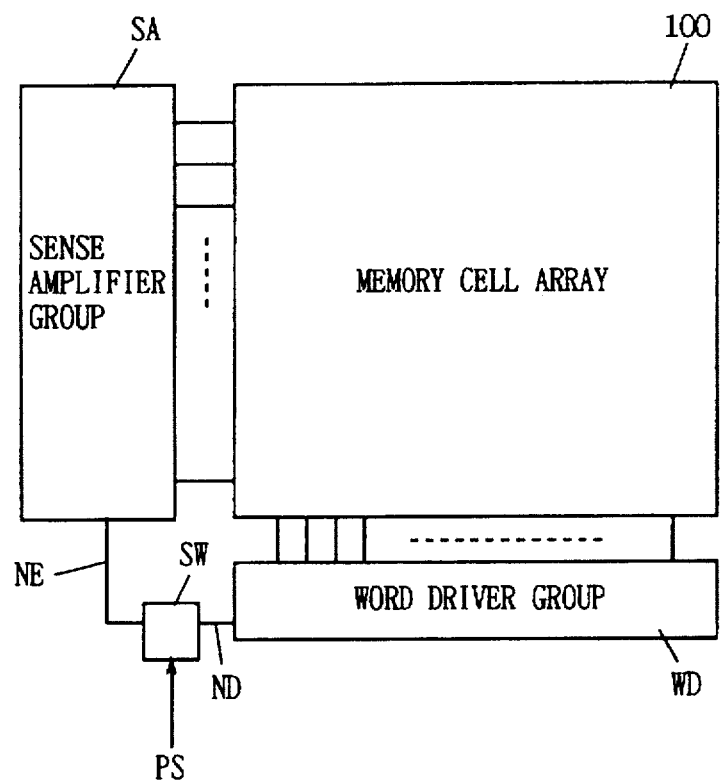
FIG. 34 is a block diagram showing a structure of a major portion of a DRAM of a 27th embodiment.

FIG. 34 is a block diagram showing a structure of a major portion of a DRAM of the twenty-seventh embodiment. Referring to FIG. 34, the DRAM includes a memory cell array 100, a sense amplifier group SA, a word driver group WD and an equalizing switch SW.

A distinctive portion in the DRAM is equalizing switch SW. An equalize potential node NE is electrically connected to bit line pairs in memory cell array 100 via sense amplifier group SA during standby. Word driver standby potential node ND is electrically connected to all word lines in memory cell array 100 via word driver group WD during standby.

Equalizing switch SW is connected between equalize potential node NE and word driver standby potential node ND.

Equalizing switch SW receives a mode switch pulse signal PS. Signal PS is kept at the H-level for a predetermined period when the mode is to be switched from the access mode to the retention mode. When the mode is to be switched from the access mode to the retention mode, equalizing switch SW electrically connects the equalize potential node NE to word driver standby potential node ND in response to signal PS.

Figure 35:
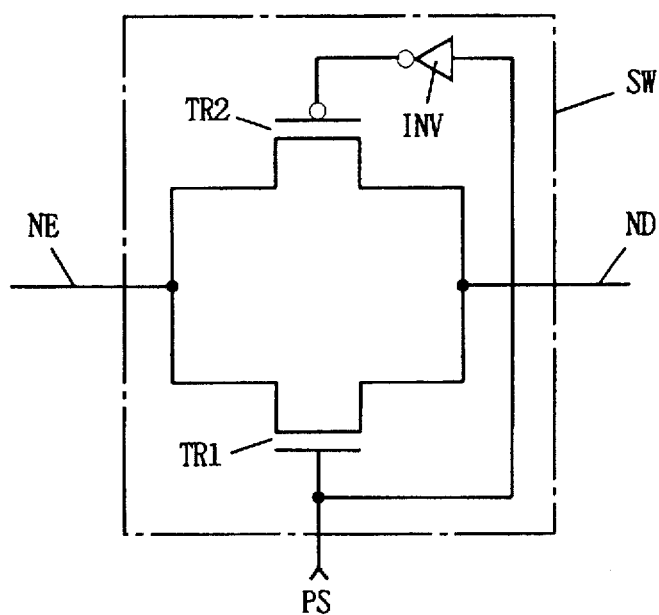
FIG. 35 is a circuit diagram showing a specific structure of an equalizing switch in FIG. 34.

A specific structure of equalizing switch SW will be described below. FIG. 35 is a circuit diagram showing the specific structure of equalizing switch SW in FIG. 34.

Referring to FIG. 35, equalizing switch SW includes an N-channel MOS transistor TR1, a P-channel MOS transistor TR2 and an inverter INV. Transistors TR1 and TR2 are connected in parallel between equalize potential node NE and word driver standby potential node ND.

Transistor TR1 receives signal PS on its gate electrode, and is controlled to be turned on/off in response to signal PS. Transistor TR2 receives an inverted signal of signal PS via inverter INV, and is controlled to be turned on/off in response to the received signal.

When signal PS is at the H-level, both transistors TR1 and TR2 are turned on, so that equalize potential node NE is electrically connected to word driver standby potential node ND.

In the above operation of switching the mode from the access mode to the retention mode, electrical connection is made between equalize potential node NE and word driver standby potential node ND.

In the twenty-sixth embodiment already described, the potential during standby in the access mode is different from the potential during standby in the retention mode. More specifically, during standby in the retention mode, the potentials of bit line pair are equal to the potential of word line, which is equal to potential V2 intermediate V0 and V1.

Meanwhile, during standby in the access mode, the potentials of bit line pair are at the level of V1, and the potential of word line is at the level of V0.

In general, in memory cell array 100 of the DRAM, the capacity of all the bit line pairs is equal to the capacity of all the word lines in some case. Therefore, potential V2 intermediate the levels of V0 and V1 can be obtained for the standby in the retention mode by such an operation that equalizing switch SW electrically connects all the bit line pairs at the level of V1 to all the word lines at the level of V0 when changing the mode from the access mode to the retention mode, as is done in the twenty-seventh embodiment.

According to the twenty-seventh embodiment, since the potential for standby in the retention mode can be obtained by the operation of equalizing the bit line pairs and word lines, the mode can be rapidly changed from the access mode to the retention mode. Further, a power consumption for this mode change can be reduced.

Twenty-eighth Embodiment

A twenty-eighth embodiment will be described below. The following description of the twenty-eighth embodiment relates to an example of a DRAM which has a function of executing the retention mode and access mode discussed in connection with the twenty-sixth embodiment, and can obtain, in a distinctive manner, the potentials during standby in the retention mode and access mode.

The twenty-eighth embodiment is based on the twenty-sixth embodiment, and obtains the potentials for standby in the retention mode and access mode.

The potentials of word lines and bit line pairs during standby in the retention mode are obtained by equalizing the bit line pairs after completion of restoring. The potentials of bit line pairs during standby in the access mode are obtained by precharging the bit line pairs to the level of V1 after completion of restoring.

Thereby, a power consumption of the refresh operation in the retention mode can be reduced. The potentials of bit line pair during standby at the time of completion of the refreshing in the access mode can be kept at the level of V1. Therefore, the refreshing and reading (writing) can be operated fast.

Twenty-ninth Embodiment

A twenty-ninth embodiment will be described below. The following description of the twenty-ninth embodiment relates to an example of a sense amplifier which can be used in the embodiments already described.

Figure 36:
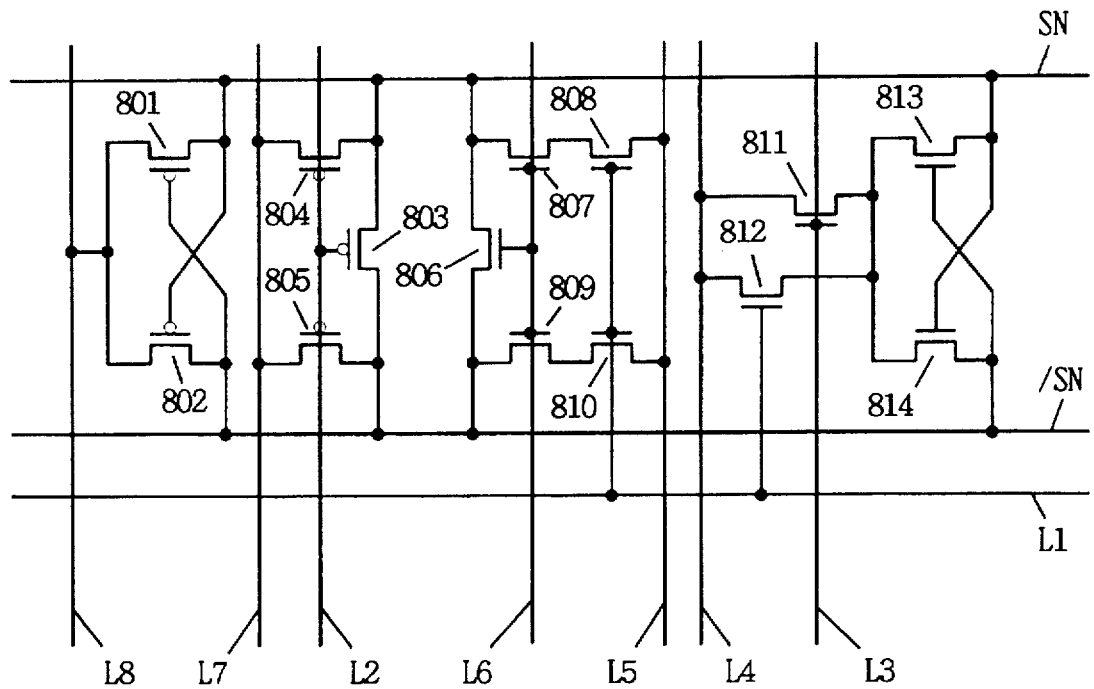
FIG. 36 is a circuit diagram showing a structure of a sense amplifier of a 29th embodiment.

FIG. 36 is a circuit diagram of a sense amplifier of the twenty-ninth embodiment. Referring to FIG. 36, this sense amplifier includes P-channel MOS transistors 801–805 and N-channel MOS transistors 806–814.

This sense amplifier has a sense node SN and an inverted sense node /SN connected to paired bit lines, respectively. Sense amplifier select line L1 is arranged in parallel to sense node SN and inverted sense node /SN.

In a direction crossing sense amplifier select line Li, there are arranged a first equalizing line L2, a sense amplifier activating line L3, a first sense potential line L4, a second sense potential line L5, a second equalizing line L6, an equalize potential line L7 and a third sense potential line L8.

Transistor 801 has a gate electrode receiving a potential of inverted sense node /SN, and is connected between sense node SN and third sense potential L8. Transistor 802 has a gate electrode receiving the potential of sense node SN, and is connected between inverted sense node /SN and third sense potential line L8.

Transistor 803 is connected between sense node SN and inverted sense node /SN. Transistor 804 is connected between sense node SN and equalize potential line L7. Transistor 805 is connected between inverted sense node /SN and equalize potential line L7. Each of transistors 803, 804 and 805 receives on their gate electrode the potential of first equalizing line L2.

Transistor 806 is connected between sense node SN and inverted sense node /SN. Transistors 807 and 808 are connected in series between sense node SN and second sense potential L5. Transistors 809 and 810 are connected in series between inverted sense node /SN and second sense potential L5.

Each of transistors 806, 807 and 808 receives on its gate electrode the potential of second equalizing line L6. Each of transistors 808 and 810 receives on its gate electrode the potential of sense amplifier select line L1.

Transistors 813 and 811 are connected in series between sense node SN and first sense potential line L4. Between transistor 813 and first sense potential line L4 is connected transistor 812 in parallel to transistor 811. Between inverted sense node /SN and transistors 811 and 813 is connected transistor 814 in parallel to transistor 812.

Transistor 812 receives on its gate electrode the potential of sense amplifier select line L1. Transistor 811 receives on its gate electrode the potential of sense amplifier activating line L3. Transistor 813 receives on its gate electrode the potential of inverted sense node /SN. Transistor 814 receives on its gate electrode the potential of sense node SN.

In the sense amplifier thus constructed, transistors 801 and 802 form a PMOS sense portion. Also, transistors 803–805 form an equalize portion. Transistors 806–810 form a precharge portion. Transistors 811–814 form an NMOS sense portion.

Figure 37:
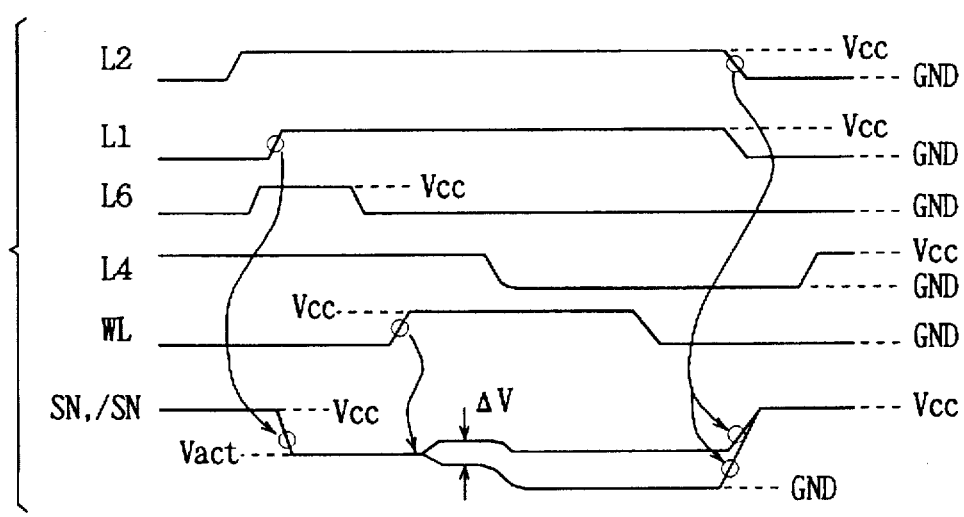
FIG. 37 is a timing chart showing operation waveforms of respective portions during amplification by an NMOS sense portion of the sense amplifier in FIG. 36.

The operation of the sense amplifier will be described below. FIG. 37 is a timing chart showing operation waveforms of respective portions during amplification by the NMOS sense portion of the sense amplifier in FIG. 37.

In the following operation, second sense potential line L5 and third sense potential line L8 are fixed at a potential Vact intermediate ground potential GND and power supply potential Vcc. The equalize potential line L7 is fixed at the level of power supply potential Vcc.

In the operation, first and second equalizing lines L2 and L6 are first raised to the H-level. Thereby, the equalized state of sense node SN and inverted sense node /SN is released. Sense amplifier select line L1 is raised to the H-level. Thereby, the potentials of sense node SN and inverted sense node /SN are set to the level of potential Vact while being kept at the equalized state.

By lowering of second equalizing line L6 to the L-level, the equalized state of sense node SN and inverted sense node /SN are released. Thereafter, word line WL is raised to the H-level (Vpp). Thereby, potential difference ΔV occurs between sense node SN and inverted sense node /SN. Thereafter, first sense potential line L4 is lowered to the L-level. Thereby, the NMOS sense portion amplifies potential difference ΔV.

After lowering of word line WL, both the levels of first equalizing line L2 and sense amplifier select line L1 are lowered. Thereby, sense node SN and inverted sense node /SN are restored to the level of power supply potential Vcc.

Figure 38:
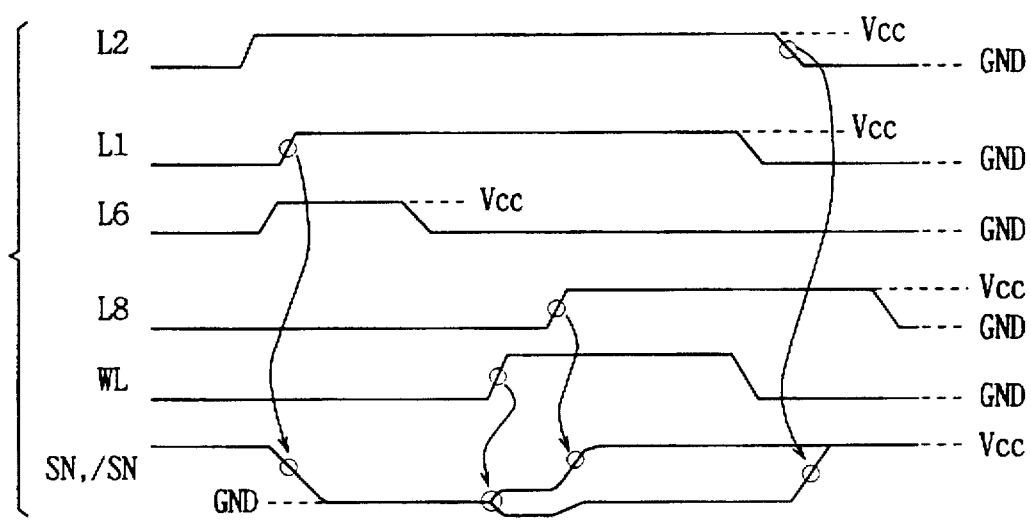
FIG. 38 is a timing chart showing operation waveforms of respective portions during amplification by a PMOS sense portion of the sense amplifier in FIG. 36.

Then, description will be given on the operation of the sense amplifier for amplification by the PMOS sense portion. FIG. 38 is a timing chart showing operation waveforms of respective portions during amplification by the PMOS sense portion of the sense amplifier in FIG. 36.

In the following operation, first and second sense potential lines L4 and L5 each are fixed at ground potential GND. Equalize potential line L7 is fixed at the level of power supply potential Vcc.

The operation in FIG. 38 differs from the operation in FIG. 37 in the following point. In response to the rising of sense amplifier select line L1, the potentials of sense node SN and inverted sense node /SN are set to the level of ground potential GND while being kept at the equalized state. Further, by raising the potential of third sense potential line L8 to the H-level, the PMOS sense portion amplifies potential difference ΔV.

Thereafter, word line WL is lowered, and then both the potentials of first equalizing line L2 and sense amplifier select line L1 are lowered. Thereby, sense node SN and inverted sense node /SN are restored to the level of power supply potential Vcc.

In the sense amplifier in FIG. 36, the P-channel MOS transistors and the N-channel MOS transistors may be replaced with each other. In this case, the operation already described is performed with the opposite polarities, whereby the sense amplifier performs a similar operation. Further, only transistors 803–805 may be replaced with N-channel MOS transistors. In this case, first equalizing line L2 may be operated with the polarities opposite to those described above, whereby a similar operation can be executed.

The sense amplifier in FIG. 36 can perform a similar operation even if transistor 806 is not provided. If the sense amplifier includes transistor 806, it can perform a similar operation without transistor 803.

Thirtieth Embodiment

A thirtieth embodiment will be described below. The following description of the thirtieth embodiment relates to an example of a structure of a DRAM allowing selective operation of sense amplifiers.

Figure 39:
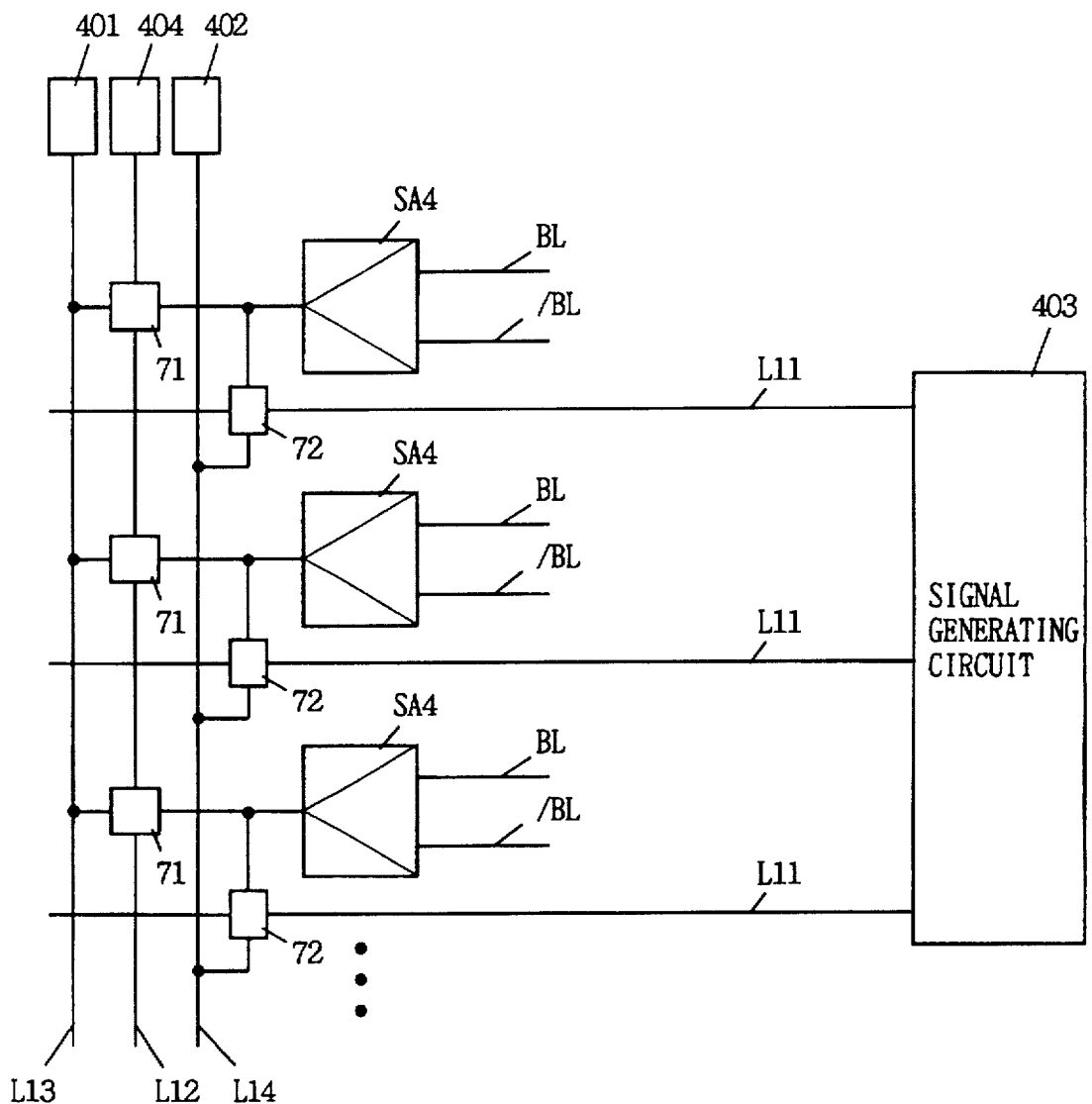
FIGS. 39 through 51 are circuit diagrams showing structures of circuits controlling sense amplifiers in DRAMs of 30th through 42nd embodiments, respectively.

FIG. 39 is a circuit diagram showing a structure of a circuit for controlling sense amplifiers in the DRAM of the thirtieth embodiment. Referring to FIG. 39, the circuit includes a plurality of sense amplifiers SA4, a plurality of bit line pairs BL and /BL, a plurality of switches 71 and 72, a plurality of sense amplifier select lines L11, a sense amplifier activating line L12, and potential supply lines L13 and L14.

Sense amplifier select lines L11 are provided correspondingly to sense amplifiers SA4, and each are arranged in parallel to bit line pair BL and /BL. Sense amplifier activating line L12, and potential supply lines L13 and L14 are arranged in a direction crossing bit line pair BL and /BL.

Sense amplifier select lines L11 are selectively activated by a signal generating circuit 403 in the read operation. Sense amplifier select line L12 is activated by a signal generating circuit 404 in the refresh operation. Potential supply line L13 is supplied from a potential supply circuit 401 with a first sense potential to be used in the refresh operation. Potential supply line L14 is supplied from a potential supply circuit 402 with a second sense potential to be used in the read (or write) operation.

Switches 71 are provided correspondingly to sense amplifiers SA4, respectively. Each switch 71 receives the potentials of sense amplifier activating line L12 and potential supply line L13. Each switch 71 supplies the first sense potential of potential supply line L13 to the corresponding sense amplifier SA4 when sense amplifier activating line L12 is activated.

Switches 72 are provided correspondingly to sense amplifiers SA4, respectively. Each switch 72 receives the potentials of sense amplifier select line L11 and potential supply line L14. Each switch 72 supplies the second sense potential of potential supply line L14 to corresponding sense amplifier SA4 when sense amplifier select line L11 is activated.

According to the thirtieth embodiment, therefore, all the sense amplifiers are activated in the refresh operation, and the sense amplifiers are selectively activated in the read (or write) operation. Therefore, the structure of the thirtieth embodiment can be used as a structure for controlling the sense amplifiers in the embodiments already described.

Further, according to the thirtieth embodiment, the sense potential in the refresh operation is at the level different from that in the read (write) operation, whereby the amplitude voltage of the bit line pair in the refresh operation can be different from that in the read (or write operation), as is done in the twenty-fourth and twenty-fifth embodiments.

Thirty-first Embodiment

A thirty-first embodiment will be described below. The following description of the thirty-first embodiment relates to a modification of the thirtieth embodiment.

Figure 40:
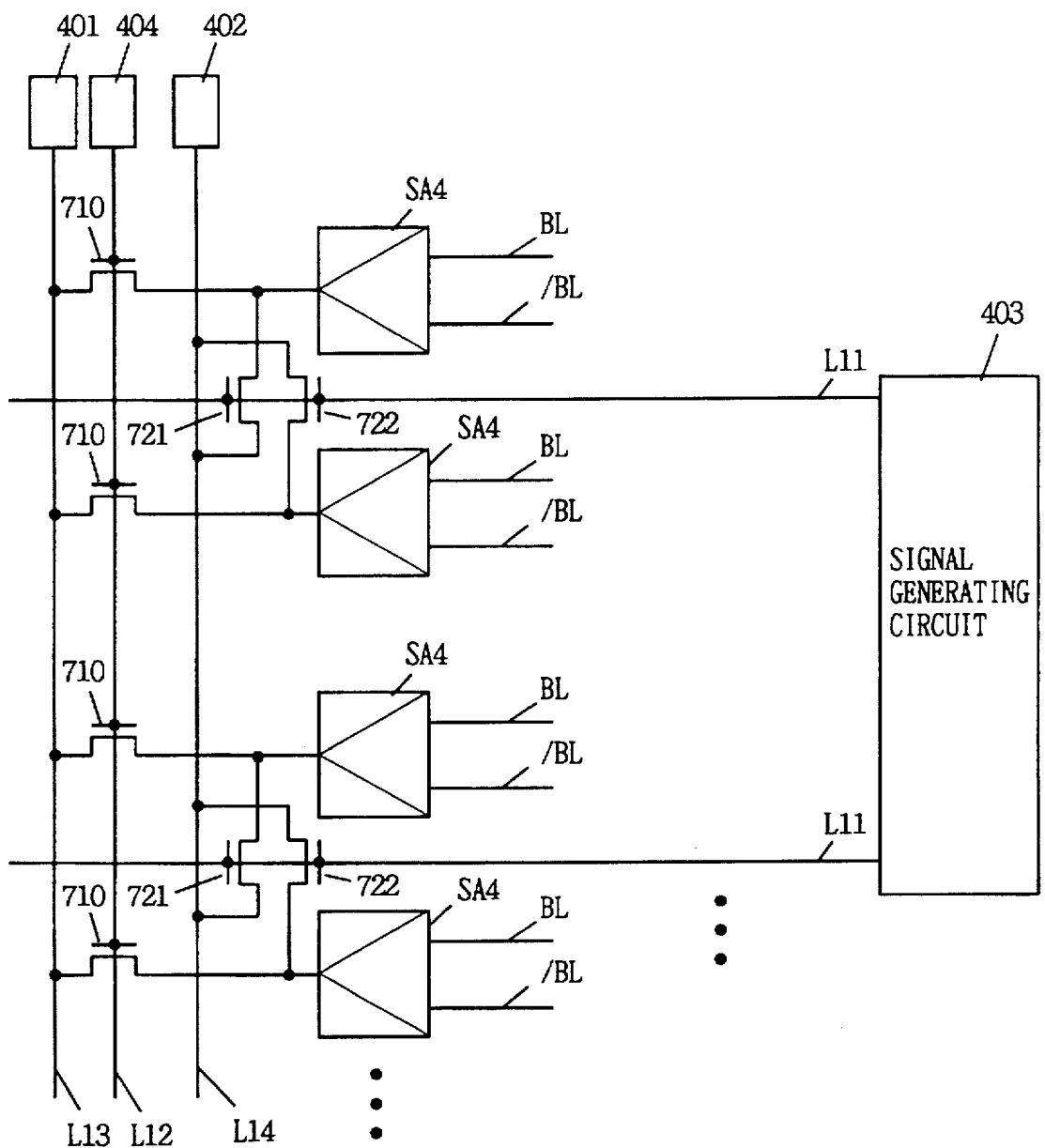

FIG. 40 is a circuit diagram showing a structure of a circuit for controlling sense amplifiers in a DRAM of the thirty-first embodiment. In FIG. 40, portions similar to those in FIG. 39 bear the same reference numbers, and will not be described below.

The structure in FIG. 40 differs from that in FIG. 39 in the following point. Switches 71 in FIG. 39 are replaced with switches 710 each formed of an NMOS transistor, and switches 72 in FIG. 39 are replaced with switches 721 and 722 each formed of an N-channel MOS transistor. Switch 721 corresponds to one of adjacent sense amplifiers SA4, and switch 722 corresponds to the other.

Switches 721 and 722 in each set receive the potential of sense amplifier select line L11 commonly used by adjacent sense amplifiers SA4, and each supply the second sense potential of potential supply line L14 to corresponding sense amplifier SA4 when the sense amplifier select line L11 is activated.

The thirty-first embodiment can achieve the following effect in addition to the effect achieved by the thirtieth embodiment. Since each sense amplifier select line L11 is commonly used by adjacent sense amplifiers SA4, sense amplifier select lines L11 can be smaller in number than those in the thirtieth embodiment.

Thirty-second Embodiment

A thirty-second embodiment will be described below. The following description of the thirty-second embodiment relates to an example in which the potential supplied from one potential supply line is used as a sense potential in the refresh and read (or write) operations.

Figure 41:
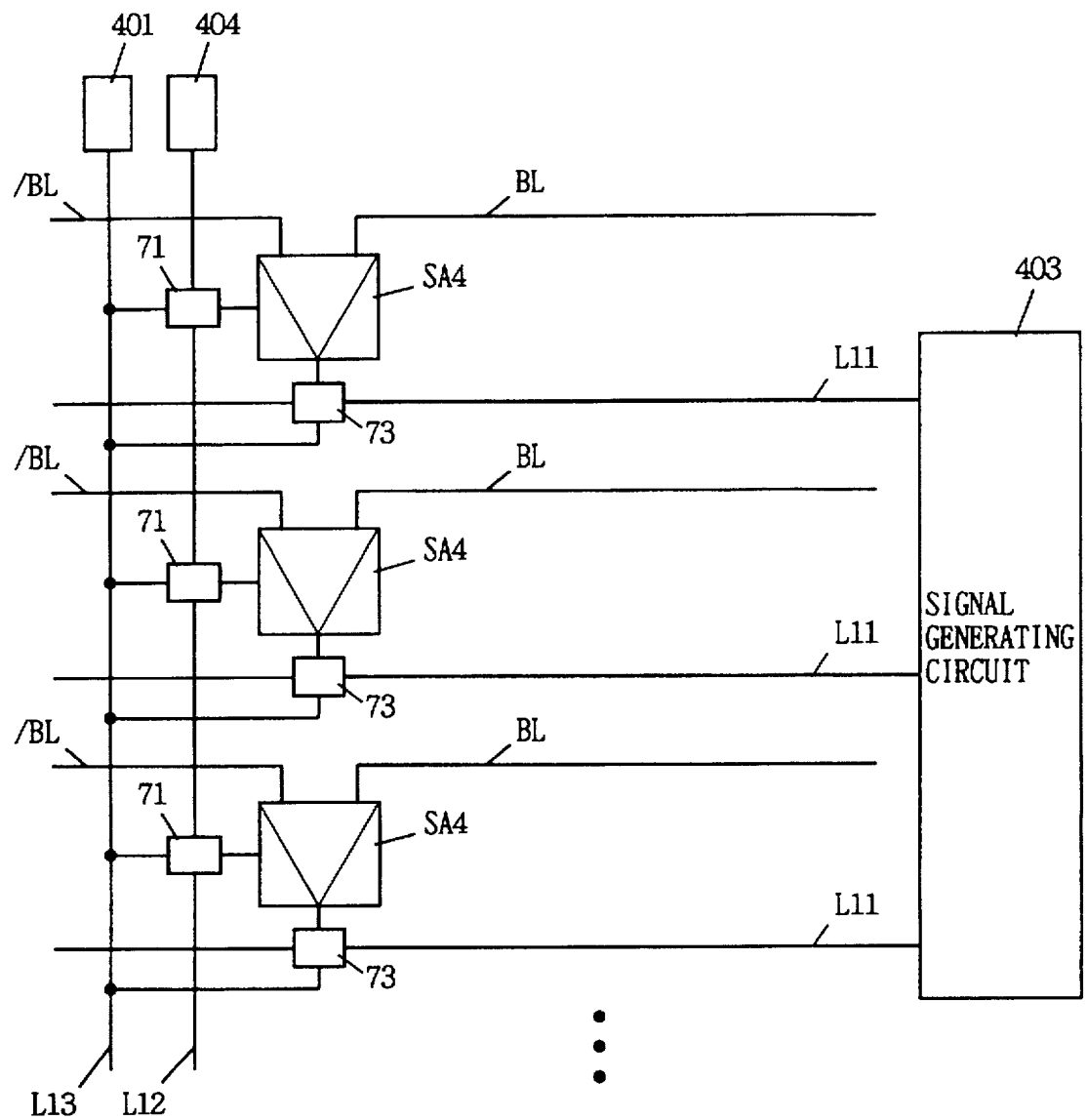

FIG. 41 is a circuit diagram showing a structure of a circuit for controlling sense amplifiers in a DRAM of the thirty-second embodiment. In FIG. 41, portions similar to those in FIG. 39 bear the same reference numbers, and will not be described below.

The structure in FIG. 41 differs from that in FIG. 39 in the following point. Only potential supply line L13 is provided as the potential supply line for supplying the sense potential. Switches 72 in FIG. 39 are replaced with switches 73.

Switches 73 are provided correspondingly to sense amplifiers SA4, respectively. Each switch 73 receives the potential of sense amplifier select line L11 and the potential of potential supply line L13. Each switch 73 supplies the sense potential supplied from potential supply line L13 to corresponding sense amplifier SA4 when corresponding sense amplifier select line L11 is activated.

According to the thirty-second embodiment, therefore, all the sense amplifiers are activated in the refresh operation, and the sense amplifiers are selectively activated in the read operation. Therefore, the structure of the thirty-second embodiment can be used as a structure for controlling the sense amplifiers in the embodiments already described.

Further, according to the thirty-second embodiment, the potential supplied from potential supply circuit 401 to potential supply line L13 in the refresh operation is at the level different from that in the read (write) operation, whereby the amplitude voltage of the bit line pair in the refresh operation can be different from that in the read (or write operation), as is done in the twenty-fourth and twenty-fifth embodiment. Further, only one potential supply line is provided for supplying the sense potential, so that the number of lines can be smaller that in the thirtieth embodiment.

Thirty-third Embodiment

A thirty-third embodiment will be described below. The following description of the thirty-third embodiment relates to an example in which sense amplifiers are selected by potential supply lines supplying sense potentials.

Figure 42:
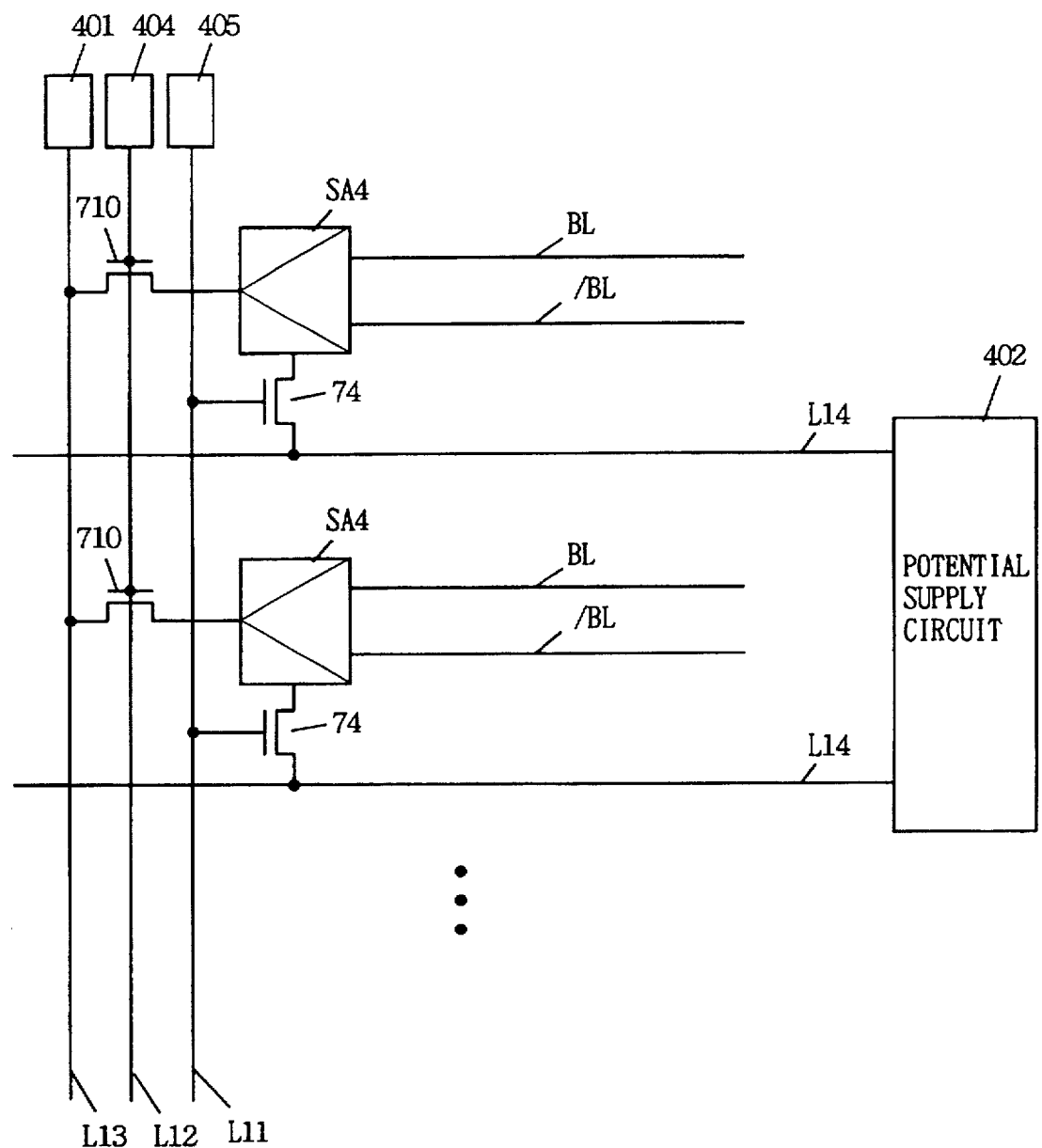

FIG. 42 is a circuit diagram showing a structure of a circuit for controlling sense amplifiers of a DRAM of the thirty-third embodiment. In FIG. 42, portions similar to those in FIG. 39 bear the same reference numbers, and will not be described below.

The structure in FIG. 42 differs from that in FIG. 39 in the following point. Sense amplifier select line L11 is arranged in a direction crossing bit line pair BL and /BL. Sense amplifier select line L11 is activated by a signal generating circuit 405 in the read (or write) operation.

A plurality of potential supply lines L14 for supplying the second sense potential are provided correspondingly to sense amplifiers SA4, respectively. Potential supply lines L14 are arranged in parallel to bit line pairs BL and /BL. In the read (write) operation, potential supply lines L14 are selectively supplied with the second sense potential from potential supply circuit 402.

Switches 74 are provided correspondingly to sense amplifiers SA4. Each switch 74 is formed of an N-channel MOS transistor, and is arranged between corresponding sense amplifier SA4 and corresponding potential supply line L14.

Each switch 74 receives on its gate electrode the potential of sense amplifier select line L11, and supplies the potential of potential supply line L14 to corresponding sense amplifier SA4 when sense amplifier select line L11 is activated. Switch 710 supplying the sense potential sent from potential supply line L13 has the same structure as that shown in FIG. 40.

According to the thirty-third embodiment, therefore, all the sense amplifiers are activated in the refresh operation, and the sense amplifiers are selectively activated in the read (or write) operation. Further, the sense potential in the refresh operation is set to a potential different from that in the read (write) operation.

Accordingly, the structure of the thirty-third embodiment can achieve an effect similar to that of the thirtieth embodiment. Further, according to the thirty-third embodiment, the sense amplifiers can be selected by the potential supply lines L14 in the read (or write) operation.

Thirty-fourth Embodiment

A thirty-fourth embodiment will be described below. The following description of the thirty-fourth embodiment relates to an example in which the sense amplifiers are selected by a plurality of sense amplifier activating lines arranged in a row direction.

Figure 43:
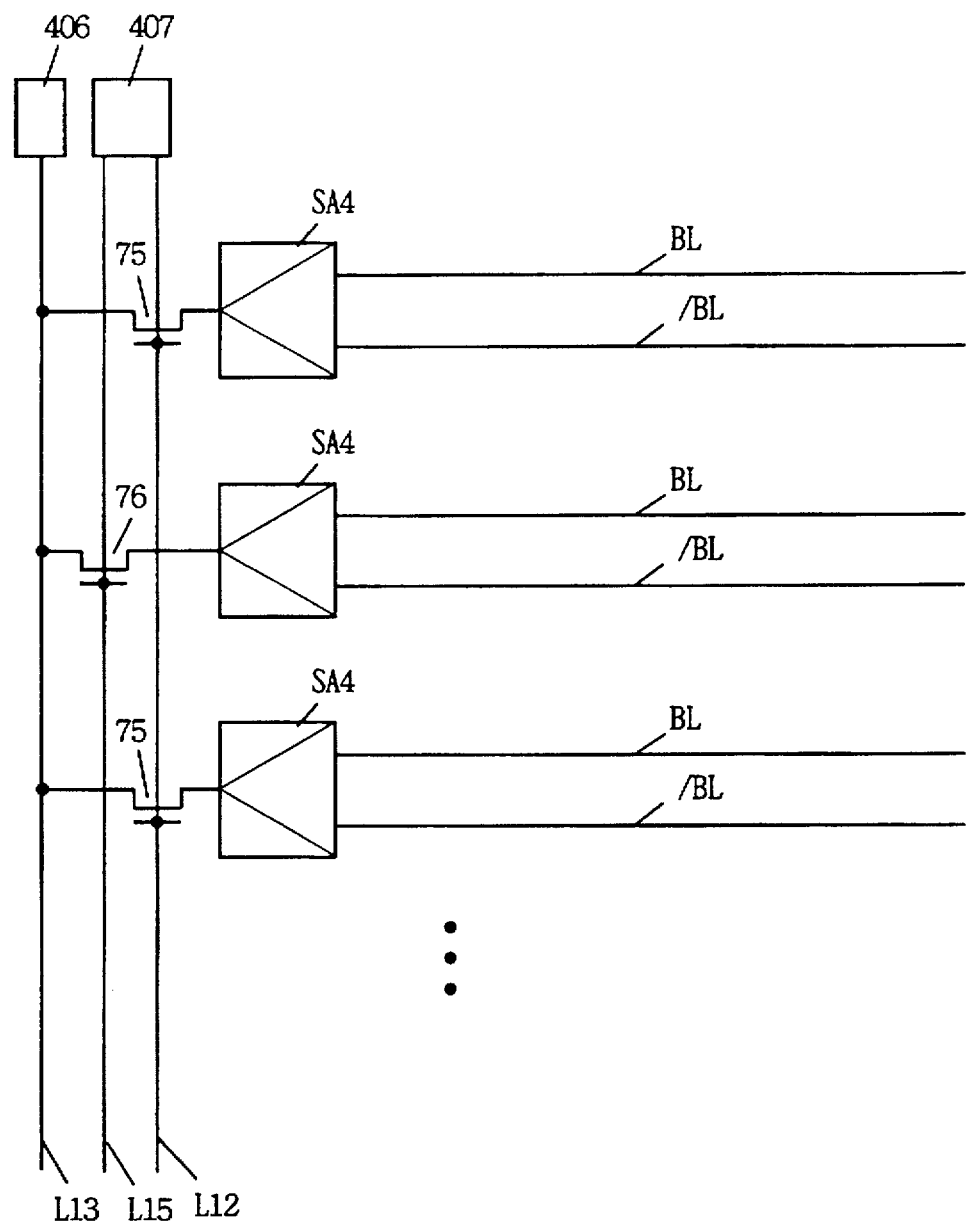

FIG. 43 is a circuit diagram showing a structure of a circuit for controlling sense amplifiers of a DRAM of the thirty-fourth embodiment.

Referring to FIG. 43, first and second sense amplifier activating lines L12 and L15 as well as potential supply line L13 are arranged in a direction crossing bit line pairs BL and /BL.

Potential supply line L13 is supplied with a sense potential from potential generating circuit 406. The potentials of sense amplifier activating lines L12 and L15 are controlled by signal generating circuit 407. More specifically, both sense amplifier activating lines L12 and L15 are activated in the refresh operation, and sense amplifier activating lines L12 and L15 are selectively activated in the read (write) operation.

A plurality of switches 75 and 76 corresponding to sense amplifiers SA4 aligned in one direction are arranged alternately to each other. More specifically, each switch 75 is provided correspondingly to one of adjacent two sense amplifiers SA4, and switch 76 is arranged correspondingly to the other.

Each of switches 75 and 76 is formed of an N-channel MOS transistor. Each switch 75 is arranged between corresponding sense amplifier SA4 and potential supply line L13, and receives on its gate electrode the potential of sense amplifier activating line L12. Each switch 76 is arranged between corresponding sense amplifier SA4 and potential supply line L13, and receives on its gate electrode the potential of sense amplifier activating line L15.

According to the above structure, both sense amplifier activating lines L12 and L15 are activated to supply the sense potential to all the sense amplifiers in the refresh operation, so that all sense amplifiers are activated. In the read (write) operation, sense amplifier activating lines L12 and L15 are selectively activated to supply the sense potential to alternate sense amplifiers SA4, so that sense amplifiers SA4 are selectively activated.

According to the thirty-fourth embodiment, therefore, the sense amplifiers can be selected by the plurality of sense amplifier activating lines arranged in the row direction. Further, the potential supplied to potential supply line L13 from potential supply circuit 406 in the refresh operation is set to a level different from that in the read (write) operation, whereby the amplitude voltage of the bit line pair in the refresh operation can be different from that in the read (or write) operation, as is done in the twenty-fourth and twenty-fifth embodiments.

Thirty-fifth Embodiment

A thirty-fifth embodiment will be described below. The following description of the thirty-fifth embodiment relates to an example in which sense amplifiers are selected by a plurality of potential supply lines which are arranged in the row direction for supplying the sense potential.

Figure 44:
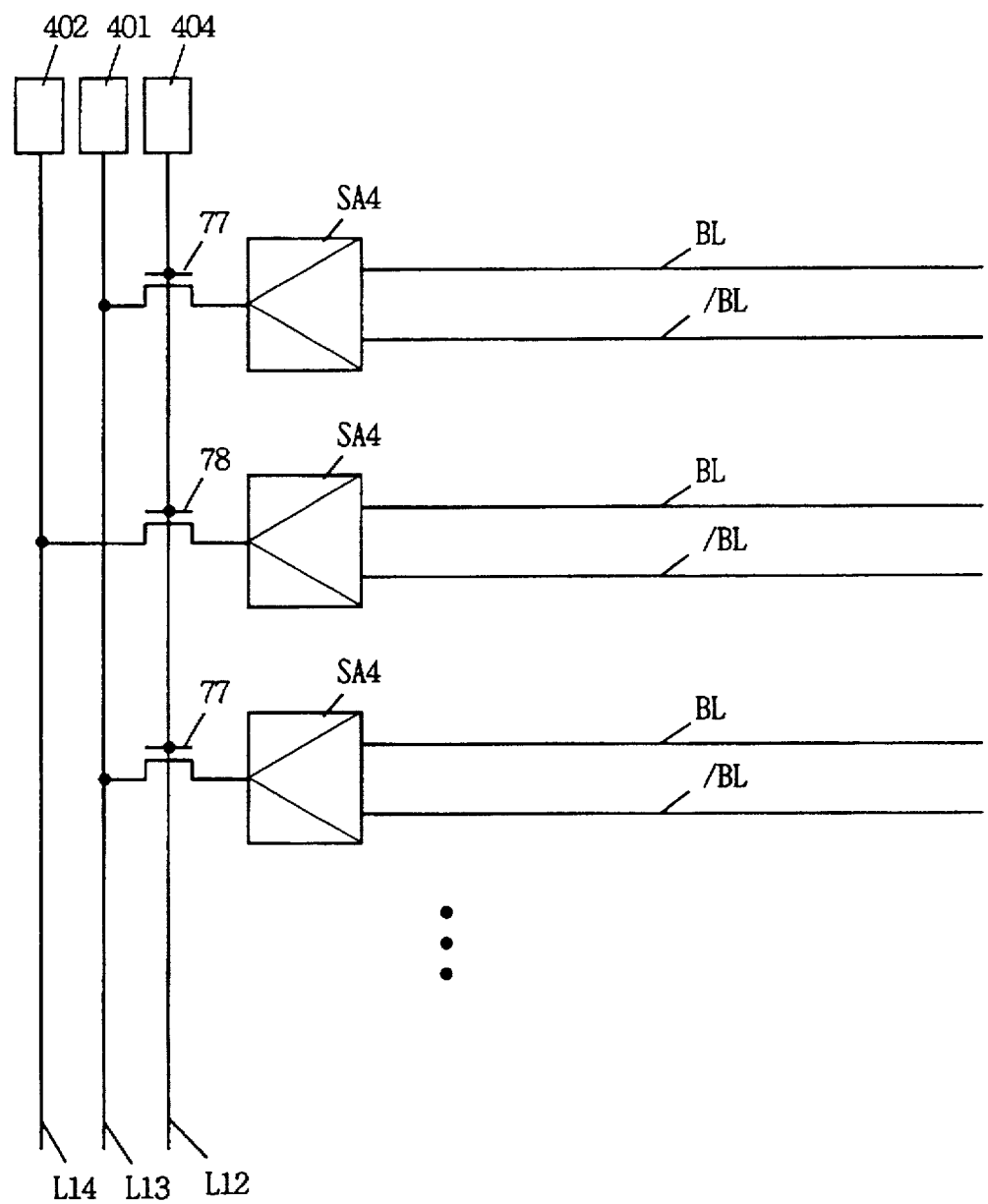

FIG. 44 is a circuit diagram showing a structure of a circuit for controlling sense amplifiers in a DRAM of the thirty-fifth embodiment.

Referring to FIG. 44, there are provided a switch 77 corresponding to one of adjacent sense amplifiers SA4 as well as a switch 78 corresponding to the other. Thus, there are provided the plurality of switches 77 and the plurality of switches 78. Each of switches 77 and 78 is formed of an N-channel MOS transistor.

Each switch 77 is connected between potential supply line L13 and corresponding sense amplifier SA4, and receives on its gate electrode the potential of sense amplifier activating line L12. Each switch 78 is connected between potential supply line L14 and corresponding sense amplifier SA4, and receives on its gate electrode the potential of sense amplifier activating line L12. Sense amplifier activating line L12 is activated to the H-level in both the refresh operation and read (write) operation.

In the refresh operation, both potential supply lines L13 and L14 are supplied with the sense potential. Meanwhile, in the read (write) operation, one of potential supply lines L13 and L14 is supplied with the sense potential from the corresponding potential supply line.

In the refresh operation, therefore, all sense amplifiers SA4 are supplied with the sense potential, so that all sense amplifiers SA4 are activated. Meanwhile, in the read (write) operation, the sense potential is supplied only to selected sense amplifiers SA4. According to the thirty-fifth embodiment, therefore, selection of the sense amplifiers can be controlled by the plurality of potential supply lines L13 and L14.

Thirty-sixth Embodiment

A thirty-sixth embodiment will be described below. The following description of the thirty-sixth embodiment relates to an example based on the thirty-fourth embodiment and including transfer gates which are arranged between corresponding bit line pairs and sense amplifiers, and can connect the bit line pairs to the sense amplifiers, respectively.

Figure 45:
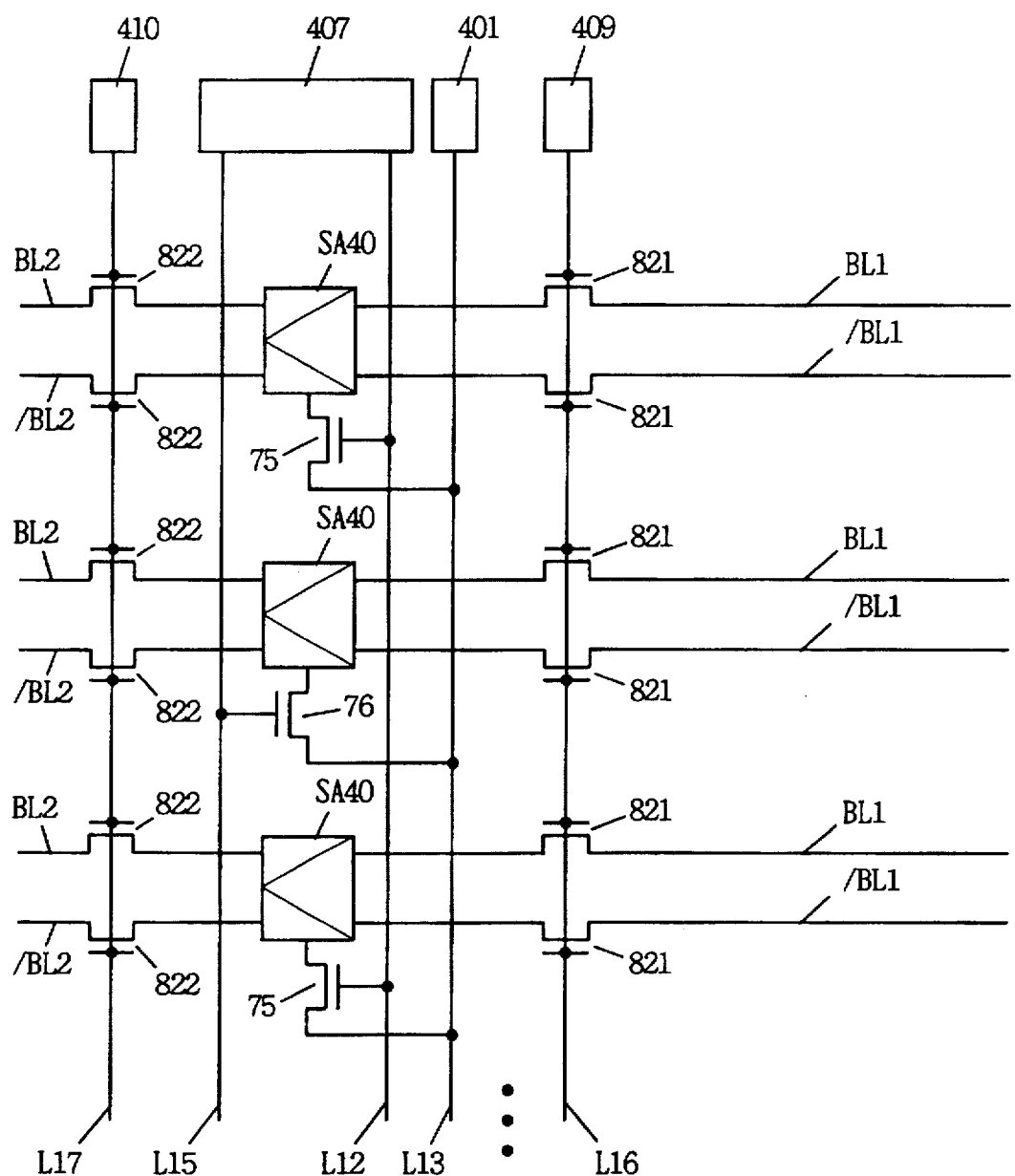

FIG. 45 is a circuit diagram showing a structure of a circuit for controlling sense amplifiers of a DRAM of the thirty-sixth embodiment. In FIG. 45, portions similar to those in FIG. 43 bear the same reference numbers, and will not be described below.

The structure in FIG. 45 has the following distinctive feature. Each sense amplifier SA40 is of a shared type. Therefore, each sense amplifier SA40 is connected to two bit line pairs BL1, /BL1 and BL2, /BL2 via transfer gates.

Between bit line pair BL1 and /BL1 and sense amplifier SA40 are connected a pair of transfer gates 821 each formed of an N-channel MOS transistor. Each transfer gate 821 receives on its gate electrode a potential of a transfer gate activating line L16, and is controlled to be turned on/off in response to the received potential. The potential of transfer gate activating line L16 is controlled by a signal generating circuit 409, and it is activated when the potential difference of bit line pair BL1 and /BL1 is to be amplified.

Between bit line pair BL2 and /BL2 and sense amplifier SA40 are connected a pair of transfer gates 822 each formed of an N-channel MOS transistor. Each transfer gate 822 receives on its gate electrode a potential of a transfer gate activating line L17, and is controlled to be turned on/off in response to the received potential. The potential of transfer gate activating line L17 is controlled by a signal generating circuit 410, and it is activated when the potential difference of bit line pair BL2 and /BL2 is to be amplified.

As described above, an effect similar to that obtained the thirty-fourth embodiment can be obtained even in the case where the sense amplifiers are of the shared type.

Thirty-seventh Embodiment

A thirty-seventh embodiment will be described below. The following description of the thirty-seventh embodiment relates to an example in which a sense amplifier to be activated is selected by a sense amplifier select line arranged in a column direction, and the selected sense amplifier outputs data onto data line pair arranged in the column direction.

Figure 46:
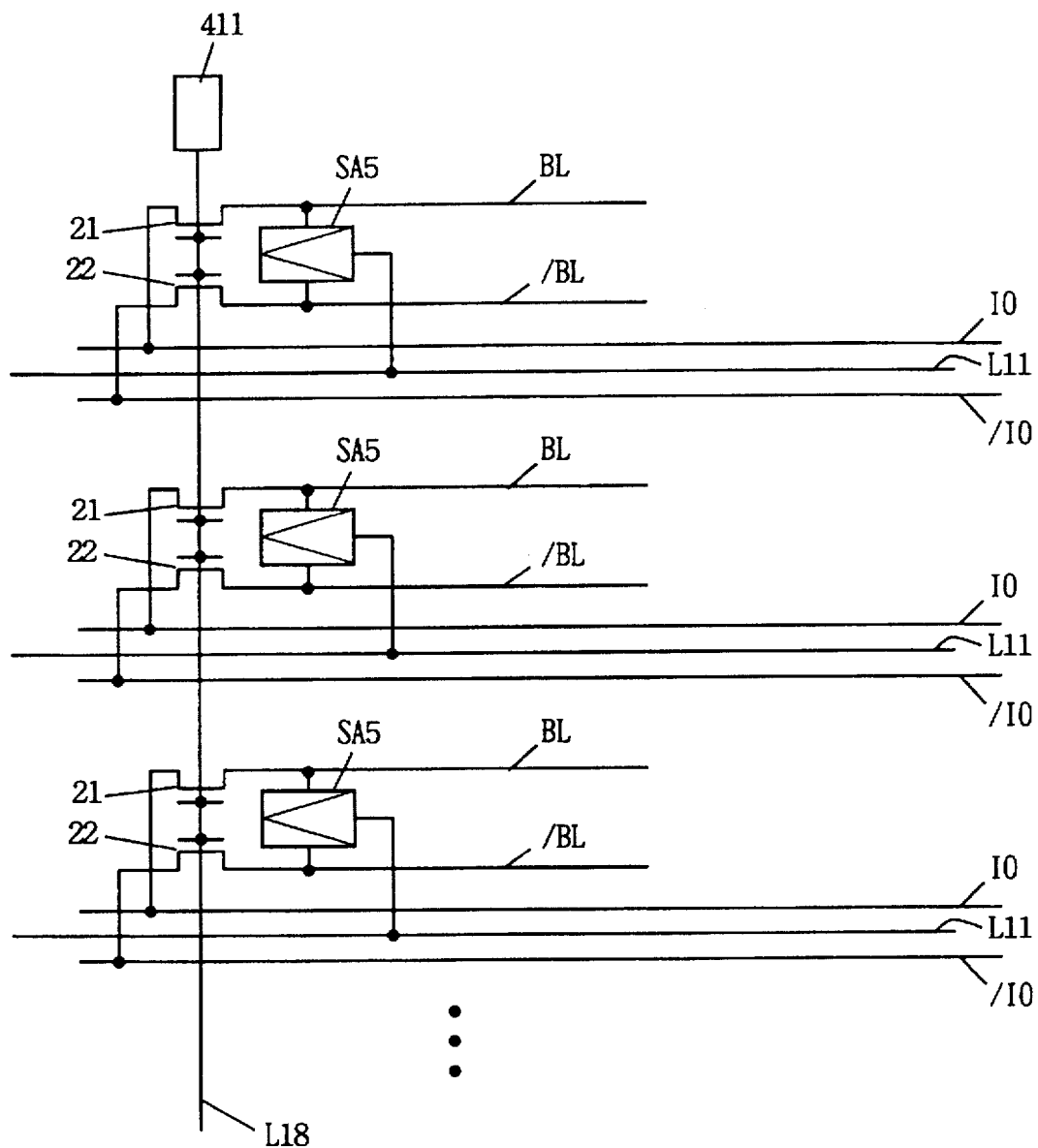

FIG. 46 is a circuit diagram showing a structure of a circuit for controlling sense amplifiers in a DRAM of the thirty-seventh embodiment.

Referring to FIG. 46, a data line pair formed of a data line IO and an inverted data line /IO is provided correspondingly to each of a plurality of sense amplifiers SA5. Data line pairs IO and /IO are parallel to bit line pairs BL and /BL and are arranged in the column direction. Sense amplifier select lines L11 are provided correspondingly to sense amplifiers SA5, respectively. Sense amplifier select lines L11 are parallel to bit line pairs BL and /BL, and are arranged in the column direction.

A pair of I/O gates 21 and 22 are connected between each sense amplifier SA5 and corresponding data line pair IO and /IO. Each of I/O gates 21 and 22 is formed of an N-channel MOS transistor, and receives on its gate electrode the potential of a transfer control line L18. The potential of transfer control line L18 is controlled by a signal generating circuit 411.

The signal generating circuit 411 activates transfer control line L18 in the data read (write) operation. Thereby, each I/O gate pair 22 and 23 are turned on, and data amplified by corresponding sense amplifier SA5 is transmitted onto data line pair IO and /IO.

Sense amplifiers SA5 are selectively activated in response to selective activation of sense amplifier select lines L11. Thereby, the potential difference of bit line pair BL and /BL corresponding to selected sense amplifier SA5 is amplified. Meanwhile, a potential difference hardly occurs at bit line pairs BL and /BL corresponding to unselected sense amplifiers SA5.

When transfer control line L18 is activated, therefore, I/O gates 21 and 22 are turned on, but effective data is transmitted only onto data line pair IO and /IO corresponding to selected sense amplifier SA5.

According to the thirty-seventh embodiment, as described above, sense amplifiers SA5 can be selectively activated by sense amplifier select lines L11. Further, sense amplifier select lines L11 can act also as the column select lines used in the conventional DRAM. Therefore, data can be read efficiently onto the data line pairs.

Thirty-eighth Embodiment

A thirty-eighth embodiment will be described below. The following description of the thirty-eighth embodiment relates to an example in which a sense amplifier to be activated is selected by sense amplifier select lines arranged in the column direction, and the selected sense amplifier outputs data onto data line pair arranged in the row direction.

Figure 47:
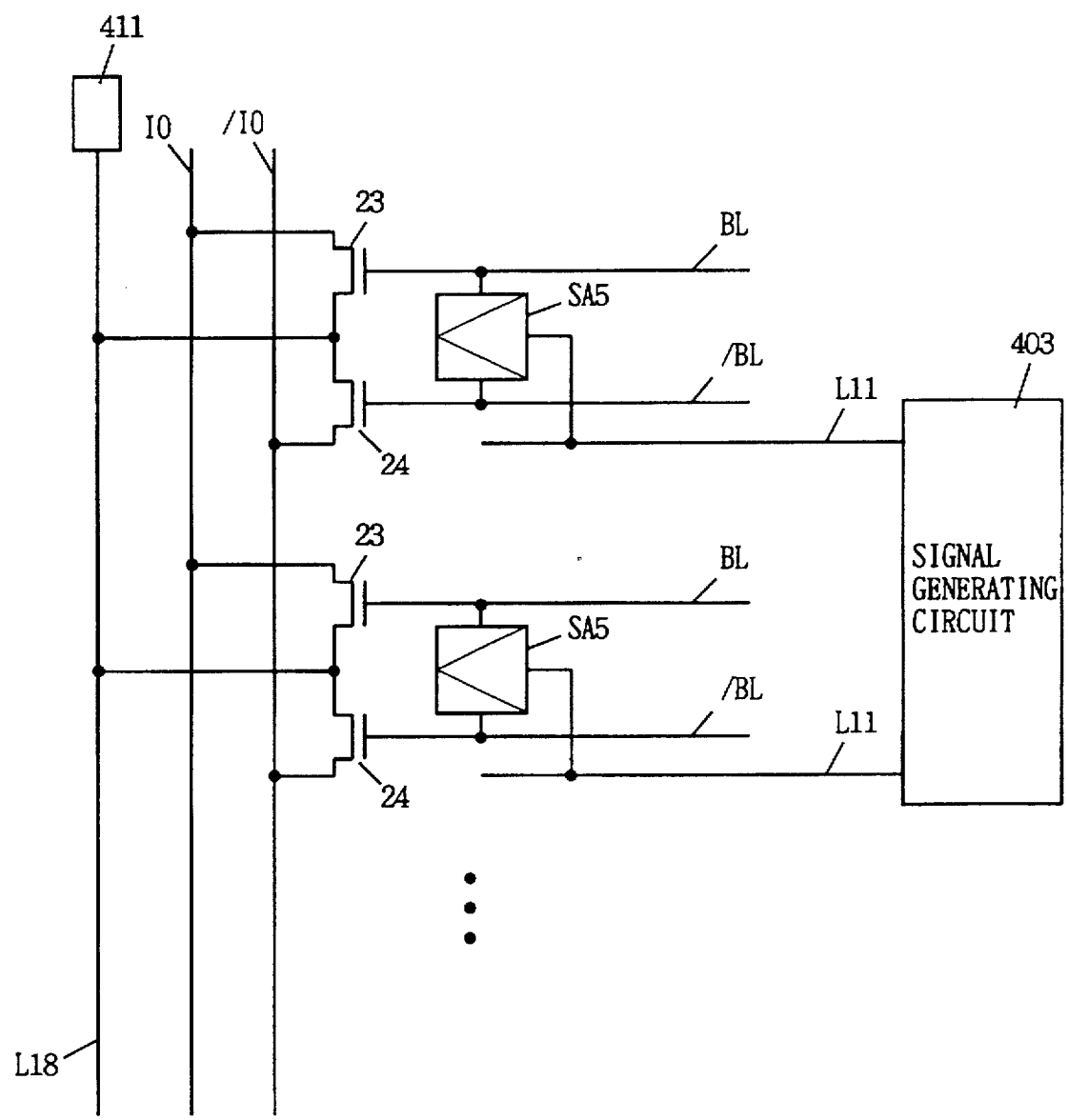

FIG. 47 is a circuit diagram showing a structure of a circuit for controlling sense amplifiers of a DRAM of the thirty-eighth embodiment. In FIG. 47, portions similar to those in FIG. 46 bear the same reference numbers, and will not be described below.

The structure in FIG. 47 differs from that in FIG. 46 in the following point. Data line pair IO and /IO is arranged in the direction crossing bit line pair BL and /BL, i.e., in the row direction. Data line pair IO and /IO is provided correspondingly to the plurality of sense amplifiers SA5. A pair of I/O gates 23 and 24 are arranged between each sense amplifier SA5 and data line pair IO and /IO.

Each of I/O gates 23 and 24 is formed of an N-channel MOS transistor. I/O gate 23 is connected between data line IO and transfer control line L18. I/O gate 24 is connected between inverted data line /IO and transfer control line L18. I/O gates 23 and 24 have a common node which is connected to transfer control line L18.

I/O gate 23 operates in accordance with the potential of corresponding bit line BL received on its gate electrode. I/O gate 24 operates in accordance with the potential of corresponding inverted bit line /BL received on its gate.

In the read operation, sense amplifiers SA5 are selectively activated in response to selective activation of sense amplifier select lines L11. Activated sense amplifier SA5 amplifies the potential difference of corresponding bit line pair BL and /BL.

When transfer control line L18 is activated, one of I/O gates 23 and 24 corresponding to sense amplifier SA5, which is selected in response to this activation, is turned on, and data on bit line pair BL and /BL of which potential difference has already been amplified is transmitted onto data line pair IO and /IO.

Meanwhile, I/O gates 23 and 24 connected to bit line pairs BL and /BL of which potential differences have not been amplified are not turned on in response to activation of transfer control line L18, so that data on these bit line pairs BL and /BL is not transmitted onto data line pair IO and /IO.

According to the thirty-eighth embodiment, sense amplifiers SA5 can be selectively activated by activating sense amplifier select lines L11. Further, only the data amplified by activated sense amplifier SA5 can be transmitted efficiently onto data line pair IO and /IO.

Thirty-ninth Embodiment.

A thirty-ninth embodiment will be described below. The following description of the thirty-ninth embodiment relates to another example in which a sense amplifier to be activated is selected by a sense amplifier select line arranged in a column direction, and the activated sense amplifier outputs data onto data line pair arranged in the row direction.

Figure 48:
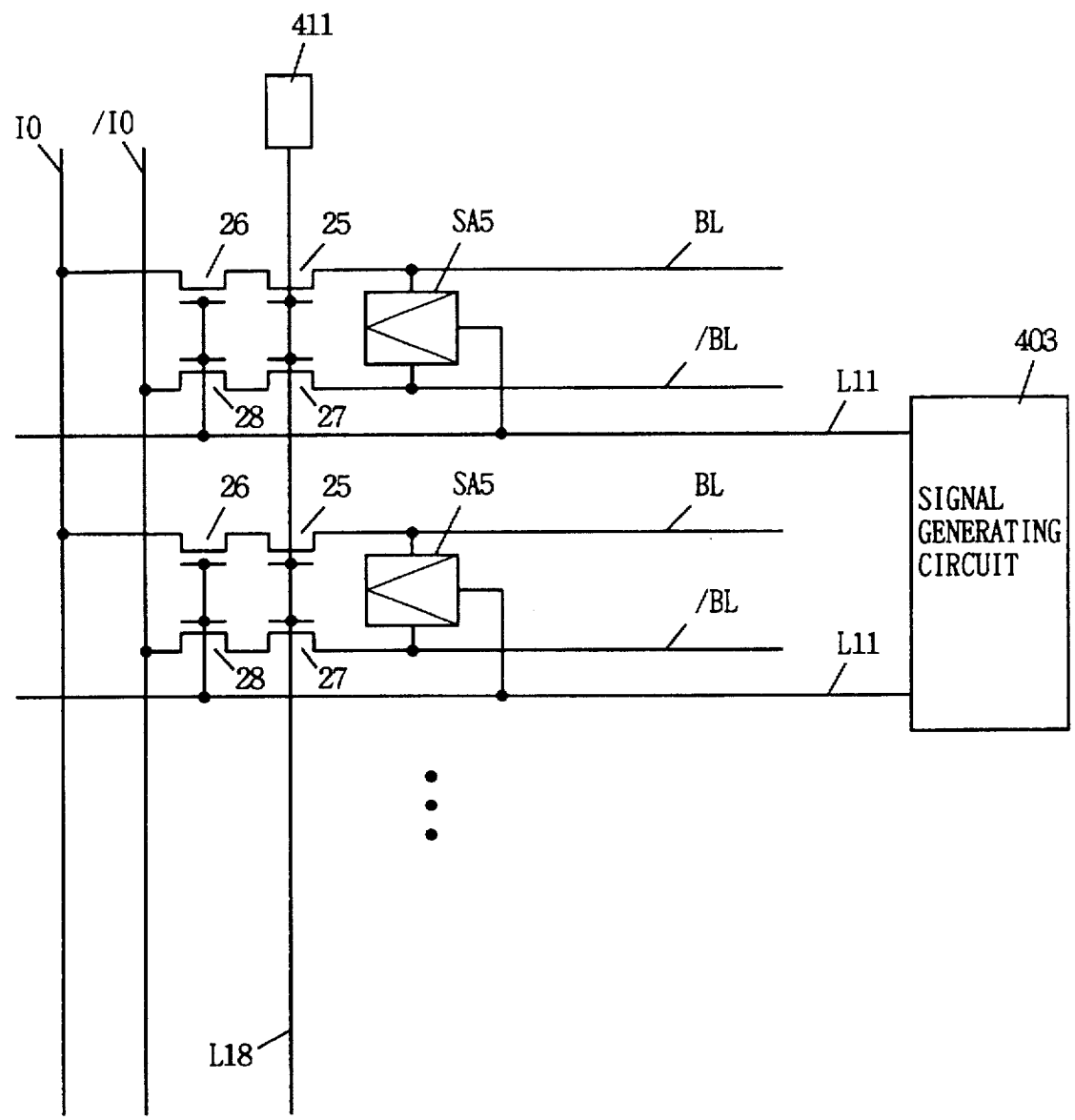

FIG. 48 is a circuit diagram showing a structure of a circuit for controlling sense amplifiers of a DRAM of the thirty-ninth embodiment.

In FIG. 48, portions similar to those in FIG. 47 bear the same reference numbers, and will not be described below.

I/O gates 25, 26, 27 and 28 are provided correspondingly to each sense amplifier SA5. Each of I/O gates 25–28 is formed of an N-channel MOS transistor. I/O gates 25 and 26 are connected in series between corresponding bit line BL and data line IO. I/O gates 27 and 28 are connected in series between corresponding inverted bit line /BL and inverted data line /IO.

Each of I/O gates 25 and 27 receives on its gate electrode the potential of transfer control line L18, and is turned on when transfer control line L18 is activated. Each of I/O gates 26 and 28 receives on its gate electrode the potential of corresponding sense amplifier select line L11, and is turned on when corresponding sense amplifier select line L11 is activated.

In the read operation, sense amplifiers SA5 are selectively activated in response to selective activation of sense amplifier select lines L11. Thereby, the potentials of bit line pair BL and /BL corresponding to activated sense amplifier SA5 are amplified. In this case, both I/O gates 26 and 28 are turned on.

In response to activation of transfer control line L18, both I/O gates 25 and 27 are turned on. As a result, only data amplified by selected sense amplifier SA5 is transmitted onto data line pair IO and /IO via the I/O gates.

According to the thirty-ninth embodiment, as described above, the sense amplifiers can be selectively activated in the read (or write) operation by selectively activating the sense amplifier select lines. Further, data amplified by the selected sense amplifier can be transmitted efficiently onto the data line pair.

Fortieth Embodiment

A fortieth embodiment will be described below. The following description of the fortieth embodiment relates to an example in which a sense amplifier to be activated is selected by a sense amplifier select line, and a bit line pair connected to the activated sense amplifier is selected by a transfer gate activating line.

Figure 49:
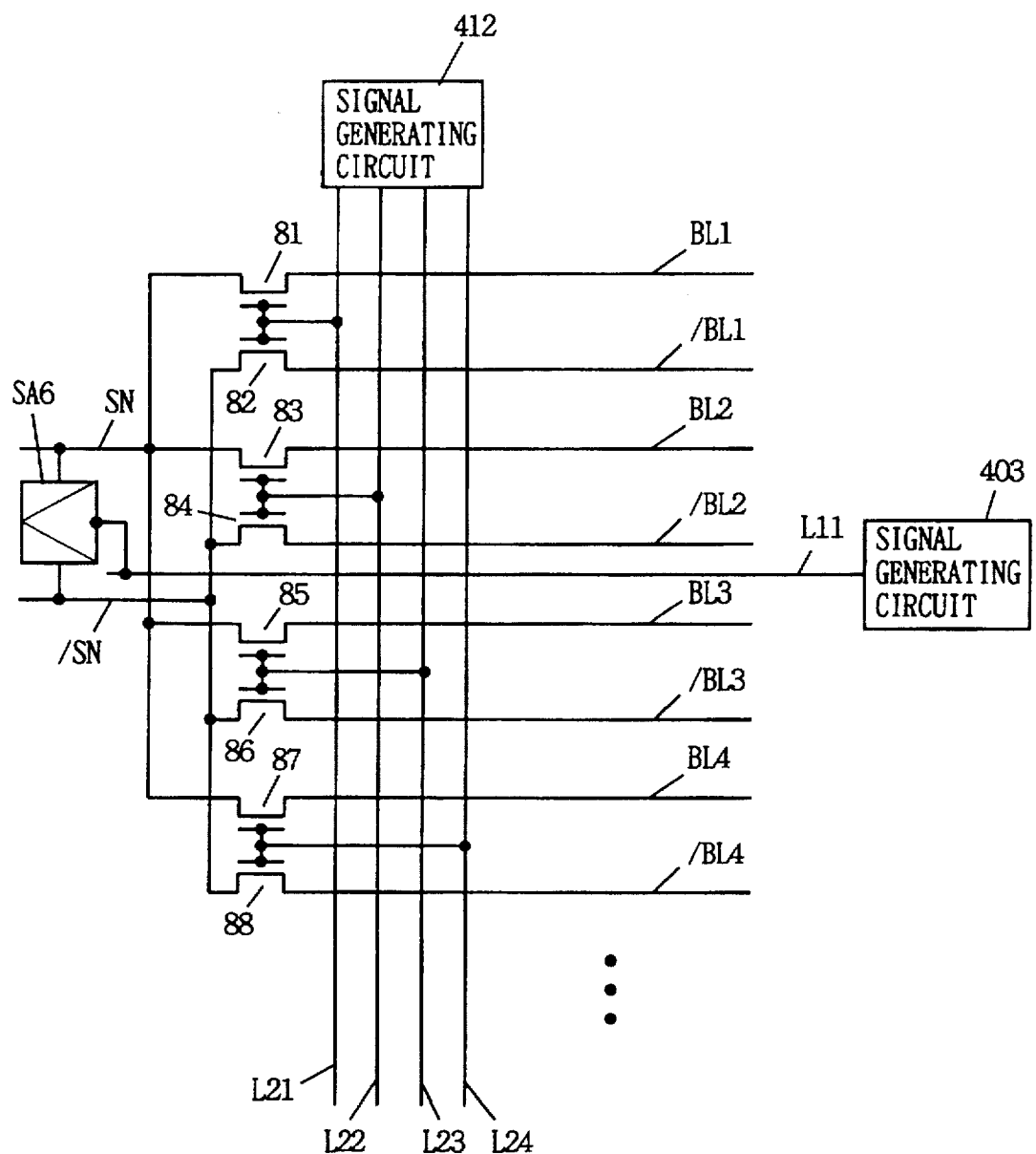

FIG. 49 is a circuit diagram showing a structure of a circuit for controlling sense amplifiers in a DRAM of the fortieth embodiment.

Referring to FIG. 49, this structure includes a plurality of bit line pairs BL1 and /BL1–BL4 and /BL4, a plurality of transfer gate activating lines L21–L24, sense amplifier select lines L11, sense amplifiers SA6, signal generating circuits 403 and a signal generating circuit 412.

Bit line pairs BL1 and /BL1–BL4 and /BL4 are arranged in parallel to each other. Transfer gates activating lines L21–L24 are arranged in a direction crossing these bit line pairs. Sense amplifier select line L11 is arrange parallel to these bit line pairs.

Transfer gate activating lines L21–L24 are selectively activated by signal generating circuit 412. Sense amplifier select line L11 is activated by signal generating circuit 403.

Bit line pair BL1 and /BL1 is connected to sense node SN and inverted sense node /SN of sense amplifier SA6 via a pair of transfer gates 81 and 82, respectively. Bit line pair BL2 and /BL2 is connected to sense node SN and inverted sense node /SN via a pair of transfer gates 83 and 84, respectively.

Bit line pair BL3 and /BL3 is connected to sense node SN and inverted sense node /SN via a pair of transfer gates 85 and 86, respectively. Bit line pair BL4 and /BL4 is connected to sense node SN and inverted sense node /SN via a pair of transfer gates 87 and 88, respectively.

Each of transfer gates 81–88 is formed of an N-channel MOS transistor. Each of transfer gates 81 and 82 receives on its gate electrode the potential of transfer gate activating line L21, and is turned on when corresponding transfer gate activating line L21 is activated.

Each of transfer gates 83 and 84 receives on its gate electrode the potential of transfer gate activating line L22, and is turned on when corresponding transfer gate activating line L22 is activated.

Each of transfer gates 85 and 86 receives on its gate electrode the potential of transfer gate activating line L23, and is turned on when corresponding transfer gate activating line L23 is activated.

Each of transfer gates 87 and 88 receives on its gate electrode the potential of transfer gate activating line L24, and is turned on when corresponding transfer gate activating line L24 is activated.

In the read (or write) operation, signal generating circuit 412 selectively activates transfer gate activating lines L21–L24. Thereby, a pair of the transfer gates corresponding to the activated transfer gate activating line are turned on. As a result, the bit line pair corresponding to the transfer gate is connected to sense node SN and inverted sense node /SN.

In the read operation (or write operation), signal generating circuit 403 selectively activates sense amplifier select lines L11. Thereby, the potential difference of selected bit line pair is amplified by sense amplifier SA6.

As described above, the potential difference of one of bit line pairs BL1 and /BL1–BL4 and /BL4 can be selectively amplified by selectively turning on one of the transfer gate pairs in the read operation (or write operation).

A conventional DRAM employing the structure shown in FIG. 49 requires restoring for all the bit line pairs in the read (or write) operation, because data is transmitted onto all the bit line pairs. In contrast to this, the fortieth embodiment requires restoring only for the selected bit line pair connected to one sense amplifier in the read (or write) operation.

The fortieth embodiment can reduce the number of sense amplifiers as compared with the prior art, and thus can ease the restrictions on the layout pitch of sense amplifiers.

The fortieth embodiment has been described in connection with the example in which four bit line pairs correspond to one sense amplifier. However, one sense amplifier may correspond to a plurality of bit line pairs other than four.

Forty-first Embodiment

A forty-first embodiment will be described below. The forty-first embodiment is a modification of the fortieth embodiment, and relates to an example in which adjacent two bit line pairs correspond to different sense amplifiers.

Figure 50:
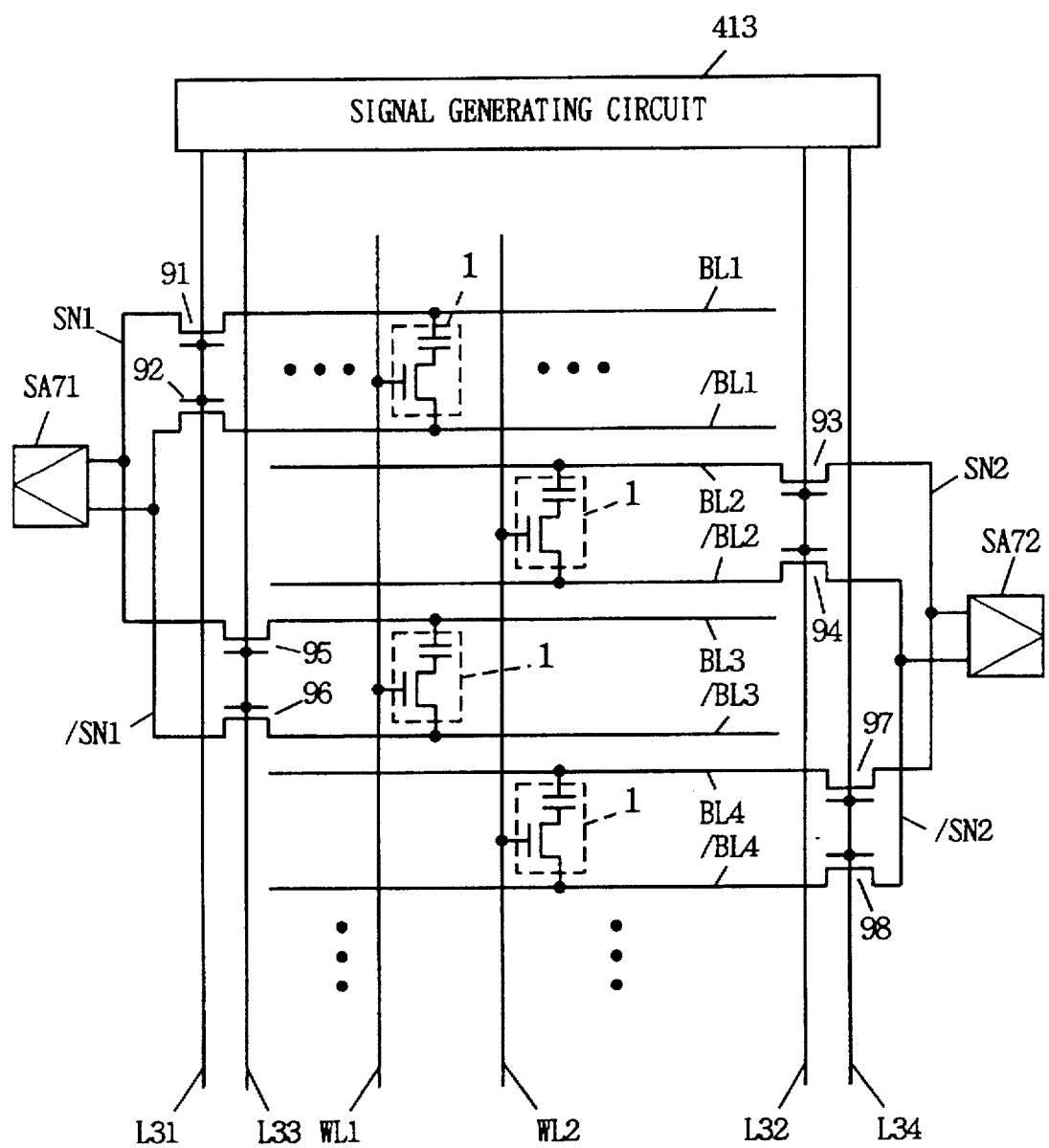

FIG. 50 is a circuit diagram showing a structure of a circuit for controlling sense amplifiers of a DRAM of the forty-first embodiment.

Referring to FIG. 50, bit line pair BL1 and /BL1 is connected to sense node SN1 and inverted sense node /SN1 of a sense amplifier SA71 via a pair of transfer gates 91 and 92. Bit line pair BL2 and /BL2 adjacent to bit line pair BL1 and /BL1 is connected to a sense node SN2 and inverted a sense node /SN2 of a sense amplifier SA72 via a pair of transfer gates 93 and 94.

Bit line pair BL3 and /BL3 adjacent to bit line pair BL2 and /BL2 is connected to sense node SN1 and inverted sense node /SN1 of sense amplifier SA71 via a pair of transfer gates 95 and 96.

Bit line pair BL4 and /BL4 adjacent to bit line pair BL3 and /BL3 is connected to sense node SN2 and inverted sense node /SN2 of sense amplifier SA72 via a pair of transfer gates 97 and 98.

As described above, adjacent bit line pairs are connectable to the different sense amplifiers, respectively. Each of transfer gates 91–98 is formed of an N-channel MOS transistor. Each of transfer gates 91 and 92 receives on its gate electrode the potential of transfer gate activating line L31, and is turned on when transfer gate activating line L31 is activated.

Each of transfer gates 95 and 96 receives on its gate electrode the potential of transfer gate activating line L33, and is turned on when transfer gate activating line L33 is activated. Each of transfer gates 93 and 94 receives on its gate electrode the potential of transfer gate activating line L32, and is turned on when transfer gate activating line L32 is activated.

Each of transfer gates 97 and 98 receives on its gate electrode the potential of transfer gate activating line L34, and is turned on when transfer gate activating line L34 is activated. These transfer gate activating lines L31–L34 are selectively activated by a signal generating circuit 413.

Memory cells 1 connected to adjacent bit line pairs (e.g., BL1 and /BL1, and BL2 and /BL2) are connected to different word lines (e.g., WL1 and WL2), respectively.

According to this structure, data of bit line pairs BL1 and /BL1–BL4 and /BL4 can be selectively amplified.

Further, they operate as follows in the refresh operation. When one word line WL1 is activated, data is read onto bit line pairs BL1 and /BL1, and BL3 and /BL3, which are not adjacent to each other. In other words, the bit line pairs onto which data is read in the refresh operation are arranged alternately to the bit line pairs onto which data is not read.

In the refresh operation, therefore, the bit line pair onto which data is not read acts as a shield against noises between two bit line pairs onto which data is read. In the refresh operation, it is possible to prevent malfunction which may be caused by capacitance coupling between the adjacent two bit line pairs.

Also, according to the forty-first embodiment, the number of sense amplifiers can be smaller than that in the prior art, so that the restrictions on the layout pitch of sense amplifiers can be eased.

Forty-second Embodiment

A forty-second embodiment will be described below. The forty-second embodiment is a modification of the forty-first embodiment, and relates to an example in which bit line pairs are paired with electrode nodes, respectively, and memory cells in adjacent columns commonly use the bit lines.

Figure 51:
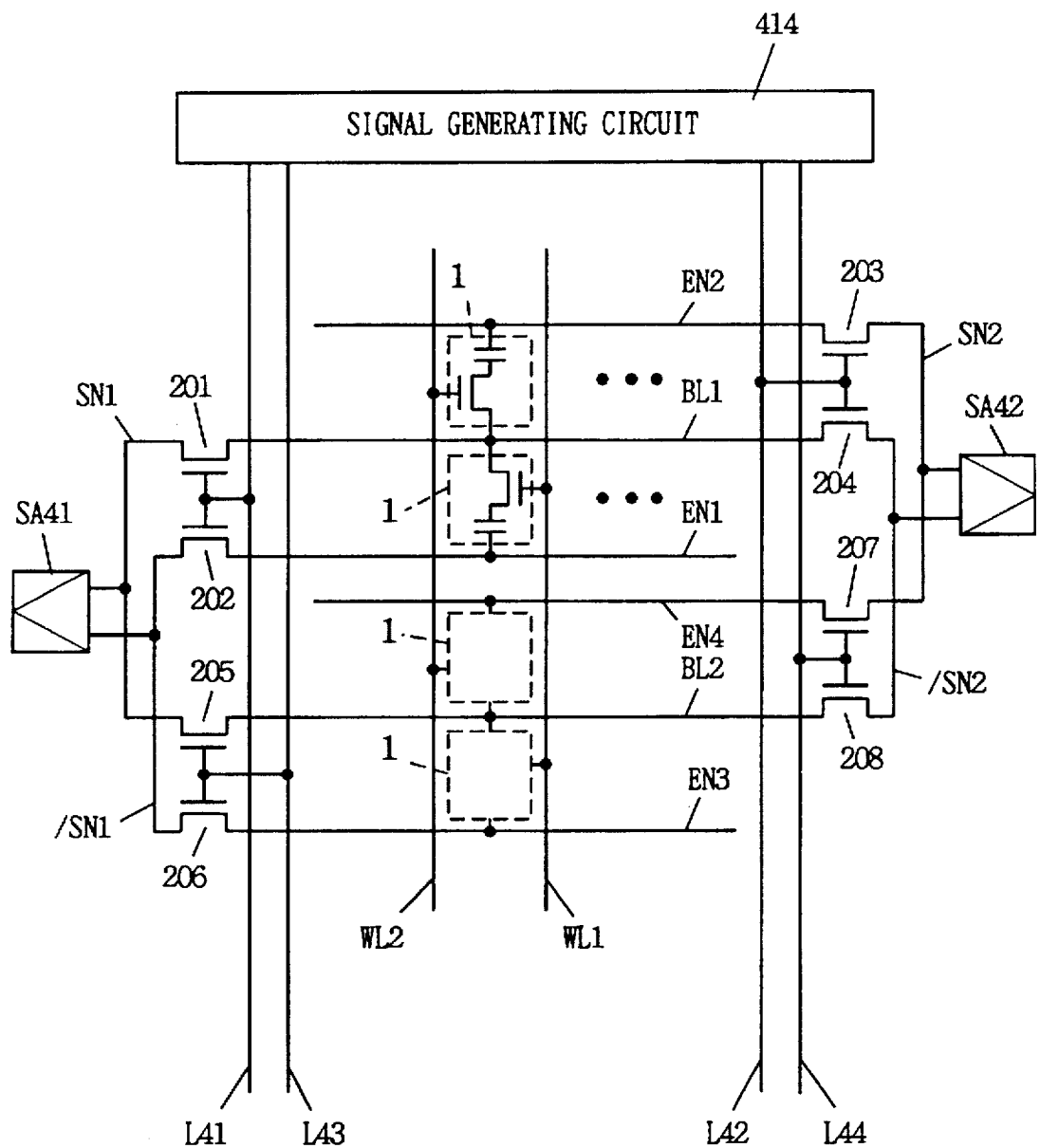

FIG. 51 is a circuit diagram showing a structure of a circuit for controlling sense amplifiers in a DRAM of the forty-second embodiment.

The structure in FIG. 51 includes a plurality of bit lines BL1, BL2, . . . . , a plurality of electrode nodes EN1–EN4, a plurality of transfer gate activating lines L41–L44, a plurality of transfer gates 201–208, a plurality of memory cells 1, a plurality of sense amplifiers SA41, SA42, . . . , and a signal generating circuit 414.

Bit lines BL1 and BL2 are parallel to each other. At opposite sides of bit line BL1, electrode nodes EN1 and EN2 are arranged parallel to bit line BL1. At opposite sides of bit line BL2, electrode nodes EN3 and EN4 are arranged parallel to bit line BL2.

Memory cells 1 are connected between bit line BL1 and electrode node EN1, between bit line BL1 and electrode node EN2, between bit line BL2 and electrode node EN3 and between bit line BL2 and electrode node EN4, respectively.

Memory cells, which are arranged in the adjacent columns and connected to a common bit line (e.g., BL1), have transistors connected to the corresponding bit line and capacitors connected to the corresponding gate electrodes, and are connected to different word lines (e.g., WL1 and WL2).

Paired bit line BL1 and electrode node EN1 are connected to sense node SN1 and inverted sense node ISN1 of sense amplifier SA41 via transfer gates 201 and 202, respectively. Paired bit line BL1 and electrode node EN2 are connected to sense node SN2 and inverted sense node /SN2 of sense amplifier SA42 via transfer gates 203 and 204, respectively.

Paired bit line BL2 and electrode node EN3 are connected to sense node SN1 and inverted sense node /SN1 of sense amplifier SA41 via transfer gates 205 and 206, respectively. Paired bit line BL2 and electrode node EN4 are connected to sense node SN2 and inverted sense node /SN2 of sense amplifier SA42 via transfer gates 207 and 208, respectively.

Signal generating circuit 414 selectively activates transfer gate activating lines L41–L44. Each of transfer gates 201 and 202 is turned on when sense amplifier activating line L41 is activated. Each of transfer gates 203 and 204 is turned on when sense amplifier activating line L42 is activated.

Each of transfer gates 205 and 206 is turned on when sense amplifier activating line L43 is activated. Each of transfer gates 207 and 208 is turned on when sense amplifier activating line L44 is activated.

According to the above structure, data of memory cells 1 are read onto only selected ones among the plurality of paired bit lines and electrode nodes. Further, the read data is selectively amplified by the corresponding sense amplifier.

Since the memory cells in the adjacent columns are connected to different word lines, data is not transmitted from the memory cell in one of the adjacent columns onto the bit line and electrode node, when data is transmitted from the memory cell in the other column onto the bit line and gate electrode.

In the refresh operation, therefore, the gate electrode not supplied with data acts as a shield against noises from the bit line and electrode node which transmit the read data. Therefore, it is possible to prevent the bit line and electrode node transmitting the read data from malfunctioning due to noises.

According to the forty-second embodiment, the number of sense amplifiers can be smaller than that in the prior art, so that the restrictions on the layout pitch of sense amplifiers can be eased.

Also, according to the forty-second embodiment, the bit line is commonly used by the adjacent columns, so that the number of lines can be reduced, which eases the restrictions on the layout pitch of sense amplifiers. The memory cell in one of the adjacent columns is connected to the bit line and electrode node in a connection form opposite to that of the memory cell in the other column, so that capacity balance can be kept between the electrode nodes and bit line pairs.

Forty-third Embodiment

A forty-third embodiment will be described below. The following description of the forty-third embodiment relates to an example in which adjacent two word lines are connected at the same position to one metal word line.

Figure 52:
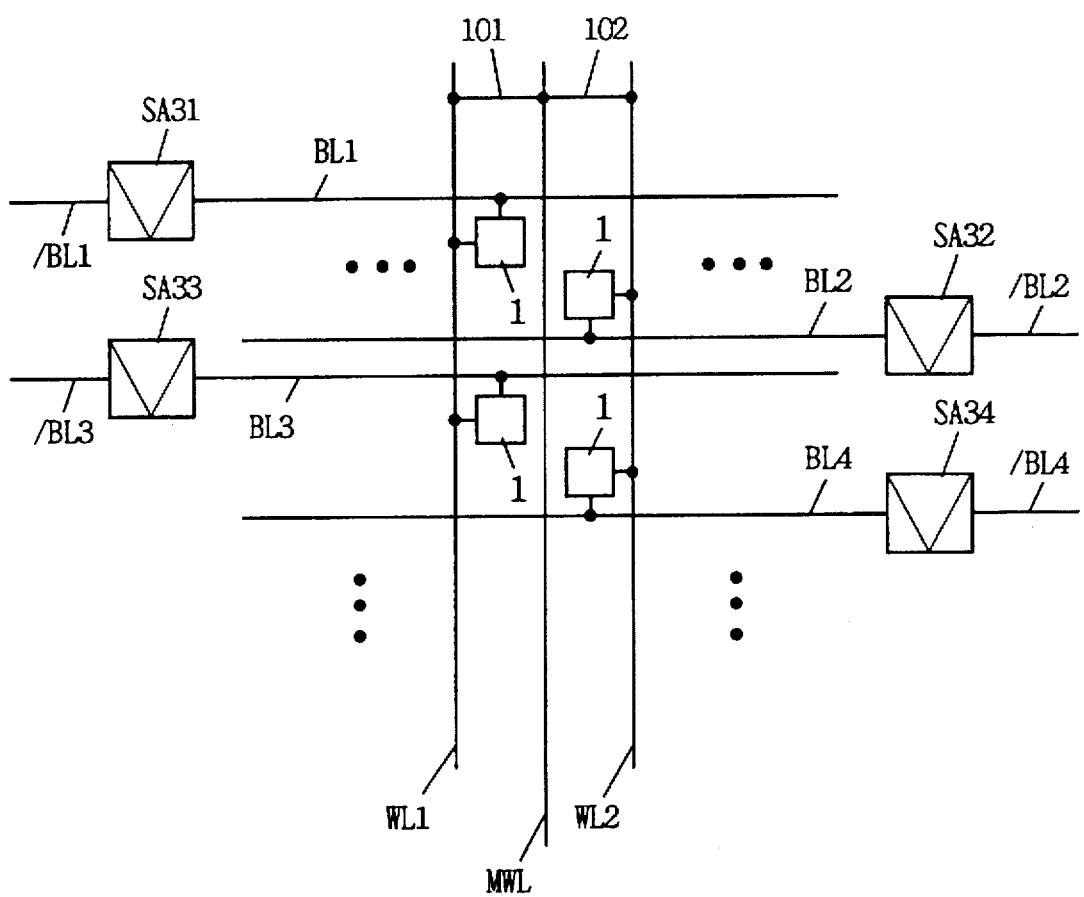
FIGS. 52 and 53 are circuit diagrams showing structures of DRAMs of 43rd and 44th embodiments, respectively.

FIG. 52 is a circuit diagram showing a structure of a DRAM of the forty-third embodiment. Referring to FIG. 52, the DRAM includes a plurality of metal word lines MWL, a plurality of word lines WL1, WL2, . . . , a plurality of bit lines BL1, BL2, . . . , and a plurality of sense amplifiers SA31–SA34.

Each metal word line MWL is provided correspondingly to adjacent two word lines WL1 and WL2. Metal word line MWL is provided for increasing a signal transmission speed of the word lines, and is arranged along word lines WL1 and WL2.

Word lines WL1 and WL2 are connected at the same position to metal word line MWL. This connection is made in such a manner that a connection node is formed at a portion of the metal word line, a contact portion 101 made of metal is provided between this connection node and word line WL1, and a contact portion 102 made of metal is provided between this connection node and word line WL2. Word lines WL1 and WL2 are made of polycrystalline silicon, polycide or the like.

Bit lines BL1–BL4 are arranged at a direction crossing these word lines. Bit line BL1 is paired with inverted bit line /BL1. Bit line BL2 is paired with inverted bit line /BL2. Bit line BL3 is paired with inverted bit line /BL3. Bit line BL4 is paired with inverted bit line /BL4.

The potential difference of bit line pair BL1 and /BL1 is amplified by sense amplifier SA31. The potential difference of bit line pair BL2 and /BL2 is amplified by sense amplifier SA32. The potential difference of bit line pair BL3 and /BL3 is amplified by sense amplifier SA33. The potential difference of bit line pair BL4 and /BL4 is amplified by sense amplifier SA34.

In the conventional DRAM, metal word lines are provided correspondingly to a plurality of word lines, respectively. Meanwhile, according to the forty-third embodiment, adjacent two word lines are connected at the same position to one metal word line. Therefore, the forty-third embodiment can ease restrictions on the pitch of the metal word lines, as compared with the conventional DRAM, and can ease the restrictions on the layout pitch of the word drivers. Further, the resistance of metal word lines can be reduced, and thus the operation speed can be increased.

Forty-fourth Embodiment

A forty-fourth embodiment will be described below. The following description of the forty-fourth embodiment relates to a modification of the forty-third embodiment.

Figure 53:
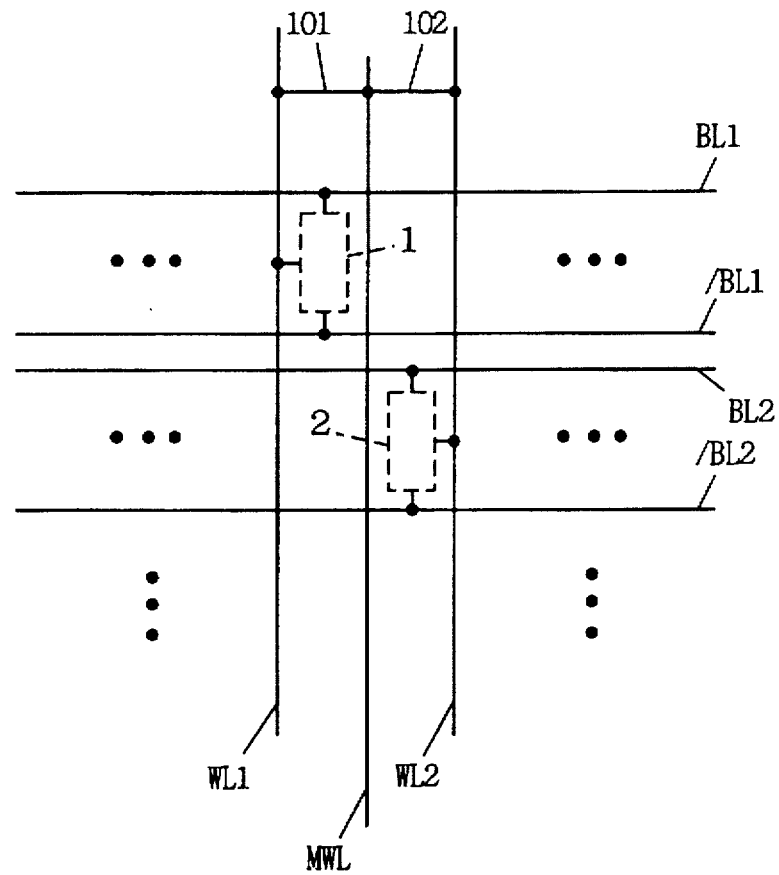

FIG. 53 is a circuit diagram showing a structure of a DRAM of the forty-fourth embodiment. In FIG. 53, portions similar to those in FIG. 52 bear the same reference numbers, and will not be described below.

The structure of the DRAM in FIG. 53 differs from that in FIG. 52 in the structure of bit line pairs. Although the arrangement in FIG. 52 is of the open bit line type, an effect similar to that of the forty-third embodiment can be obtained even in the arrangement of the folded bit line type. Thus, paired bit lines BL1 and /BL1 are arranged parallel to each other in FIG. 53.

Forty-fifth Embodiment

A forty-fifth embodiment will be described below. The following description of the forty-fifth embodiment relates to an example in which electrodes of a capacitor of a memory cell are made of highly dielectric material or ferroelectric material.

Figure 54:
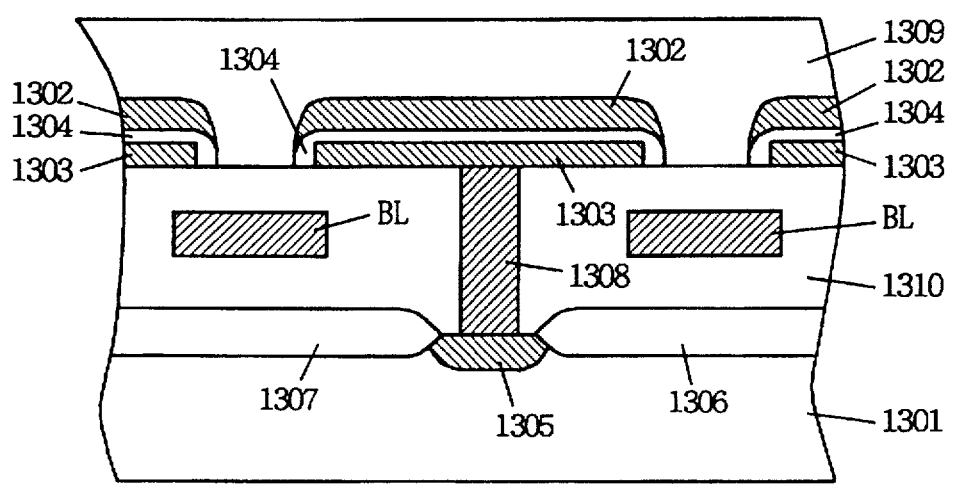
FIG. 54 is a cross section of a structure of and near a capacitor of a memory cell in a DRAM of a 45th embodiment.

FIG. 54 is a cross section showing a structure of and near a capacitor in the memory cell of the DRAM of the forty-fifth embodiment.

Referring to FIG. 54, a diffusion region 1305 is formed on a semiconductor substrate 1301. Element isolating regions 1306 and 1307 are formed at opposite sides of diffusion region 1305. Bit lines BL are formed on element isolating regions 1306 and 1307 with interlayer insulating film therebetween. Lower electrodes 1303 of capacitors are formed on interlayer insulating layer 1310.

An upper electrode 1302 is formed on each lower electrode 1303 with dielectric a thin film 1304 therebetween. Further, there is formed an interlayer insulating layer 1309 covering upper electrodes 1302 and interlayer insulating layer 1310.

A contact hole is formed at a portion of interlayer insulating layer 1310 between each diffusion region 1305 and corresponding lower electrode 1303, and a metal plug 1308 is formed in the contact hole. Metal plug 1308 electrically connects diffusion layer 1305 and lower electrode 1303 together.

In the above structure, upper electrodes 1302 are divided at a pitch of bit lines BL. This division may be performed at a pitch of bit line pairs or at a pitch of groups each including a plurality of bit lines.

If the division of upper electrodes were employed in conventional electrodes of a stacked type, a process margin would be severely restricted. Thus, it would be difficult to isolate sufficiently adjacent upper electrodes from each other. However, the forty-fifth embodiment can provide electrodes of a planar stacked type without difficulty owing to use of the dielectric thin film made of highly dielectric material or ferroelectric material. Therefore, the forty-fifth embodiment can facilitate manufacturing.

Further, in the structure including the electrodes of the planar stacked type employed in the forty-fifth embodiment, the electrode is thinner than that of a conventional stacked type. In the forty-fifth example, therefore, the parasitic capacitance of upper electrode 1302 can be reduced, so that this embodiment is suitable to the structure of the circuit for charging/discharging electric charges.

Further, in the structure including dielectric thin film 1304 made of highly dielectric material or ferroelectric material, upper electrode 1302 is formed of a metal line such as a platinum line in many cases. Therefore, in the structure using the metal line, the resistance of upper electrode 1302 can be reduced, so that this embodiment can be effectively used in the structure using upper electrode 1302 as a part of the bit line.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:

a plurality of bit lines parallel to each other;

a plurality of electrode nodes provided correspondingly to said plurality of bit lines, respectively, and are arranged alternately with respect to said bit lines;

a word line arranged to cross said plurality of bit lines and said plurality of electrode nodes, and is set to a predetermined potential in the operation of reading data;

a plurality of memory cells arranged at crossings defined by said word line with respect to said bit lines and said electrode nodes paired with said bit lines, respectively, and each connected to said bit line, said electrode node and said word line at the corresponding crossing;

said memory cell connected to the pair of said bit line and said electrode node having a capacitor having first and second electrodes and connected at its first electrode to said electrode node, and an MOS transistor having a gate electrode receiving a potential of said word line and connected between said second electrode and said bit line; and electrode node potential control means being operable, in an operation of reading data, to set the potential of said electrode node connected to said memory cell selected for reading data to a first level making said MOS transistor in the selected memory cell obtain a potential of said second electrode allowing turn-on in response to said predetermined potential, and set the potential of said electrode node connected to said memory cell not selected for said data reading to a second level making said MOS transistor in said unselected memory cell obtain the potential of said second electrode not allowing turn-on in response to said predetermined potential.

2. The semiconductor memory device according to claim 1, wherein said electrode node potential control means sets the potential of said electrode node connected to said selected memory cell to said first level prior to setting of said word line to said predetermined potential.

3. The semiconductor memory device according to claim 1, wherein said electrode node potential control means sets the potential of said electrode node connected to said selected memory cell to said first level after setting of said word line to said predetermined potential.

4. A semiconductor memory device comprising:

a plurality of bit line pairs each having a bit line and an inverted bit line, and arranged in parallel to each other;

a word line arranged to cross said plurality of bit line pairs, and set to a predetermined potential in the operation of reading data;

a plurality of memory cells arranged at crossings of said plurality of bit line pairs and said word line, respectively, and each connected to said bit line pair and said word line forming the corresponding crossing;

said memory cell connected to each of said bit line pairs having:

a capacitor having first and second electrodes and connected at its first electrode to said inverted bit line, and an MOS transistor having a gate electrode receiving the potential of said word line and connected between said second electrode and said bit line; and a plurality of sense amplifier means provided correspondingly to said plurality of bit line pairs, respectively, and each being operable to sense and amplify the potential difference of the corresponding bit line pair, wherein each of said plurality of sense amplifier means is operable, in the operation of reading said data, to set the potentials of said corresponding bit line pair to a first level making said MOS transistor in said corresponding memory cell obtain a potential of said second electrode allowing turn-on in response to said predetermined potential when said corresponding memory cell is selected for the reading, and to set the potentials of said corresponding bit line pair to a second level making said MOS transistor in said corresponding memory cell obtain a potential of said second electrode not allowing turn-on in response to said predetermined potential when said corresponding memory cell is not selected for the reading.

5. The semiconductor memory device according to claim 4, wherein said sense amplifier means corresponding to said memory cell selected for reading sets the potentials of said corresponding bit line pair to said first level before said word line is set to said predetermined potential.

6. The semiconductor memory device according to claim 4, wherein said sense amplifier means corresponding to said memory cell selected for reading sets the potentials of said corresponding bit line pair to said first level after said word line is set to said predetermined potential.

7. A semiconductor memory device comprising:

a plurality of bit line pairs each having a bit line and an inverted bit line, and arranged in parallel to each other;

a plurality of word lines arranged to cross said plurality of bit line pairs, and selectively set to a predetermined potential in the operation of reading data;

a plurality of memory cells arranged at crossings of said plurality of bit line pairs and said plurality of word lines, respectively, and each connected to said bit line pair and said word line forming the corresponding crossing;

said plurality of memory cells connected to each of said bit line pairs having a first and second memory cells;

said first memory cell having:

a first capacitor having first and second electrodes and connected at its first electrode to said inverted bit line, and a first MOS transistor having a first gate electrode receiving the potential of said first word line and connected between said second electrode and said bit line;

said second memory cell having:
a second capacitor having third and fourth electrodes and connected at its third electrode to said bit line, and
a second MOS transistor having a second gate electrode receiving the potential of said second word line and connected between said fourth electrode and said inverted bit line; and
a plurality of sense amplifier means provided correspondingly to said plurality of bit line pairs, respectively, and each being operable to sense and amplify the potential difference of the corresponding bit line pair, wherein
each of said plurality of sense amplifier means is operable, in the operation of reading said data, to set the potentials of said corresponding bit line pairs to a first level making said first and second MOS transistors in said corresponding first and second memory cells obtain potentials of said second and fourth electrodes allowing turn-on in response to said predetermined potential when said corresponding first and second memory cells are selected for the reading, respectively, and to set the potentials of said corresponding bit line pairs to a second level making said first and second MOS transistors in said corresponding first and second memory cells obtain potentials of said second and fourth electrodes not allowing turn-on in response to said predetermined potential when said corresponding first and second memory cells are not selected for the reading, respectively.

8. A semiconductor memory device comprising:
a plurality of bit line pairs each having a bit line and an inverted bit line, and arranged in parallel to each other;
a word line arranged to cross said plurality of bit line pairs, and set to a first potential in the operation of reading data;
a plurality of memory cells arranged at crossings of said plurality of bit line pairs and said word line, respectively, and each connected to said bit line pair and said word line forming the corresponding crossing;
said memory cell connected to each of said bit line pairs having:
a capacitor having first and second electrodes and connected at its first electrode to said inverted bit line, and
an MOS transistor having a gate electrode receiving the potential of said word line and connected between said second electrode and said bit line; and
a plurality of sense amplifier means provided correspondingly to said plurality of bit line pairs, respectively, and each being operable to sense and amplify the potential difference of the corresponding bit line pair, wherein
each of said plurality of sense amplifier means includes,
equalizing means for equalizing the potentials of said corresponding bit line pair, and
amplifying means for changing the potentials of said corresponding bit line pair toward a predetermined second potential and amplifying the potential difference appearing on said corresponding bit line pair; and each of said plurality of sense amplifier means is operable, in the operation of reading data and particularly in the case of selection of the corresponding memory cell for said reading, to equalize and set the potentials of said corresponding bit line pair to a first level making said MOS transistor of at least said selected memory cell obtain the potential of said second electrode allowing turn-on in response to the potential at said first level, release the equalized state prior to setting of the potential of said word line to said first potential, and amplify the potential difference of said bit line pair after setting of said word line to said first potential, and is also operable, in the case of unselection of said corresponding memory cell for reading, to set the potentials of said corresponding bit line pair to a second level making said MOS transistor in said unselected memory cell obtain the potential of said second electrode not allowing turn-on in response to said first potential.

9. A semiconductor memory device comprising:
a plurality of bit line pairs each having a bit line and an inverted bit line, and arranged in parallel to each other;
a word line arranged to cross said plurality of bit line pairs, and set to a first potential in the operation of reading data;
a plurality of memory cells arranged at crossings of said plurality of bit line pairs and said word line, respectively, and each connected to said bit line pair and said word line forming the corresponding crossing;
said memory cell connected to each of said bit line pairs having:
a capacitor having first and second electrodes and connected at its first electrode to said inverted bit line, and
an MOS transistor having a gate electrode receiving the potential of said word line and connected between said second electrode and said bit line; and
a plurality of sense amplifier means provided correspondingly to said plurality of bit line pairs, respectively, and each being operable to sense and amplify the potential difference of the corresponding bit line pair, wherein
each of said plurality of sense amplifier means includes,
equalizing means for equalizing the potentials of said corresponding bit line pair, and
amplifying means for changing the potentials of said corresponding bit line pair toward a predetermined second potential and amplifying the potential difference appearing on said corresponding bit line pair so as to turn on said corresponding MOS transistor in response to said first potential; and
each of said plurality of sense amplifier means is operable, in the operation of reading data and particularly in the case of selection of said corresponding memory cell for reading, to release the equalized state of the potentials of the equalized corresponding bit line pair prior to setting of said word line to said first potential, and amplify the potential difference of said bit line pair after setting of said word line to said first potential, and is also operable, in the case of unselection of said corresponding memory cell for reading, to set the potentials of said corresponding bit line pair to a second level making said MOS transistor in said unselected memory cell obtain the potential of said second electrode not allowing turn-on in response to said first potential.

10. The semiconductor memory device according to claim 9, wherein each of said plurality of sense amplifier means is operable, in the restore operation after reading of data from said corresponding bit line pair, to restore the potentials of said bit line pair to the potentials in the equalized state before reading of data.

11. A semiconductor memory device comprising:

a plurality of bit line pairs each having a bit line and an inverted bit line and arranged in parallel to each other;

a word line arranged to cross said plurality of bit line pairs, and being operable to change its potential from a first level to a second level in the operation of reading data;

a plurality of memory cells arranged at crossings of said plurality of bit line pairs and said word line, respectively, and each connected to said bit line pair and said word line forming the corresponding crossing;

said memory cell connected to each of said bit line pairs having:

a capacitor having first and second electrodes and connected at its first electrode to said inverted bit line, and an MOS transistor having a gate electrode receiving the potential of said word line and connected between said second electrode and said bit line; and a plurality of sense amplifier means provided correspondingly to said plurality of bit line pairs, respectively, and each being operable to sense and amplify the potential difference of the corresponding bit line pair, wherein each of said plurality of sense amplifier means is operable, in the operation of reading said data, to equalize, before setting of said word line to said second level, the potentials of said corresponding bit line pair to a third level intermediate said first and second level making said MOS transistor in said corresponding memory cell obtain the potential of said second electrode allowing turn-on in response to said second level, and amplify the potential difference of said bit line pair, after setting of said word line to said second level, by amplifying the potential transmitted from said corresponding memory cell to one of said paired bit lines to a fourth level higher than said third level and amplifying the potential transmitted from said memory cell to the other of said paired bit lines to a fifth level lower than said third level.

12. A semiconductor memory device comprising:

a plurality of bit line pairs each having a bit line and an inverted bit line and arranged in parallel to each other;

a word line arranged to cross said plurality of bit line pairs, and being operable to change its potential from a first level to a second level in the operation of reading data;

a plurality of memory cells arranged at crossings of said plurality of bit line pairs and said word line, respectively, and each connected to said bit line pair and said word line forming the corresponding crossing;

said memory cell connected to each of said bit line pairs having:

a capacitor having first and second electrodes and connected at its first electrode to said inverted bit line, and an MOS transistor having a gate electrode receiving the potential of said word line and connected between said second electrode and said bit line; and a plurality of sense amplifier means provided correspondingly to said plurality of bit line pairs, respectively, and each being operable to sense and amplify the potential difference of the corresponding bit line pair, wherein each of said plurality of sense amplifier means is operable, in the operation of reading said data, to equalize, before setting of said word line to said second level, the potentials of said corresponding bit line pair to said first level allowing said memory cell to turn on in response to said second level, and to amplify, after setting of said word line to said second level, the potential difference of the corresponding bit line pair by amplifying the potential transmitted from said corresponding memory cell to one of said paired bit lines to a third level higher than said first level and amplifying the potential transmitted from said memory cell to the other of said paired bit lines to a fourth level lower than said first level.

13. A semiconductor memory device comprising:

a plurality of bit line pairs each having a bit line and an inverted bit line, and arranged in parallel to each other;

a word line arranged to cross said plurality of bit line pairs;

a plurality of memory cells arranged at crossings of said plurality of bit line pairs and said word line, respectively, and each connected to said bit line pair and said word line forming the corresponding crossing;

said memory cell connected to each of said bit line pairs having:

a capacitor having first and second electrodes and connected at its first electrode to said inverted bit line, and an MOS transistor having a gate electrode receiving the potential of said word line and connected between said second electrode and said bit line;

a plurality of sense amplifier means provided correspondingly to said plurality of bit line pairs, respectively, and each being operable to sense and amplify the potential difference of the corresponding bit line pair;

each of said plurality of sense amplifier means being operable, in the read operation, to lower the potentials of said corresponding bit line pair from an equalized first level to a second level when said corresponding memory cell is selected for the reading, and to hold the potentials of said corresponding bit line pair at said equalized first level when said corresponding memory cell is not selected for the reading, and is operable, in the refresh operation, to equalize the potentials of said corresponding bit line pair to said first level; and word driver means operable, in the read operation, to set the potential of said word line to a third level allowing turn-on of only said MOS transistor in said selected memory cell, and operable, in the refresh operation, to set the potential of said word line to a fourth level allowing turn-on of all said memory cells.

14. A semiconductor memory device for executing a retention mode for performing refreshing and an access mode for performing refreshing and reading, comprising:

a plurality of bit line pairs each having a bit line and an inverted bit line, and arranged in parallel to each other;

a word line arranged to cross said plurality of bit line pairs;

a plurality of memory cells arranged at crossings of said plurality of bit line pairs and said word line, respectively, and each connected to said bit line pair and said word line forming the corresponding crossing;

said memory cell connected to each of said bit line pairs having:

a capacitor having first and second electrodes and connected at its first electrode to said inverted bit line, and an MOS transistor having a gate electrode receiving the potential of said word line and connected between said second electrode and said bit line;

a plurality of sense amplifier means provided correspondingly to said plurality of bit line pairs, respectively, and each being operable to sense and amplify the potential difference of the corresponding bit line pair; and word driver means provided for controlling the potential of said word line, wherein each of said plurality of sense amplifier means is operable, during standby in said retention mode, to equalize the potentials of said corresponding bit line pair to a first level, and thereafter perform sensing and amplifying of the potential difference of said corresponding bit line pair, and is operable, during standby in said access mode, to equalize the potentials of said corresponding bit line pair to a second level, and thereafter perform sensing and amplifying of the potential difference of the corresponding bit line pair, and said word driver means is operable, during standby in said retention mode, to set the potential of said word line to said first level and thereafter activate said word line, and is operable, during standby in said access mode, to set the potential of said word line to a third level different from said second level and thereafter activate said word line.

15. The semiconductor memory device according to claim 14, further comprising short circuiting means for short-circuiting said bit line pair set to said second level and said word line set to said third level when the operation shifts from said access mode to said retention mode, and thereby obtaining the potentials of said bit line pair and said word line for said standby in said retention mode.

16. The semiconductor memory device according to claim 14, wherein said MOS transistor is an N-channel MOS transistor.

17. The semiconductor memory device according to claim 4, further comprising:

a plurality of sense amplifier select lines provided correspondingly to said plurality of sense amplifier means, respectively, arranged in parallel to said plurality of bit line pairs, and being selectively activated for selectively operating said plurality of sense amplifier means, wherein each of said plurality of sense amplifier means includes:
equalizing means provided for equalizing the potentials of said corresponding bit line pair,
precharging means for receiving the potential of said corresponding sense amplifier select line, and precharging the potentials of said corresponding bit line pair to said second level when said corresponding sense amplifier select line is activated, first sensing means having an NMOS transistor, and provided for receiving the potential of said corresponding sense amplifier select line, and amplifying lower one between the potentials of said corresponding paired bit lines when said corresponding sense amplifier select line is activated, and second sensing means having a PMOS transistor, and being operable in parallel with the amplifying operation of said first sensing means to amplify higher one between the potentials of said corresponding paired bit lines.

18. The semiconductor memory device according to claim 4, further comprising:

a first potential supply line provided for supplying a first sense potential defining a first voltage amplitude of each of said bit line and said inverted bit line;

a second potential supply line provided for supplying a second sense potential defining a second voltage amplitude of each of said bit line and said inverted bit line;

a sense amplifier activating line being activated for operating said plurality of sense amplifier means in said refresh operation;

a plurality of sense amplifier select lines provided correspondingly to said plurality of sense amplifier means, respectively, and being selectively activated for selectively operating said plurality of sense amplifier means in said read and write operations;

a plurality of first switch means arranged between said first potential supply line and said plurality of sense amplifier means, respectively, and each being provided for receiving the potential of said sense amplifier activating line, and supplying said first sense potential to said plurality of sense amplifier means when said sense amplifier activating line is activated; and a plurality of second switch means arranged between said second potential supply line and said plurality of sense amplifier means, respectively, and each being provided for receiving the potential of said sense amplifier select line related to said corresponding sense amplifier means and supplying said second sense potential to said corresponding sense amplifier means when said corresponding sense amplifier select line is activated.

19. The semiconductor memory device according to claim 18, wherein said second switch means corresponding to the plurality of adjacent sense amplifier means receives and is controlled by the potential of the common sense amplifier select line.

20. The semiconductor memory device according to claim 4, further comprising:

a potential supply line provided for supplying a sense potential defining a voltage amplitude of each of said bit line and said inverted bit line;

said sense amplifier activating line being activated for operating said plurality of sense amplifier means in said refresh operation;

a plurality of sense amplifier select lines provided correspondingly to said plurality of sense amplifier means, respectively, and being selectively activated for selectively operating said plurality of sense amplifier means in said read and write operations;

a plurality of first switch means arranged between the potential supply line and said plurality of sense amplifier means, respectively, and each provided for receiving the potential of said sense amplifier activating line, and supplying the sense potential of said potential supply line to said plurality of sense amplifier means when said sense amplifier activating line is activated; and a plurality of second switch means arranged between said potential supply line and said plurality of sense amplifier means, respectively, and each being provided for receiving the potential of said sense amplifier select line related to said corresponding sense amplifier means, and supplying the sense potential of said potential supply line to said corresponding sense amplifier means when said corresponding sense amplifier select line is activated.

21. The semiconductor memory device according to claim 4, further comprising:

a first potential supply line provided for supplying a first sense potential defining a first voltage amplitude of each of said bit line and said inverted bit line;

a plurality of second potential supply lines provided correspondingly to said plurality of sense amplifier means, respectively, and each being operable to supply a second sense potential defining a second voltage amplitude of each of said bit line and said inverted bit line amplified by said corresponding sense amplifier means when said corresponding sense amplifier means is selected in the read and write operations;

a sense amplifier activating line being activated for operating said plurality of sense amplifier means in the refresh operation;

a sense amplifier select line being activated for operating said sense amplifier means in the read and write operations;

a plurality of first switch means arranged between said first potential supply line and said plurality of sense amplifier means, respectively, and each provided for receiving the potential of said sense amplifier activating line, and supplying said first sense potential to said plurality of sense amplifier means when said sense amplifier activating line is activated; and a plurality of second switch means arranged between said second potential supply line and said plurality of sense amplifier means, respectively, and each being provided for receiving the potential of said sense amplifier select line, and supplying said second sense potential to the corresponding sense amplifier means when said corresponding sense amplifier select line is activated and said corresponding second potential supply line supplies said second sense potential.

22. The semiconductor memory device according to claim 4, wherein said plurality of sense amplifier means includes first sense amplifier means and second sense amplifier means; and said semiconductor memory device further comprises:

a potential supply line arranged in a direction crossing said bit line pair, and provided for supplying a sense potential defining a voltage amplitude of each of said bit line and said inverted bit line;

a first sense amplifier activating line arranged in a direction crossing said bit line pair, and being activated for operating said first sense amplifier means;

a second sense amplifier activating line arranged in a direction crossing said bit line pair, and being activate for operating said second sense amplifier means;

first switch means arranged between the potential supply line and said first sense amplifier means, and provided for receiving the potential of said first sense amplifier activating line, and supplying the sense potential of said potential supply line to said first sense amplifier means when said first sense amplifier activating line is activated;

second switch means arranged between the potential supply line and said second sense amplifier means, and provided for receiving the potential of said second sense amplifier activating line, and supplying the sense potential of said potential supply line to said second sense amplifier means when said second sense amplifier activating line is activated; and sense amplifier activating line control means provided for activating both of said first and second sense amplifier activating lines in the refresh operation and selectively activating said first and second sense amplifier activating lines in the write and read operations.

23. The semiconductor memory device according to claim 4, further comprising:

a plurality of gate means arranged between said plurality of bit line pairs and said plurality of sense amplifier means for connecting said corresponding bit line pairs to said sense amplifier means when activated, respectively; and a gate activating line arranged in a direction crossing said bit line pairs for supplying to said plurality of gate means the potential for activating said plurality of gate means.

24. The semiconductor memory device according to claim 4, wherein said plurality of sense amplifier means includes first sense amplifier means and second sense amplifier means; and said semiconductor memory device further comprises:

a first potential supply line arranged in a direction crossing said bit line pair, and provided for supplying a sense potential defining a voltage amplitude of each of said bit line and said inverted bit line corresponding to said first sense amplifier means;

a second potential supply line arranged in a direction crossing said bit line pair, and provided for supplying a sense potential defining a voltage amplitude of each of said bit line and said inverted bit line corresponding to said second sense amplifier means;

a sense amplifier activating line arranged in a direction crossing said bit line pair, and being activated for operating said first or second sense amplifier means in the refresh, write and read operations;

first switch means arranged between said first potential supply line and said first sense amplifier means, and provided for receiving the potential of said sense amplifier activating line, and supplying the sense potential to said first sense amplifier means when said sense amplifier activating line is activated and said first potential supply line supplies said sense potential;

second switch means arranged between said second potential supply line and said second sense amplifier means, and provided for receiving the potential of said sense amplifier activating line, and supplying said sense potential to said second sense amplifier means when said sense amplifier activating line is activated and said second potential supply line supplies said sense potential; and sense potential control means provided for supplying said sense potential to said first and second potential supply lines in the refresh operation, and selectively supplying said sense potential to said first or second potential supply line in the write and read operations.

25. The semiconductor memory device according to claim 4, further comprising:

a plurality of sense amplifier select lines corresponding to said plurality of sense amplifier means, respectively, arranged in parallel to said plurality of bit line pairs, and being selectively activated for selectively operating said plurality of sense amplifier means;

a plurality of data line pairs corresponding to said plurality of bit line pairs, respectively, and arranged in parallel to said plurality of bit line pairs;

a transfer control line arranged in a direction crossing said plurality of bit line pairs, and being activated for transferring the potentials of said plurality of bit line pairs onto said data line pairs; and a plurality of gate means connected between said plurality of bit line pairs and said plurality of data line pairs, respectively, and each provided for receiving the potential of said transfer control line, and transferring the potentials of said bit line pair onto said corresponding data line pair when said transfer control line is activated, wherein said plurality of sense amplifier means are activated when said corresponding sense amplifier select lines are activated, respectively.

26. A semiconductor memory device comprising:

a plurality of bit line pairs each having a bit line and an inverted bit line, and arranged in parallel to each other;

a plurality of word lines arranged to cross said plurality of bit line pairs, and being selectively activated in the operation of reading data;

a plurality of memory cells arranged at crossings of said plurality of bit line pairs and said plurality of word lines, respectively, and each connected to said bit line pair and said word line forming the corresponding crossing;

said memory cell connected to each of said bit line pairs including:

a capacitor having first and second electrodes and connected at its second electrode to said bit line, and an MOS transistor having a gate electrode receiving the potential of said word line and connected between said second electrode and said inverted bit line;

said memory cells connected to one of the adjacent two bit line pairs and said memory cells connected to the other of said adjacent two bit line pairs being connected to the different word lines, a plurality of sense amplifier means each provided correspondingly to at least two of said bit line pairs spaced from each other by at least one of said bit line pairs for selectively sensing and amplifying the potential differences of said corresponding bit line pairs;

a plurality of bit line pair select lines provided correspondingly to said plurality of bit line pairs, respectively, arranged in a direction crossing said plurality of bit line pairs, and being selectively activated for transmitting the potentials of said corresponding bit line pairs to said corresponding sense amplifier means; and a plurality of gate means provided correspondingly to said plurality of bit line pairs, respectively, connected between said plurality of bit line pairs and said sense amplifier means, respectively, and each being operable to receive the potential of said corresponding bit line pair select line for transmitting the potentials of said corresponding bit line pair to said corresponding sense amplifier means when said corresponding bit line pair select line is activated.

27. A semiconductor memory device comprising:

a plurality of word lines parallel to each other;

a plurality of gate electrodes arranged to cross said plurality of word lines;

a plurality of bit lines arranged to cross said plurality of word lines and in parallel to said plurality of gate electrodes, each of said plurality of bit lines being provided correspondingly to the adjacent two electrode nodes, and being arranged between said adjacent two electrode nodes;

a plurality of memory cells arranged at crossings formed by said adjacent gate electrodes and said bit lines with respect to said word lines, respectively, and each connected to said electrode node, said bit line and said word line forming the corresponding crossing;

said plurality of memory cells connected to each of said bit lines and said two electrode nodes corresponding to said bit line including:

a first memory cell connected to one of said electrode nodes and said bit line, and a second memory cell connected to the other electrode node and said bit line;

said first memory cell including:

a first capacitor having first and second electrodes and connected at its first electrode to said one of said electrode nodes, and a first MOS transistor having a gate electrode receiving the potential of said first word line and connected between said first electrode and said bit line;

said second memory cell including:

a second capacitor having third and fourth electrodes and connected at its third electrode to said other electrode node, and a second MOS transistor having a gate electrode receiving the potential of said second word line and connected between said third electrode and said bit line;

first sense amplifier means provided correspondingly to a plurality of pairs of said bit lines and said electrode nodes connected to said first memory cells for selectively sensing and amplifying the potential differences of these pairs;

second sense amplifier means provided correspondingly to a plurality of pairs of said bit lines and said electrode nodes connected to said second memory cells for selectively sensing and amplifying the potential differences of these pairs;

a plurality of select lines provided correspondingly to a plurality of pairs of said bit lines and said electrode nodes, respectively, arranged in a direction crossing said plurality of electrode nodes and said plurality of bit lines, and being selectively activated for transmitting the potentials of said corresponding bit line and electrode node to said corresponding first or second sense amplifier means; and a plurality of gate means provided correspondingly to a plurality of pairs of said bit lines and said gate electrodes, respectively, connected between these pairs and said corresponding first or second sense amplifier means, respectively, and each being operable to receive the potential of said corresponding select line and transmit the potentials of said corresponding pair of said electrode node and said bit line to said corresponding first or second sense amplifier means when said select line is activated.

* * * * *